US011436388B2

(12) United States Patent
Santarone et al.

(10) Patent No.: US 11,436,388 B2
(45) Date of Patent: *Sep. 6, 2022

(54) METHODS AND APPARATUS FOR PROCEDURE TRACKING

(71) Applicant: Middle Chart, LLC, Jacksonville, FL (US)

(72) Inventors: Kristen Santarone, St. Johns, FL (US); Michael S. Santarone, Jacksonville, FL (US); Randall Pugh, Jacksonville, FL (US); Jason E. Duff, Jacksonville, FL (US); Michael Wodrich, Jacksonville, FL (US)

(73) Assignee: Middle Chart, LLC, Jacksonville, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 17/358,068

(22) Filed: Jun. 25, 2021

(65) Prior Publication Data

US 2021/0350043 A1 Nov. 11, 2021

Related U.S. Application Data

(63) Continuation of application No. 17/324,331, filed on May 19, 2021, which is a continuation of application
(Continued)

(51) Int. Cl.
*G06F 30/13* (2020.01)
*G06T 17/05* (2011.01)
(Continued)

(52) U.S. Cl.
CPC .............. *G06F 30/13* (2020.01); *G01S 19/48* (2013.01); *G06Q 99/00* (2013.01); *G06T 17/05* (2013.01); *G06T 19/006* (2013.01); *G01S 19/01* (2013.01)

(58) Field of Classification Search
CPC .......... G06F 31/13; G01S 19/48; G01S 19/01; G01S 5/02585; G01S 5/12;
(Continued)

(56) References Cited

U.S. PATENT DOCUMENTS 5,884,202 A 3/1999 Arjomand
5,933,479 A 8/1999 Michael et al.
(Continued)

FOREIGN PATENT DOCUMENTS

CN 102147597 A 8/2011
EP 2726817 B1 9/2018
(Continued)

OTHER PUBLICATIONS

Amekudzi, Adjo A., Rebecca Shelton, and Tim R. Bricker. "Infrastructure Rating Tool: Using Decision Support Tools to Enhance ASCE Infrastructure Report Card Process." Leadership and Management in Engineering 13.2 (2013): 76-82. (Year: 2013).
(Continued)

*Primary Examiner* — Brandon J Miller
(74) *Attorney, Agent, or Firm* — Tracnik Law, PLLC

(57) ABSTRACT

Methods and apparatus for improving the provision of a procedure based upon automated determination of a location of agents and equipment during a procedure and quantifying conditions in an environment via automated sensors. The present invention provides apparatus and methods for wireless designation of a position of health care providers and equipment relative to each other based upon wireless communications amongst multiple wireless transceivers combined with ongoing monitoring of conditions present in a facility. The transceivers may be portions of nodes and nodes may form self-verifying arrays. A user interface may
(Continued)

provide a augmented reality view of positions of all or some the providers and equipment and condition quantifying sensors.

20 Claims, 49 Drawing Sheets

Related U.S. Application Data

No. 17/062,663, filed on Oct. 5, 2020, now Pat. No. 11,042,672, which is a continuation of application No. 16/831,160, filed on Mar. 26, 2020, now Pat. No. 10,824,774, which is a continuation-in-part of application No. 16/775,223, filed on Jan. 28, 2020, now Pat. No. 10,740,503, which is a continuation-in-part of application No. 16/721,906, filed on Dec. 19, 2019, now Pat. No. 10,726,167, and a continuation-in-part of application No. 16/688,775, filed on Nov. 19, 2019, now Pat. No. 10,628,617, which is a continuation-in-part of application No. 16/657,660, filed on Oct. 18, 2019, now abandoned, which is a continuation-in-part of application No. 16/528,104, filed on Jul. 31, 2019, now Pat. No. 10,671,767, which is a continuation-in-part of application No. 16/504,919, filed on Jul. 8, 2019, now Pat. No. 10,740,502.

(60) Provisional application No. 62/793,714, filed on Jan. 17, 2019.

(51) Int. Cl.
  *G01S 19/48* (2010.01)
  *G06Q 99/00* (2006.01)
  *G06T 19/00* (2011.01)
  *G01S 19/01* (2010.01)

(58) Field of Classification Search
  CPC ........ G01S 2205/09; G01S 5/02; G01S 5/247; G01S 5/14; G06Q 99/00; G06T 19/006; G06T 17/05
  See application file for complete search history.

(56) References Cited

U.S. PATENT DOCUMENTS

| | | |
|---|---|---|
| 6,006,021 A | 12/1999 | Tognazzini |
| 6,292,108 B1 | 9/2001 | Straser et al. |
| 6,321,158 B1 | 11/2001 | DeLorme et al. |
| 6,853,958 B1 | 2/2005 | Turin et al. |
| 7,057,557 B2 | 6/2006 | Lee |
| 7,994,981 B1 | 8/2011 | Farrokhi et al. |
| 8,818,758 B1 | 8/2014 | Singh et al. |
| 8,843,350 B2 | 9/2014 | Jacobi et al. |
| 8,862,415 B1 | 10/2014 | Adams |
| 8,965,741 B2 | 2/2015 | McCulloch et al. |
| 8,996,156 B2 | 3/2015 | Melzer-Jokisch et al. |
| 9,008,979 B2 | 4/2015 | Miura |
| 9,037,124 B1 | 5/2015 | Ledet |
| 9,064,219 B2 | 6/2015 | Hall et al. |
| 9,342,928 B2 | 5/2016 | Rasane et al. |
| 9,529,072 B2 | 12/2016 | Matzner |
| 9,668,106 B2 | 5/2017 | Lin et al. |
| 9,703,517 B2 | 7/2017 | Andolina |
| 9,772,396 B2 | 9/2017 | Liao et al. |
| 9,792,020 B1 | 10/2017 | Kelley et al. |
| 9,892,559 B2 | 2/2018 | Yoshida et al. |
| 9,934,335 B2 | 4/2018 | Pettersson |
| 9,952,569 B2 | 4/2018 | Brissman |
| 10,025,887 B1 | 7/2018 | Santarone et al. |
| 10,042,341 B1 | 8/2018 | Jacob |
| 10,054,914 B2 | 8/2018 | Vartiainen et al. |
| 10,130,285 B1 | 11/2018 | Singamsetty et al. |
| 10,149,141 B1 | 12/2018 | Stamatakis et al. |
| 10,210,353 B1 * | 2/2019 | Li ................. G06K 7/0008 |
| 10,222,301 B2 | 3/2019 | Silva et al. |
| 10,278,016 B2 | 4/2019 | Bitra et al. |
| 10,355,351 B2 | 7/2019 | Cummings et al. |
| 10,444,324 B2 | 10/2019 | Dackefjord et al. |
| 10,824,774 B2 * | 11/2020 | Santarone ................. G01S 5/02 |
| 10,825,247 B1 | 11/2020 | Vincent et al. |
| 10,872,179 B2 | 12/2020 | Wodrich et al. |
| 2002/0095269 A1 | 7/2002 | Natalini et al. |
| 2002/0181405 A1 | 12/2002 | Ying |
| 2003/0110001 A1 | 6/2003 | Chassin et al. |
| 2003/0135324 A1 | 7/2003 | Navab |
| 2003/0163440 A1 | 8/2003 | Tonack |
| 2003/0195008 A1 | 10/2003 | Mohi et al. |
| 2004/0002786 A1 | 1/2004 | Sasaki |
| 2004/0119662 A1 | 6/2004 | Dempski |
| 2004/0122628 A1 | 6/2004 | Laurie |
| 2005/0165576 A1 | 7/2005 | Jesmonth |
| 2005/0208951 A1 | 9/2005 | Annunziato et al. |
| 2005/0275525 A1 | 12/2005 | Ahmed |
| 2006/0028345 A1 | 2/2006 | Lee |
| 2006/0084436 A1 | 4/2006 | Green et al. |
| 2006/0084463 A1 | 4/2006 | Yoo et al. |
| 2006/0164382 A1 | 7/2006 | Kulas et al. |
| 2007/0004449 A1 | 1/2007 | Sham |
| 2007/0266395 A1 | 11/2007 | Lee et al. |
| 2007/0296571 A1 | 12/2007 | Kolen |
| 2008/0103835 A1 | 5/2008 | Corcoran et al. |
| 2008/0180246 A1 | 7/2008 | Malik |
| 2008/0246734 A1 | 10/2008 | Tsui et al. |
| 2008/0319654 A1 | 12/2008 | Shintani et al. |
| 2009/0097710 A1 | 4/2009 | Sroka et al. |
| 2009/0189810 A1 | 7/2009 | Murray |
| 2009/0216438 A1 | 8/2009 | Shafer |
| 2009/0293051 A1 | 11/2009 | Krywaniuk |
| 2010/0103036 A1 | 4/2010 | Malone et al. |
| 2010/0107635 A1 | 5/2010 | Tsubone |
| 2010/0271263 A1 | 10/2010 | Moshfeghi |
| 2010/0296075 A1 | 11/2010 | Hinderling et al. |
| 2010/0309044 A1 | 12/2010 | Ische et al. |
| 2011/0047516 A1 | 2/2011 | Pavan et al. |
| 2011/0068906 A1 * | 3/2011 | Shafer ................. G06K 7/10475 340/10.3 |
| 2011/0075835 A1 | 3/2011 | Hill |
| 2011/0115816 A1 | 5/2011 | Brackney |
| 2011/0153101 A1 | 6/2011 | Thomas et al. |
| 2011/0182202 A1 | 7/2011 | Olofsson et al. |
| 2011/0251787 A1 | 10/2011 | Gupta et al. |
| 2012/0087212 A1 | 4/2012 | Vartanian et al. |
| 2012/0127306 A1 | 5/2012 | Oh et al. |
| 2012/0127976 A1 | 5/2012 | Lin et al. |
| 2012/0173456 A1 | 7/2012 | Hirl |
| 2012/0188847 A1 | 7/2012 | Miyamoto et al. |
| 2012/0204646 A1 | 8/2012 | Lee et al. |
| 2012/0214507 A1 | 8/2012 | Vartanian et al. |
| 2012/0259594 A1 | 10/2012 | Khan et al. |
| 2012/0296610 A1 | 11/2012 | Hailemariam et al. |
| 2013/0010103 A1 | 1/2013 | Ihara et al. |
| 2013/0073059 A1 | 3/2013 | Brian et al. |
| 2013/0084886 A1 | 4/2013 | Crilly, Jr. et al. |
| 2013/0120630 A1 | 5/2013 | Kim et al. |
| 2013/0169681 A1 | 7/2013 | Rasane et al. |
| 2013/0169801 A1 | 7/2013 | Martin et al. |
| 2013/0197685 A1 | 8/2013 | Matsunaga et al. |
| 2013/0201311 A1 | 8/2013 | Hirakawa |
| 2013/0223261 A1 | 8/2013 | Aggarwal et al. |
| 2013/0283529 A1 | 10/2013 | Hayes et al. |
| 2013/0288719 A1 | 10/2013 | Alonzo |
| 2013/0297555 A1 | 11/2013 | Fadell et al. |
| 2013/0345975 A1 | 12/2013 | Vulcano et al. |
| 2014/0058572 A1 | 2/2014 | Stein et al. |
| 2014/0084909 A1 | 3/2014 | Pagani |
| 2014/0107828 A1 | 4/2014 | Zhu et al. |
| 2014/0129599 A1 | 5/2014 | Boccon-Gibod |
| 2014/0146038 A1 | 5/2014 | Kangas et al. |
| 2014/0156455 A1 | 6/2014 | Atwood et al. |
| 2014/0188394 A1 | 7/2014 | Febonio et al. |
| 2014/0210856 A1 | 7/2014 | Finn et al. |

(56) References Cited

U.S. PATENT DOCUMENTS

| | | |
|---|---|---|
| 2014/0244160 A1 | 8/2014 | Cragun et al. |
| 2014/0266755 A1 | 9/2014 | Arensmeier et al. |
| 2014/0267420 A1 | 9/2014 | Schowengerdt et al. |
| 2014/0274151 A1 | 9/2014 | Pattabiraman et al. |
| 2014/0277594 A1 | 9/2014 | Nixon et al. |
| 2014/0278065 A1 | 9/2014 | Ren |
| 2014/0368373 A1 | 12/2014 | Crain et al. |
| 2015/0005903 A1 | 1/2015 | Worek et al. |
| 2015/0094081 A1 | 4/2015 | Gupta |
| 2015/0094865 A1 | 4/2015 | Choi et al. |
| 2015/0116132 A1 | 4/2015 | Nohra et al. |
| 2015/0121222 A1 | 4/2015 | Lacaze et al. |
| 2015/0137967 A1 | 5/2015 | Wedig et al. |
| 2015/0142179 A1 | 5/2015 | Ito et al. |
| 2015/0154803 A1 | 6/2015 | Meier et al. |
| 2015/0156423 A1 | 6/2015 | Lundberg |
| 2015/0168154 A1 | 6/2015 | Boerger |
| 2015/0177718 A1 | 6/2015 | Vartiainen et al. |
| 2015/0178633 A1 | 6/2015 | ElBsat et al. |
| 2015/0206348 A1 | 7/2015 | Koreeda et al. |
| 2015/0207316 A1 | 7/2015 | Saussele et al. |
| 2015/0227123 A1 | 8/2015 | Laycock et al. |
| 2015/0262421 A1 | 9/2015 | Bell et al. |
| 2015/0287318 A1 | 10/2015 | Nair et al. |
| 2015/0294506 A1 | 10/2015 | Bare et al. |
| 2015/0327010 A1 | 11/2015 | Gottschalk et al. |
| 2015/0347854 A1 | 12/2015 | Bare et al. |
| 2015/0356786 A1 | 12/2015 | Bare et al. |
| 2015/0356789 A1 | 12/2015 | Komatsu et al. |
| 2016/0004805 A1 | 1/2016 | Drees et al. |
| 2016/0019721 A1 | 1/2016 | Bare et al. |
| 2016/0026253 A1 | 1/2016 | Bradski et al. |
| 2016/0026729 A1 | 1/2016 | Gil et al. |
| 2016/0048200 A1 | 2/2016 | Kim et al. |
| 2016/0063671 A1 | 3/2016 | Piippo et al. |
| 2016/0066068 A1 | 3/2016 | Schultz et al. |
| 2016/0069675 A1 | 3/2016 | Bando et al. |
| 2016/0071196 A1 | 3/2016 | Joshi et al. |
| 2016/0077532 A1 | 3/2016 | Lagerstedt et al. |
| 2016/0084936 A1 | 3/2016 | Smith et al. |
| 2016/0091217 A1 | 3/2016 | Verberkt et al. |
| 2016/0095188 A1 | 3/2016 | Verberkt et al. |
| 2016/0132046 A1 | 5/2016 | Beoughter et al. |
| 2016/0135006 A1 | 5/2016 | Fjeldsoe-Nielsen |
| 2016/0178383 A1 | 6/2016 | Mays et al. |
| 2016/0183057 A1 | 6/2016 | Steiner |
| 2016/0202678 A1 | 7/2016 | Aggarwal et al. |
| 2016/0216879 A1 | 7/2016 | Park et al. |
| 2016/0238692 A1 | 8/2016 | Hill et al. |
| 2016/0258760 A1 | 9/2016 | Beaumont et al. |
| 2016/0284075 A1 | 9/2016 | Phan et al. |
| 2016/0284128 A1 | 9/2016 | Michalscheck et al. |
| 2016/0285416 A1 | 9/2016 | Tiwari et al. |
| 2016/0323149 A1 | 11/2016 | Hu et al. |
| 2016/0335731 A1 | 11/2016 | Hall |
| 2016/0343093 A1 | 11/2016 | Riland et al. |
| 2016/0343243 A1 | 11/2016 | Rabb et al. |
| 2016/0345137 A1 | 11/2016 | Ruiz |
| 2016/0360429 A1 | 12/2016 | Li et al. |
| 2016/0379083 A1 | 12/2016 | Sala et al. |
| 2017/0006487 A1 | 1/2017 | Baldwin et al. |
| 2017/0023659 A1 | 1/2017 | Bruemmer et al. |
| 2017/0055126 A1 | 2/2017 | O'Keeffe |
| 2017/0079001 A1 | 3/2017 | Lewis |
| 2017/0115022 A1 | 4/2017 | Grosshart et al. |
| 2017/0131426 A1 | 5/2017 | Sgarz et al. |
| 2017/0169683 A1 | 6/2017 | Ryder |
| 2017/0200312 A1 | 7/2017 | Smith et al. |
| 2017/0212668 A1 | 7/2017 | Shah et al. |
| 2017/0234962 A1 | 8/2017 | Yang et al. |
| 2017/0235290 A1 | 8/2017 | Weber et al. |
| 2017/0237892 A1 | 8/2017 | Sakai |
| 2017/0286568 A1 | 10/2017 | Dean et al. |
| 2017/0289344 A1 | 10/2017 | Greenberger et al. |
| 2017/0363504 A1 | 12/2017 | Winant et al. |
| 2018/0018826 A1 | 1/2018 | Maier et al. |
| 2018/0031618 A1 | 2/2018 | Friedlander et al. |
| 2018/0035263 A1 | 2/2018 | Titus et al. |
| 2018/0048693 A1 | 2/2018 | Gulbinas et al. |
| 2018/0075168 A1 | 3/2018 | Tiwari et al. |
| 2018/0084623 A1 | 3/2018 | Joppi et al. |
| 2018/0101803 A1 | 4/2018 | Tiwari et al. |
| 2018/0102858 A1 | 4/2018 | Tiwari et al. |
| 2018/0108079 A1 | 4/2018 | Traub |
| 2018/0113506 A1 | 4/2018 | Hall |
| 2018/0130260 A1 | 5/2018 | Schmirler et al. |
| 2018/0131907 A1 | 5/2018 | Schmirler et al. |
| 2018/0159904 A1 | 6/2018 | Hu et al. |
| 2018/0206096 A1 | 7/2018 | Sharma et al. |
| 2018/0239313 A1 | 8/2018 | Santarone et al. |
| 2018/0239840 A1 | 8/2018 | Santarone et al. |
| 2018/0242907 A1 | 8/2018 | Bonomi |
| 2018/0285482 A1 | 10/2018 | Santos et al. |
| 2018/0295526 A1 | 10/2018 | Mils et al. |
| 2018/0328753 A1 | 11/2018 | Stenning et al. |
| 2018/0357823 A1 | 12/2018 | Koniki et al. |
| 2018/0374269 A1 | 12/2018 | Smith |
| 2019/0025905 A1 | 1/2019 | Godina et al. |
| 2019/0057169 A1 | 2/2019 | Santarone et al. |
| 2019/0096232 A1 | 3/2019 | Wedig et al. |
| 2019/0145648 A1 | 5/2019 | Sinha et al. |
| 2019/0156576 A1 | 5/2019 | Ndolo |
| 2019/0216333 A1 | 7/2019 | Lai et al. |
| 2019/0228370 A1 | 7/2019 | Lien |
| 2019/0268062 A1* | 8/2019 | Josefiak ............... H04B 7/086 |
| 2019/0281573 A1 | 9/2019 | Tyagi et al. |
| 2019/0294834 A1 | 9/2019 | Mountz |
| 2019/0355177 A1 | 11/2019 | Manickam et al. |
| 2019/0392088 A1 | 12/2019 | Duff et al. |
| 2019/0392640 A1 | 12/2019 | Qian et al. |
| 2020/0057825 A1 | 2/2020 | Motahar |
| 2020/0072538 A1 | 3/2020 | Woolf et al. |
| 2020/0108926 A1 | 4/2020 | Smith et al. |
| 2020/0151450 A1 | 5/2020 | Hishinuma et al. |
| 2020/0286300 A1 | 9/2020 | Shih |

FOREIGN PATENT DOCUMENTS

| | | |
|---|---|---|
| GB | 2498177 A | 7/2013 |
| KR | 101354688 B1 | 1/2014 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

ASCE 2014 Report Card of Montana's Infrastructure, accessed at https://www.infrastructurereportcard.org/wp-contentluploads/2014/11/2014-Report-Card-for-Montanas-Infrastructure.pdf (Year: 2014).

Aukstakalnis, Steve. Practical augmented reality: A guide to the technologies, applications, and human factors for AR and VR. Addison-Wesley Professional, 2016. (Year: 2016).

Azeez et al., "Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).

Brainergiser, "Large holographic projector—a real use case" Sep. 19, 2015, https://www.youtube.com/watch?v=JwnS-EKTW2A&feature=youtu.be.

Carmelo Scuro et al., IoT for Structural Health Monitoring, Dec. 2018, IEEE Instrumentation & Measurement Magazine, pp. 4-14.

Edwards, Luke, "Holograms are finally here: Plasma lasers used to create images in mid-air." Pocket-Lint.com, Nov. 5, 2014, https://www.pocket-lint.com/gadgets/news/131622-holograms-are-finally-here-plasma-lasers-used-to-create-images-in-mid-air.

Gifford, Matthew, "Indoor Positioning with Ultrasonic/Ultrasound", Oct. 19, 2018, 7 pages, https://www.leverege.com/blogpost/ultrasonic-indoor-positioning.

(56) References Cited

OTHER PUBLICATIONS

Hexamite, "HX19V2 RFID Ultrasonic Positioning System", 1999, https://www.hexamite.com/hx19.htm.
Hu. Wi-Fi Based Indoor Positioning System Using Smartphones. Nov. 2013. [retrieved on Apr. 23, 2018]. Retrieved [from the Internet: (91 pages total).
International Search Report and Written Opinion dated Feb. 6, 2020 issued in connection with corresponding [International Application No. PCT/US2018/019185 (9 pages total).
International Search Report and Written Opinion dated Feb. 10, 2020 issued in connection with corresponding [International Application No. PCT/US2018/019154 (9 pages total).
International Search Report and Written Opinion dated May 14, 2018 issued in connection with corresponding International Application No. PCT/US2018/019154 (10 pages total).
International Search Report and Written Opinion dated May 7, 2018 issued in connection with corresponding [International Application No. PCT/US2018/019185 (7 pages total).
Khemapech et al., Bridge Structural Monitoring and Warning System Aplication in Thailand—Experiences Learned, 2017, TRON Forum ISBN 978-4-89362-330-0, pp. 1-8.
Kyle, "Property Management" Dearborn Real Estate, 2000—Business & Economics, pp. 40-41.
Liu etal.,"A Hybrid Smartphone Indoor Positioning Solution for Mobile LBS" Sensors 2012, issue 12, pp. 17208-17233 (Year: 2012).
Liu, "Survey of Wireless Based Indoor Localization Technologies" accessed at http://www.cse.wustl.edu/-jain/cse574-14/ftp/indoor/index.html, May 5, 2014,17 pg printout (Year: 2014).
Mordue, Stefan, Paul Swaddle, and David Philp. Building information modeling for dummies. John Wiley & Sons, 2015. (Year: 2015).
Qi, J.; Liu, G.-P. A Robust High-Accuracy Ultrasound Indoor Positioning System Based on a Wireless Sensor Network. Sensors 2017, 17, 2554.
Suermann, Patrick C. Evaluating the impact of building information modeling (BIM) on construction. Florida Univ Gainesvillegraduate School, 2009. (Year: 2009).
Thomson, C. P. H. From Point Cloud to Building Information Model: Capturing and Processing Survey Data Towards Automation forHigh Quality 3D Models to Aid a BIM Process. Diss. UCL (University College London), 2016. (Year: 2016).
Wang et al. Performance Evaluation of Automatically Generated BIM from Laser Scanner Data for Sustainability Analyses. 2015. [retrieved on Apr. 23, 2018]. Retrieved from the Internet: . (8 pages total).
Wang, Siqi, Jinsheng Du, and Jianyong Song. "A Framework of BIM-Based Bridge Health Monitoring System." 2016 InternationalConference on Civil, Transportation and Environment. Atlantis Press, 2016. (Year: 2016).
Wikipedia article "Building Information Modeling", archive data Jan. 15, 2016 on the Wayback machine (Year: 2016).
Yang et ai, "Wi Fi-Based Indoor Positioning", 2015, pp. 150-157 downloaded from the internet I EEE.com databases. (Year: 2015).
Zou et al., "SmartScanner: Know More in Walls with Your Smartphone!" IEEE Transactions On Mobile Computing, vol. 15, No. 11, Nov. 2016, pp. 2865-2877 (Year: 2016).
"Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).
Dong et ai, "Evaluation of the Reliability of RSSI for Indoor localization", 2012, pp. 6. downloaded from the internet https://ieeexplore.ieee.org/documentl6402492 (Year: 2012).
Wang et al. A wireless structural health monitoring system with multithreaded sensing devices: design and validation. • In: Structure and Infrastructure Engineering. Feb. 16, 2007 (Feb. 16, 2007) Retrieved on Jul. 21, 2019 (Jul. 21, 2019) from entire document.
Zhihua Wang et al., A Review of Wearable Technologies for Elderly Care that Can Accurately Track Indoor Position, Recognize Physical Activities and Monitor Vital Signs in Real Time, Feb. 10, 2017, Sensors (Basel), 17(2), 341, p. 1-36; doi: 10.3390/s 17020341 (Year: 2017).

\* cited by examiner

910

920

930

940

941

942

943

```
┌─────────────────────────────────────────────────────────────────┐
│ ESTABLISH UNIQUE IDENTIFIER FOR EACH NODE INCLUDED IN A SELF VERIFYING │
│                          ARRAY                                  │
│                                                            11   │
└─────────────────────────────────────────────────────────────────┘
                                │
┌─────────────────────────────────────────────────────────────────┐
│ EACH NODE X COMMUNICATES WITH EACH OTHER NODE X+Y THAT IT ESTABLISHES │
│                    WIRELESS COMMUNICATION                       │
│                                                            12   │
└─────────────────────────────────────────────────────────────────┘
                                │
┌─────────────────────────────────────────────────────────────────┐
│ EACH NODE GENERATES SETS OF VALUES FOR VARIABLES OF EACH COMMUNICATION │
│ IN WHICH THAT NODE PARTICIPATED IN AND FROM WHICH A RELATIVE POSITION OF │
│ EACH INVOLVED IN THE RESPECTIVE COMMUNICATION MAY BE DETERMINED 13 │
└─────────────────────────────────────────────────────────────────┘
                                │
┌─────────────────────────────────────────────────────────────────┐
│   EACH NODE RECORDS ASPECTS OF A COMMUNICATION THAT MAY INFLUENCE │
│              ACCURACY OF A RECORDED VARIABLE                    │
│                                                            14   │
└─────────────────────────────────────────────────────────────────┘
                                │
┌─────────────────────────────────────────────────────────────────┐
│ EACH NODE STORES THE SETS OF VALUES FOR VARIABLES AND ASPECTS THAT MAY │
│             INFLUENCE ACCURACY OF THE VARIABLES                 │
│                                                            15   │
└─────────────────────────────────────────────────────────────────┘
                                │
┌─────────────────────────────────────────────────────────────────┐
│ EACH NODE TRANSMITS THE SETS OF VALUES FOR VARIABLES AND ASPECTS THAT │
│  MAY INFLUENCE ACCURACY OF THE VARIABLES TO OTHER NODES WITHIN  │
│             COMMUNICATION RANGE AND POSITION               16   │
└─────────────────────────────────────────────────────────────────┘
                                │
┌─────────────────────────────────────────────────────────────────┐
│ EACH NODE RECEIVES THE SETS OF VALUES FOR VARIABLES AND ASPECTS THAT MAY │
│  INFLUENCE ACCURACY OF THE VARIABLES FOR ALL COMMUNICATION BETWEEN │
│                 NODES PRESENT IN THE ARRAY                 17   │
└─────────────────────────────────────────────────────────────────┘
                                │
┌─────────────────────────────────────────────────────────────────┐
│ USING A CONTROLLER, CALCULATE A POSITION OF A NODE X BASED UPON AN │
│  AGGREGATE OF SETS OF VALUES FOR VARIABLES AND ASPECTS THAT MAY │
│                    INFLUENCE VARIABLES                          │
│                                                            18   │
└─────────────────────────────────────────────────────────────────┘
                                │
┌─────────────────────────────────────────────────────────────────┐
│ GENERATE A LOCATION OF A PERCEIVED OBSTRUCTION BASED UPON THE SETS OF │
│   VALUES FOR VARIABLES AND ASPECTS THAT MAY INFLUENCE VARIABLES 19 │
└─────────────────────────────────────────────────────────────────┘
                                │
┌─────────────────────────────────────────────────────────────────┐
│ GENERATE A VISUAL REPRESENTATION OF A LOCATION OF EACH NODE INCLUDED IN │
│         THE ARRAY AND A PERCEIVED OBSTRUCTION              20   │
└─────────────────────────────────────────────────────────────────┘
```

FIG. 11

INSTALLING WIRELESS ACCESS POINTS INTO A BUILDING STRUCTURE AS IT IS BUILT
1401

ESTABLISHING A MESH NETWORK BETWEEN THE WIRELESS ACCESS POINT
1402

DETECTING AN ENTRY OF A WIRELESS TRANSMITTER INTO AN AREA COVERED BY THE MESH NETWORK
1403

OPTIONALLY INCORPORATING A MOBILE DEVICE WITH A WIRELESS ACCESS POINT INCORPORATED
1404

OPTIONALLY MOVING THE MOBILE DEVICE WITH A WIRELESS ACCESS POINT INCORPORATED INTO A REGION OF THE SPACE ACCESSIBLE BY THE MESH NETWORK
1405

OPTIONALLY USING THE MOVED MOBILE DEVICE WITH A WIRELESS ACCESS POINT TO ESTABLISH A WIRELESS LINK WITH A DEVICE THAT IS OTHERWISE OUT OF THE ACCESSIBLE REGION OF THE MESH NETWORK
1406

FIG. 14

| | |
|---|---|
| 1601 | Associate unique Node ID with patient transport apparatus |
| 1602 | Fix Node to patient transport apparatus or store inside patient transport apparatus |
| 1603 | Locate Nodes at strategic points within HCF |
| 1604 | Designate one or more base Nodes |
| 1605 | Communicate with each Node |
| 1606 | Communicate in "generations" of tree of Nodes |
| 1607 | Designate Node to communicate with destination extraneous to Self Verifying Node Array (SVAN) |
| 1608 | Define SVAN by ability to communicate with Nodes via primary communication modality |
| 1609 | Exclude some Nodes based upon inclusion criteria |
| 1610 | Aggregate wireless communication variable values |
| 1611 | Generate a location for each unique ID based upon multiple sets of wireless communication variable values |
| 1612 | Use algorithm to define most accurate location of each unique ID |
| 1613 | Plot location of unique ID on 2D (or 3D) graphical representation |
| 1614 | Calculate position of Agent supported smart device (e.g. may communicate with Base Nodes and/or Array Nodes) |
| 1615 | Guide Agent to Node or rented patient transport apparatus |
| 1616 | In some embodiments; determine angle of smart device to ground plane |
| 1617 | Overlay patient transport apparatuss in field of view with patient transport apparatus annotation (user interface is overlay of camera image) |
| 1618 | Overlay other features in FOV with annotation |
| 1619 | Generate user interface with Node information overlay |
| 1620 | If patient transport apparatus has left base position then communicate via BT 51 on periodic basis to update current position of patient transport apparatus |

FIG. 16

| | |
|---|---|
| 1701 | Associate unique Node ID with: Healthcare Agent, equipment, resource, and/or medical supplies |
| 1702 | Fix Node to the Agent, material, equipment, structural aspect |
| 1703 | Locate reference point Nodes at strategic points within or proximate to the HCF |
| 1704 | Designate one or more Base Node(s) |
| 1705 | Cascade Communication with some or all Nodes available via selected modality |
| 1706 | Communicate in "generations" of tree of Nodes |
| 1707 | Designate Node to communicate with destination extraneous to SVAN |
| 1708 | Define SVAN by ability to communicate with Nodes via primary communication modality |
| 1709 | Exclude some Nodes based upon inclusion criteria |
| 1710 | Aggregate wireless communication variable values |
| 1711 | Generate a location for each unique Node ID based upon multiple sets of wireless communication variable values |
| 1712 | Use algorithm to define most accurate location of each unique ID |
| 1713 | Plot location of unique ID on 2D (or 3D) graphical representation |
| 1714 | Calculate position of Agent supported smart device (e.g. may communicate with Base Nodes and/or Array Nodes) |
| 1715 | Guide Agent to Node of equipment, materials, staging area, drop off area, office, etc. |
| 1716 | In some embodiments: determine angle of smart device to ground plane |
| 1717 | Overlay equipment, resources, supplies and/or agents in field of view with annotation (user interface is overlay of camera image) |
| 1718 | Overlay other features in FOV with annotation |
| 1719 | Generate user interface with Node information overlay |
| 1720 | Integrate information descriptive of a Node and Sensors co-located with the Nodes into an Augmented Virtual Model |

FIG. 17

| | |
|---|---|
| 1801 | Associate unique ID with a Node |
| 1802 | Position Node within or proximate to multiple disparate defined patient rooms or resources |
| 1803 | Place a Sensor assembly in logical communication with at least one Node within or proximate to each disparate defined space |
| 1804 | Designate one or more Base Node(s) |
| 1805 | Cascade Communication with some or all Nodes available via a selected modality |
| 1806 | Communicate in "generations" of tree of Nodes |
| 1807 | Designate Node to communicate with destination extraneous to Self Verifying Node Array (SVAN) |
| 1808 | Transmit data generated from the Sensor via a Node |
| 1809 | Exclude some Nodes based upon inclusion criteria |
| 1810 | Aggregate wireless communication variable values |
| 1811 | Generate a location for each unique Node ID based upon multiple sets of wireless communication variable values |
| 1812 | Use algorithm to define most accurate location of each unique Node ID |
| 1813 | Plot location of unique ID on 2D (or 3D) graphical representation |
| 1814 | Calculate position of Agent supported smart device relative to a Node (e.g. may communicate with Base Nodes and/or Array Nodes) |
| 1815 | Guide Agent to Node in logical communication with the Sensor assembly |
| 1816 | In some embodiments: determine angle of smart device to ground plane |
| 1817 | Overlay paitnet rooms or resources in field of view with annotation (user interface is overlay of camera image) |
| 1818 | Overlay other features in FOV with annotation |
| 1819 | Generate user interface with Node information overlay |
| 1820 | Integrate Node and Sensor information into GUI |

FIG. 18

```
┌─────────────────────────────────────────────────────────────┐
│     POSITION SMART DEVICE PROXIMATE TO ITEM OF INTEREST     │
│ 2201                                                        │
└─────────────────────────────────────────────────────────────┘
                              │
┌─────────────────────────────────────────────────────────────┐
│        INDICATE ITEM OF INTEREST USING THE SMART DEVICE     │
│ 2202                                                        │
└─────────────────────────────────────────────────────────────┘
                              │
┌─────────────────────────────────────────────────────────────┐
│  INDICATE DIRECTION OF THE ITEM OF INTEREST IN RELATION TO  │
│                     THE SMART DEVICE                        │
│ 2203                                                        │
└─────────────────────────────────────────────────────────────┘
                              │
┌─────────────────────────────────────────────────────────────┐
│    DETERMINE A DISTANCE OF ITEM OF INTEREST TO THE SMART    │
│                           DEVICE                            │
│ 2204                                                        │
└─────────────────────────────────────────────────────────────┘
                              │
┌─────────────────────────────────────────────────────────────┐
│           GENERATE VIRTUAL TAG TO ITEM OF INTEREST          │
│ 2205                                                        │
└─────────────────────────────────────────────────────────────┘
                              │
┌─────────────────────────────────────────────────────────────┐
│   APPLY VIRTUAL TAG TO ITEM OF INTEREST OR LOCATION OF      │
│                         INTEREST                            │
│ 2206                                                        │
└─────────────────────────────────────────────────────────────┘
                              │
┌─────────────────────────────────────────────────────────────┐
│                  UPLOAD VIRTUAL TAG TO AVM                  │
│ 2207                                                        │
└─────────────────────────────────────────────────────────────┘

┌─────────────────────────────────────────────────────────────┐
│ ENTER ADDITIONAL INFORMATION ABOUT ITEM/LOCAITON OF INTEREST│
│ 2208                                                        │
└─────────────────────────────────────────────────────────────┘
```

FIG. 22

METHODS AND APPARATUS FOR PROCEDURE TRACKING

CROSS REFERENCE TO RELATED APPLICATIONS

The present application is a continuation application to the Non Provisional patent application Ser. No. 17/324,331 filed May 19, 2021 and entitled METHODS AND APPARATUS FOR PROCEDURE TRACKING, which is a continuation to the Non Provisional patent application Ser. No. 17/062,663, filed Oct. 5, 2020 and entitled METHODS AND APPARATUS FOR HEALTHCARE PROCEDURE TRACKING, which is a continuation application to the Non Provisional patent application Ser. No. 16/831,160, filed Mar. 26, 2020 and entitled METHODS AND APPARATUS FOR HEALTHCARE FACILITY OPTIMIZATION, which is a continuation in part application to the Non Provisional patent application Ser. No. 16/775,223, filed Jan. 28, 2020 and entitled SPATIAL SELF-VERIFYING ARRAY OF NODES, which claims priority to the Non Provisional patent application Ser. No. 16/528,104, filed Jul. 31, 2019 and entitled SMART CONSTRUCTION WITH AUTOMATED DETECTION OF ADVERSE STRUCTURE CONDITIONS AND REMEDIATION as a continuation in part; and to the Non-Provisional U.S. patent application Ser. No. 16/504,919, filed Jul. 8, 2019 and entitled METHOD AND APPARATUS FOR POSITION BASED QUERY WITH AUGMENTED REALITY HEADGEAR as a continuation in part application, which in turn claims priority to Provisional Patent Application Ser. No. 62/793,714, filed Jan. 17, 2019 and entitled METHOD AND APPARATUS FOR ORIENTEERING WITH AUGMENTED REALITY HEADGEAR; and as a continuation in part application to the Non-Provisional U.S. patent application Ser. No. 16/657,660, filed Oct. 18, 2019 and entitled METHOD AND APPARATUS FOR CONSTRUCTION AND OPERATION OF CONNECTED INFRASTRUCTURE; and as a continuation in part application to the Non-Provisional U.S. patent application Ser. No. 16/688,775, filed Nov. 19, 2019 and entitled METHOD AND APPARATUS FOR DETERMINING A DIRECTION OF INTEREST; and as a continuation in part application to the Non-Provisional U.S. patent application Ser. No. 16/721,906, filed Dec. 19, 2019 and entitled METHOD AND APPARATUS FOR WIRELESS DETERMINATION OF POSITION AND ORIENTATION OF A SMART DEVICE. The contents of each of the heretofore claimed matters are relied upon and incorporated herein by reference.

The present application also references the following related applications whose content are relied upon and incorporated herein by reference; the Non Provisional patent application Ser. No. 16/549,503, filed Aug. 23, 2019 and entitled METHOD AND APPARATUS FOR AUGMENTED VIRTUAL MODELS AND ORIENTEERING; and the Non Provisional patent application Ser. No. 15/703,310, filed Sep. 13, 2017 and entitled BUILDING MODEL WITH VIRTUAL CAPTURE OF AS BUILT FEATURES AND OBJECTIVE PERFORMANCE TRACKING; and the Non Provisional patent application Ser. No. 16/161,823, filed Oct. 16, 2018 and entitled BUILDING MODEL WITH CAPTURE OF AS BUILT FEATURES AND EXPERIENTIAL DATA; and the Non Provisional patent application Ser. No. 15/887,637, filed Feb. 2, 2018 and entitled BUILDING MODEL WITH CAPTURE OF AS BUILT FEATURES AND EXPERIENTIAL DATA; and the Non Provisional patent application Ser. No. 16/165,517, filed Oct. 19, 2018 and entitled BUILDING VITAL CONDITIONS MONITORING,

FIELD OF THE INVENTION

The present invention relates to methods and apparatus for improving the provision of healthcare via automated determination of a location of persons and equipment relative to each other and to conditions quantified via automated sensors. More specifically, the present invention provides apparatus and methods for wireless designation of a position of persons and equipment relative to each other based upon wireless communications amongst multiple wireless transceivers combined with ongoing monitoring of conditions present in a healthcare facility.

BACKGROUND OF THE INVENTION

The provision of healthcare has improved significantly as science and technology advance new treatment protocols. The historical doctor's bag has been replaced by sophisticated processor controlled equipment and healthcare procedures. Once a single doctor, perhaps assisted by a nurse, would be responsible for diagnosis, designation of a treatment protocol, and performance of a treatment action. Now health care professionals tend to specialize in a specialty area and only perform a small number of procedures. As a result, teams of doctors, nurses, technicians, physician's assistant, nurse practitioners, transport personnel, and others are now involved in single treatment protocol.

One consequence of such team oriented health care is a need to coordinate team members to act in an efficient manner. However, hospitals and other treatment centers lack systems and equipment to implement efficient coordination or any system to track variables in team coordination in order to bring about a most beneficial outcome of a treatment protocol.

In addition, while other major endeavors in the information age have made use of the power of large scale processors in order to bring about increased efficiencies and effectiveness, health care has lagged behind in its ability to gather meaningful data useful in the optimization of the provision of healthcare. While some efforts are being made to apply artificial intelligence (AI) to areas such as disease state diagnosis or medical research, little or nothing has been done to apply AI to the provision of healthcare, in part because very little date exists to which AI techniques may be applied.

Meanwhile, wireless determination of a position has been known for many years. Various techniques and corresponding wavelengths have their strengths and drawbacks. One significant drawback has been the specialized equipment and training required to utilize wireless position determination equipment. For example, use of systems such as radar require specialized equipment and training.

In contrast, most people have access to a smart device. The proliferation of global positioning system (GPS) capabilities by smart devices has alleviated the need for such specialized equipment and training by incorporating the specialized circuitry into the smart device, and proliferating apps that operate the GPS circuitry. Smart devices are used almost ubiquitously by people in first-world population centers. Smart phones and tablets are often within reach of people capable of operating them and are relied upon for almost any purpose for which an app may be written.

However, known geolocation technologies (as may be deployed with modern Smart Devices) also have drawbacks. GPS is purposefully limited in its accuracy by the government. Other technologies and corresponding standards (which operate at different wavelength bands), such as Bluetooth, ANT, near field communications, internal compasses and WiFi, are easily obstructed and have very limited range. Also, such technologies are often only operative to indicate where a particular smart device is located and lack any capability to indicate an orientation.

SUMMARY OF THE INVENTION

Accordingly, the present invention provides for methods and apparatus to manage health care provision via wireless tracking of persons; equipment; and/or resources including a position and orientation of the persons, equipment and or resources. Persons may include, by way of nonlimiting example, one or more of: a patient, health care providers (physicians, physician assistants, nurse practitioners, nurses, technicians, phlebotomists, etc.); and other hospital staff (such as, for example: transport staff, technicians, therapists, administrative personnel, and food services staff), sometimes referred to herein collectively as Healthcare Providers ("HCP"s). Equipment may include any fixed position, portable or transportable, machine or electronic device. A resource may include a physical area, such as an examination room, operating room, recovery room, patient room, waiting room or other defined area of a health care facility.

The present invention provides for a tracking of position and one or both of a direction of interest and an orientation of a smart device, based upon wireless communications between a transceiver designating a reference point and one or both of: a physical wireless tag; and a virtual tag generated by a smart device.

The healthcare optimization system of the present invention enables dynamic coordination of professionals; equipment and resources based upon wireless determination of position and orientation. The optimization system may be operated to deploy specific health care providers; equipment and resources in a scheduled manner depending upon the needs of a patient undergoing a procedure. The deployment of the health care providers; equipment and resources may be in sequence and according to a schedule of healthcare procedure actions to be performed. Tracking of which healthcare procedure actions have been performed and which still remain to be executed may be determined according to one or more of: a list of actions included in a procedure; a sequence of the actions listed; a relative position and orientation of health care providers; equipment and resources; user inputs into a user interactive device (or screen); and patient biometric data measured during the procedure.

In some embodiments, a user may monitor ongoing data provided by the healthcare optimization system of the present invention and interact with a user interface to implement actions included in a list of healthcare procedure actions, or to generate new actions based upon data generated during the healthcare procedure. For example, a user may monitor a healthcare procedure and determine that an additional item of equipment needs to be brought to the location of the patient and generate a new action in the healthcare optimization system to have the needed equipment brought to the patient location. In another example, a user may monitor the ongoing data and determine that the patient will be ready to be transported within the next several minutes and locate an appropriate transporter in proximity to the patient. A communication may be generated and sent to the transporter to proceed to the patient's location in order to timely transport the patient. If the patient had occupied a resource, such as an operating room, the system may also register when the patient has been transported out of the resource, and generate a new action item to prepare the resource for a next procedure. Additional actions and status qualifiers may be generated and be based, at least in part upon a location and direction of one or more of: health care providers; equipment and resources.

In another aspect of the present invention, conditions, actions, locations, orientations, are quantified and subjected to unstructured queries and/or artificial intelligence (sometimes referred to herein as "AI") procedures to generate process improvements. Although application of AI has begun to be explored, the application of AI is generally limited to research and/or diagnosis of a patient condition. The present invention provides for electronic and electromechanical transducers to quantify one or more of: an ambient condition, a location, an orientation and an Agent action, as digital values. The present invention enables the quantified digital values to be submitted to AI routines and/or unstructured queries in order to determine which sets of variables (representative of the quantified ambient conditions, a locations, orientations and Agent actions) lead to which results.

For example, the present invention provides for nonintrusive generation of data to be referenced in AI processes and/or unstructured queries. The nonintrusive gathering of data is accomplished via automated quantification of values for variables relating to one or more of: resources used for a procedure; a temperature and humidity of a resource ambient condition; presence of an audio frequency and/or pattern; lighting conditions; airflow; duration of a procedure; who was present in proximity to the procedure, including when and where each person was present; an orientation of each person during a procedure (and a relative position to each other and the patient); a sequence of actions taken during the procedure and positions of each person during each action; medical supplies used during a procedure; medical devices imparted to a patient during a procedure; which equipment was present during a procedure; an orientation of an item of equipment; operation/activation of an item of equipment; and almost any other condition, position, orientation or action that is quantifiable according to the methods and apparatus presented herein.

According to the present invention the quantification of the variables related to a healthcare related procedure may be accomplished with automated sensors that have an associated position determined based upon wireless transmissions (as discussed herein). Automated sensor devices may be fixedly attached to one or more transceivers (such as for example a transceiver tag); have a transceiver included within the sensor device (internal transceiver tag), or be associated with a virtual tag generated by a smart device placed in proximity to an item or person to be tagged.

In some embodiments, a physical tag location and/or a virtual tag location may be determined via a self-verifying array of Nodes (sometimes referred to herein as "SVAN"). Various Nodes within the SVAN verify positions of respective Nodes included in the array the array of nodes. A position for each Node is generated based upon sets of values of variables derived from wireless communications (sometimes referred to herein as "position determination variables"). The position determination variables may include one or more of: a time of transmission of a data set during wireless communication between Nodes; a time of arrival of a data set during wireless communication between Nodes; a phase change between disparate antennas receiving a wireless communication; an angle of arrival of a data set; an angle of departure of a data set; a quality of a wireless transmission (e.g., based on a presence of noise in the received transmission); a strength of a wireless transmission (e.g., as measured by amplitude of a received transmission); or other factor influencing a wireless data transmission.

According to the present invention, an array of Nodes self-verifies positions of respective Nodes included in the array by generating multiple sets of values for position determination variables for each of the Nodes in the array. Each set of values is based upon multiple disparate communications involving respective pairs of a transmitting Node and a receiving Node. In this manner, multiple sets of values for position determination variables are generated for each respective Node during a given timeframe. Each set of values for position determination variables may be used to verify a position of a designated Node by comparing a position determined via use of a first set of values for variables to positions determined via use of set(s) of variables other than the first set of variables. Each determined position for a given Node thereby verifies or challenges other determined positions.

Other embodiments may include generation of X,Y coordinates based upon triangulation and wireless communications between a reference point transceiver and a smart device.

In some embodiments, outlier sets of position determination variables may be excluded. In another aspect, in some embodiments, an algorithm may be used to generate a composite position for a given Node based upon multiple sets of position determination variables (for example, by generating a weighted average of expected positions based on the disparate sets of values of position determination variables).

In various embodiments, a determined position of Node may include a position for a first Node relative to a position of a second Node, or relative to a base position. Each position is generally represented as a set of coordinates. The coordinates may include, for example, Cartesian coordinates, cylindrical coordinates and/or Polar coordinates. The Nodes may include transceivers transmitting and receiving one designated bandwidth of communication wavelength; or transceivers operating according to disparate wireless protocols and across multiple bandwidths. In some embodiments, a wireless communications Node may receive a data set via a first wavelength (and first associated protocol) and transmit some or all of the data set via a second wavelength (and second associated protocol) or combine transceivers capable of communicating via multiple wavelengths and protocols.

The self-verifying arrays of Nodes of the present invention include collections of numerous wireless communication Nodes operative to cooperatively enhance communications, location tracking, and determination of other useful aspects of an array of Nodes, such as proximity of Nodes to each other and/or an item of interest, distance of Nodes to each other and/or an item of interest, direction of Nodes to each other and/or an item of interest, and whether or not two Nodes are capable of direct communication between themselves. Self-verifying arrays may be deployed to significantly optimize and improve accuracy of determining a location of a Sensor, tracking of items, tracking of Agents and/or persons in real-world scenarios, such as a Healthcare Facility, and a partially built or completed Healthcare Facility, as non-limiting examples.

In some exemplary embodiments, a designated location may include stationary wireless Nodes that are fixed to stationary item in or proximate to a Healthcare Facility such as a building part or a stanchion secured to a ground point. The site may also include mobile wireless Nodes which may be fixed to items, persons and/or Agents capable of attaining dynamic locations. Various assets and building materials may be fitted with wireless Nodes that are combined into a self-verifying array.

In some examples, wireless communications between wireless Nodes may be accomplished in adherence to a Bluetooth protocol, such as, by ways of non-limiting example, Bluetooth 5.1 or Bluetooth Low Energy (BLE 5.1). In other examples, RFID type tags may communicate information in response to a stimulus. In some examples, energy to power a Node may be provided by a wireless transmission to the Node to be powered.

In general, Nodes making up a self-verifying array communicate to other wireless Nodes. The wireless communications may include one or both of sensor data and location-identification data. Location-identification data may include one or more of: values for variables that are useful for determining a position, information useful for determining a polar coordinate (e.g., angle of arrival; angle of departure; and distance); or information useful for determining a Cartesian Coordinate (e.g., X,Y,Z coordinates). The location-identification data may be one or both of: relative to two Nodes or relative to a base position. By way of non-limiting example, of location-identification data may include one or more of: transmitting and receiving timing data; angle of arrival; angle of departure; a calculated distance; and a set of coordinates.

Location-identification data involving a particular Node may be generated by that Node. For example, a Node X may generate location-identification data relative to multiple other Nodes with which Node X is capable of communicating. Node X may also receive, via wireless communication, location data generated by other Nodes. Node X may aggregate both types of location-identification data and transmit the aggregated data out to any wireless transceiver within range that is capable of receiving the aggregated data.

A controller, such as a controller in a Smart Device or in a cloud server, may generate a map indicating locations of various Nodes at an instance in time. Each location of each Node may be based upon one or more sets of location-identification information since each Node may communicate with multiple other Nodes. Accuracy of a location of a particular Node may be enhanced by mathematically blending multiple sets of location-identification information for that particular Node, such as an average of reported data (including, in some embodiments, a weighted average). In some embodiments, a strength of a wireless communication may be determined and recorded and considered in the blending of multiple sets of location-identification data.

In some embodiments, a sensor may be co-located with a particular Node, In this manner, data generated by the Sensor during a particular time period may be associated with the position of a co-located Node. In some embodiments, data generated by a Sensor (Sensor Data) may be transmitted between Nodes on a periodic basis. Transmission of Sensor Data between Nodes may be in addition to location-identification information, or independent of other transmissions, including transmissions of location-identification information. Other embodiments include transmission of Sensor data in response to a command requesting the Sensor data.

Accordingly, some embodiments include transmission and receipt of Sensor Data for the purposes of aggregating and retransmitting the received data. The sensor data may quantify a condition at a location or proximate to a location of a Node in logical communication with the Sensor. In another aspect, disparate Nodes may transmit data to other Nodes, wherein the data has been provided by Sensors co-located with or proximate to respective Nodes. Each Node may aggregate data received via communications with other Nodes and/or received from Sensors (or assemblies of multiple Sensors) co-located with or proximate to respective Nodes.

Sensor data may thereby be aggregated from disparate Nodes at disparate locations across a large area occupied by Nodes that interconnect into a self-verifying array. This may be beneficial in embodiments in which the breadth of a physical area covered by a self-verifying array of Nodes exceeds the point-to-point communication range of one or more of the Nodes (e.g., based on the communication modality of the Node).

In addition, a self-verifying array may combine communications using disparate bandwidths and protocols to achieve superior performance in a variety of ways, such as improving communications distance, accuracy, and obstacle-penetration efficacy. A self-verifying array may also include hardwired segments to further achieve improved performance and connectivity to resources external to the self-verifying array.

By using the self-verifying array of Nodes to effectively expand the range of an individual Node, communication and data retrieval across a large space is improved. Specifically, establishment of a self-verifying array that allows for communication pathways to be established that are longer than a range of an individual wireless access Node and verifies a location of a communication commencement and destination, enables superior communications across large areas.

For example, a large Healthcare Facility site may include stationary Nodes that form a self-verifying array of Nodes over a large spatial area included in the site (or even the entire site). A line-of-sight path between a particular wireless communication base Node and a deployed Node initially interacting with that wireless communication base Node may be cut off by various impediments to wireless transmission, such as equipment in the Healthcare Facility, materials stored in the Healthcare Facility, or the Healthcare Facility itself. The self-verifying array may create paths that cooperatively allow the deployed Node to connect with multiple different wireless communication Nodes included in a self-verifying array to send a communication around the impediment to wireless communication and reach the base Node.

A mobile wireless Node included in the self-verifying array may provide dynamic location aspects to the self-verifying array. Devices and methodology allow for mobile Nodes to supplement stationary Nodes and improve communications aspects in numerous ways. The mobile Node may temporarily create a shorter path for communications, which may improve energy storage aspects of a device interacting with the Node, an improved signal-to-noise aspect, or other advantages.

A communication area covered by an aggregate of wireless Nodes may extend to a perimeter defined by communication coverage of an aggregate of the Nodes and may encompass communication obstructions within the communications area, wherein the obstructions are circumvented by strategically located Nodes that communicate around the obstruction.

In still further aspects, a self-verifying array of Nodes may allow an Augmented Virtual Model (AVM) of a Healthcare Facility and/or a building site to be updated with the locations of an Agent or equipment that is co-located with a wireless Node. Similarly, materials that are co-located with wireless Nodes may have their location determined and/or conditions experienced by the materials quantified via Sensor readings. This may occur as the materials reside in a storage location and/or as the materials are used in a Healthcare Facility.

Locations of personnel tagged with a wireless Node may also be identified for logistics, safety, and other purposes. For example, in some embodiments, a Smart Device may serve as a dynamic Node. The Smart Device may be supported by an Agent. In such embodiments, location information and other Sensor data from the Smart Device may be transmitted across the self-verifying array. Accordingly, it may be possible to track the Agent's position, biometrics, and other safety quantities across the self-verifying array.

A mobile Agent equipped with Node with wireless communications capability may also transmit energy beacons into the regions that the Agent moves into. The energy beacons may energize ultralow-energy Bluetooth-equipped devices, RFID tags, and the like. Thus, Nodes that have little or no substantial battery capability may be energized, and may respond to the energization by transmitting and/or receiving data transmissions to/from one or both of the mobile Agent and other Nodes. Transmitted data may include an identification of respective Nodes, Sensor-related information, and the like. Other protocols such as stepped power levels in transmission may supplement a location with a relative distance between the tag and the mobile agent being determined. Since the mobile Agent can perform this measurement from numerous points, triangulation may be used to improve the accuracy of relative location determination of such tags.

One general aspect includes a method of quantifying healthcare agent interaction during a healthcare procedure with a self-verifying array of nodes. The method of quantifying healthcare agent interaction also includes discovering with the self-verifying array of nodes at least a first node, a second node, and a third node, where each node of the self-verifying array of nodes may include at least a respective processor, a respective digital storage and a respective wireless transceiver; assigning a respective unique identifier to each of the first node, the second node, and the third node when they are discovered; establishing communication between the first node and at least the second node and third node in the self-verifying array of nodes, where each of the first node, the second node and the third node generate at least a first set of values from the communication; utilizing the first set of values to determine a relative position amongst at least the first node, the second node and the third node; removably attaching the first node to a first healthcare agent, and the second node to a second healthcare agent, where the first node remains attached to the first healthcare agent and the second node remains attached to the second healthcare agent during a time of the healthcare procedure; attaching the third node to a reference position in a healthcare facility resource, where the third node is in the reference position in the healthcare facility resource during the time of the healthcare procedure; wirelessly communicating between the first node, the second node, and the third node during the time of the healthcare procedure; verifying a presence of at least one of the first node, the second node and the third node in the self-verifying array of nodes during the time of the healthcare procedure; storing, in the respective digital storage of at least one of the first node, the second node, and the third node the generated values for communication variables and unique identifiers for the first node; the second node and the third node; with the respective processor of at least one of the first node, the second node, and the third node, generating a respective set of position coordinates indicative of a position of each of the first healthcare agent; and the second healthcare agent, each respective set of position coordinates based upon values included in an aggregate of values for the communication variables received into the respective processor; and with the respective processor of at least one of the first node, the second node, and the third node, generating an orientation of one or both of the first healthcare agent and the second healthcare agent.

Implementations may include one or more of the following features. The method where each of the first node, the second node and the third node records the respective set of values for aspects of the communications that may influence an accuracy of a recorded variable. In some examples, each of the first node, the second node and the third node may communicate the respective set of values for the aspects of the respective communications that influence the accuracy of the recorded variable to other nodes within the self-verifying array of nodes within communication range and position.

Examples may include the method where a fifth node of the self-verifying array of nodes may include a controller and the controller is used to calculate the position of the first node based upon an aggregated set of values for the communication variables as well as the aggregated set of values for the aspects of the respective communications that influence the accuracy of the recorded variable. A fourth node may be removably attached to a third healthcare agent, where the third healthcare agent moves into a location within communication range of the self-verifying array of nodes, where the self-verifying array of nodes discovers the fourth node, where the self-verifying array of nodes assigns a fourth node unique identifier, and where the fourth node attached to the third healthcare agent is in communication with a second sensor attached to the third healthcare agent.

DESCRIPTION OF THE DRAWINGS

The accompanying drawings, that are incorporated in and constitute a part of this specification, illustrate several embodiments of the invention and, together with the description, serve to explain the principles of the invention:

FIG. 11 illustrates a flow chart of method steps that may be executed in some implementations of the present invention.

FIG. 14 depicts methodology related to the present invention.

FIG. 16 illustrates methodology related to SVAN arrays deployed with nodes on, in or associated with vehicles.

FIG. 17 illustrates methodology related to SVAN arrays associated with Agents, materials, equipment, and structural aspects.

FIG. 18 illustrates method steps of some implementations of the present invention relating to occupancy of space.

FIG. 22 illustrates still more method steps that may be performed in some embodiments of the present invention involving a virtual tag.

DETAILED DESCRIPTION

Figure 1A:
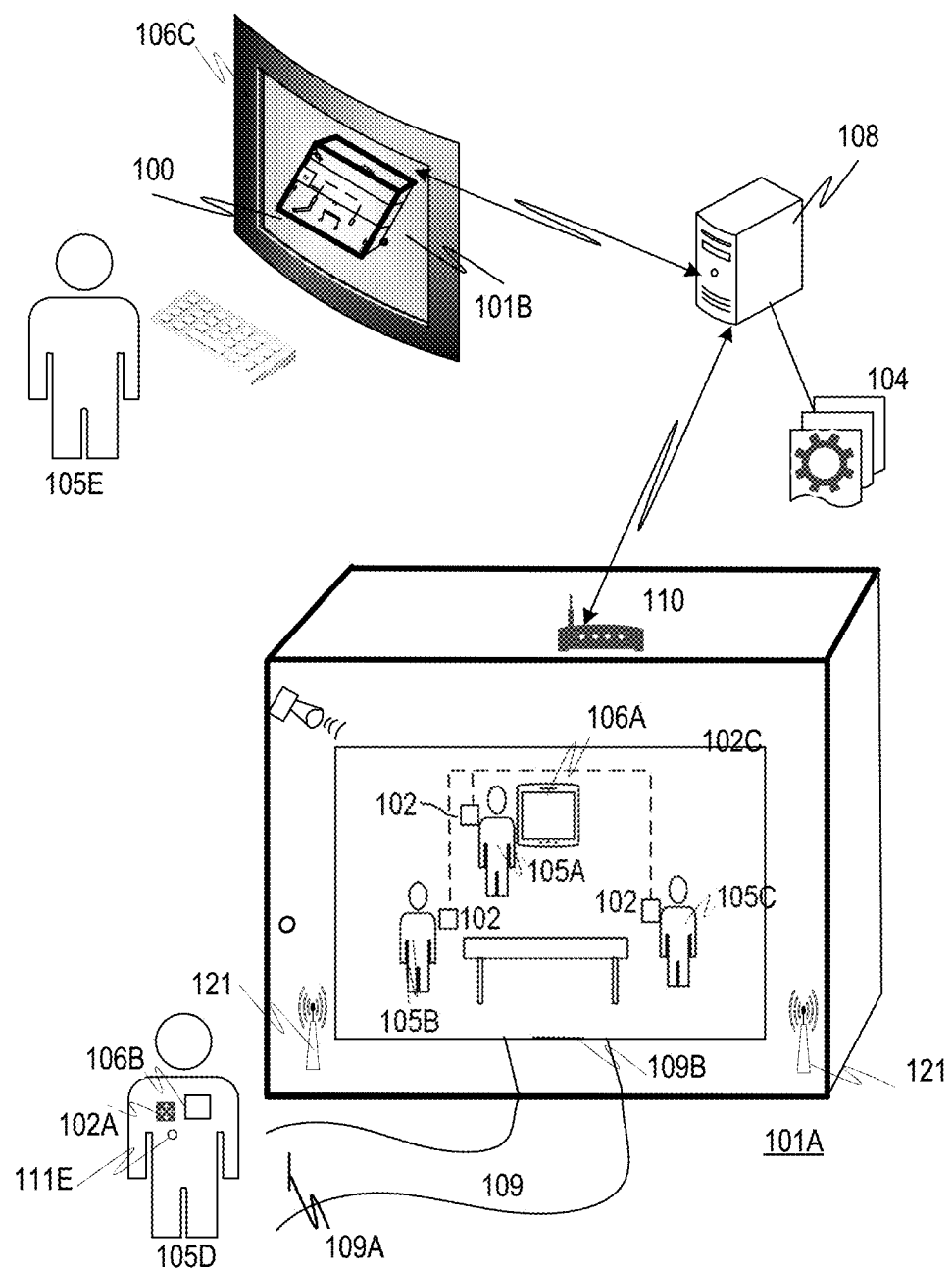
FIG. 1A illustrates a block diagram of inter-relating apparatus included in an automated healthcare facility according to the present invention.

The present invention provides for improved Healthcare Facilities equipped with wireless transceivers that communicate with Nodes to provide location and orientation of one or more of HCPs; equipment and resources and in some embodiments, a direction of interest of an HCP or other Agent via the operation of one or both of triangulation of Nodes with reference point transceivers; and a spatially self-verifying array of Nodes.

According to the present invention, a position and orientation of one or more of: doctors, nurse, technicians, transport personnel, or other persons associated with healthcare (sometimes referred to herein as a "healthcare provider" or "HCP") are tracked. In addition, conditions within the Healthcare Facility are automatically quantified. Healthcare activities are scheduled and tracked based upon the location and orientation of the HCPs and quantified conditions of one or both of Healthcare Facility resources and equipment.

The present invention provides for automation that tracks who and what is where, and a relative position and orientation of persons and equipment. The location and orientation of HCPs may be correlated to a healthcare procedure to monitor who is located where and which direction they are facing, before, during and after the healthcare procedure. The present invention also provides for automation to monitor which equipment was involved in a healthcare procedure and who operated such equipment, a chronological order of equipment operation and relative timing of actions taken during a procedure, including wait time during which a person and/or piece of equipment is located and brought to a site of a procedure.

The current invention, not only records which HCPs were involved, but where each HCP stood/sat, and for how long, in which direction and in which sequence, and who operated which equipment, how long a piece of equipment was operated and performance of the equipment. In addition, the present invention provides for quantification of conditions within a Healthcare Facility via automated transducers that convert an environmental condition into a digital value. Environment conditions may include, by way of non-limiting example, one or more of: a temperature, a humidity, presence of a liquid, presence of a gas, a vibration, audio patterns, airflow or other condition that may be monitored with an electronic or electromechanical sensor.

Specifically, Nodes may include devices capable of wireless communication in logical communication (e.g., a transmitter and one or more antennas) with a processor and a digital storage. A position for each Node may be generated based upon values for position determination variables. By comparing the values for position determination variables between a single Node and multiple disparate Nodes, a position of respective Nodes in the array may be determined and verified.

In some embodiments, Nodes are co-located with an Agent and/or one or more Sensors to quantify conditions within or proximate to Healthcare Facilities. Such Healthcare Facilities use Sensor groups to periodically and/or continuously quantify and transmit a current condition present within the Healthcare Facility. Transmissions may be accomplished via a wireless transceiver that may operate using a same or different frequency and modality as a frequency and modality used to determine a position and orientation and/or direction of an Agent, HCP, equipment item or resource. Sensor readings may additionally be associated with a time index.

Various embodiments include methods and apparatus for planning a healthcare event; identification of HCP's involved in the healthcare event; designation of equipment and/or resources involved in a healthcare event; as well as aspects of a Healthcare Facility, such as construction, Deployment and maintenance of a Healthcare Facility with Intelligent Automation (device, system, machine or equipment item) engaged in logical processes and Structural Messaging to communicate conditions within or proximate to the Healthcare Facility. Structural Messaging includes logical communications generated by the Intelligent Automation (such as a Sensor or machine) incorporated into, affixed to, or operated within or proximate to a Healthcare Facility.

In some aspects, a Sensor cluster (or a Sensor gateway, which may be a Sensor cluster connected to a communications array) may be attached to or embedded into an item of equipment, a wall or other surface, such as an architectural aspect (e.g., a header, trim, and or a baseboard). The Sensors may be capable of quantifying a condition by generating a digital value based upon an environment in which the Sensor is placed. For example, sensor may be operative to quantify one or more of: vibration patterns, chemical presence, temperature, water presence, light waves or other indicia of a condition present. A remedial action device may, based upon a reading from the Sensors, be actuated in response to a quantified condition.

In general, various embodiments of the present invention enable a Healthcare Facility, to be active as opposed to the former passive state. The active state enables the Healthcare Facility to generate data descriptive of one or more of: a location of a health care provider, technician, patient, other staff or visitor; a condition within a Healthcare Facility; a condition proximate to the Healthcare Facility; and an event experienced within the Healthcare Facility; and in some embodiments an active state Healthcare Facility is enabled to execute an action via automation based upon a condition quantified by a sensor and/or a position and direction of one or both of an Agent and an equipment item. An action based upon automation may be executed independent of Agent intervention, or based upon approval of an Agent, such as via an app on a Smart Device.

The present invention references prior applications and issued patents owned by the applicant relating to automated apparatus and methods for generating improved Augmented Virtual Models (sometimes referred to herein as an "AVM")

of a Healthcare Facility. In some embodiments of the present invention, a Healthcare Facility AVM may include defined location of fixed aspects within the Healthcare Facility, such as, for example, locations of resources and/or fixed location equipment within the Healthcare Facility.

Some aspects of an AVM of a Healthcare Facility may include a conceptual model and progress through one or more of: a) a design stage model; b) a build stage model; c) a Deployment stage model; d) a service stage model; e) a modification stage model; and f) a dispensing stage model. An AVM according to the present invention may include original design data matched to As Built data captured via highly accurate wireless location, direction and elevation determination. As Built data may be matched with a time and date of data acquisition and presented in two-dimensional (2D) and three-dimensional (3D) visual representations of the Healthcare Facility. The augmented models additionally include data relating to features specified in a Healthcare Facility design and data collected during building, Deployment, maintenance and modifications to the Healthcare Facility. In some embodiments, a fourth dimension of time may also be included.

An AVM may include a two, three or four-dimensional model in a virtual environment that exists parallel to physical embodiments modeled in the Augmented Virtual Model. The AVM exists in parallel to a physical Healthcare Facility in that the AVM includes virtual representations of physical Healthcare Facilities and additionally receives and aggregates data relevant to the Healthcare Facilities over time. The aggregation of data may be one or more of: a) according to an event schedule (e.g., healthcare procedure); b) periodic; and c) in real time (without built in delay).

The experience of events occurring within the Healthcare Facility, as well as the physical Healthcare Facility is duplicated in the virtual Augmented Virtual Model. The AVM may commence via an electronic model generated via traditional CAD software or other design type software. In addition, the AVM may be based upon values for variables, including one or more of: usage of a Healthcare Facility; usage of resources and/or equipment within the Healthcare Facility; environmental factors encountered during a build stage or Deployment stage of the Healthcare Facility; and metrics related to Performance of the Healthcare Facility. Metrics may be determined, for example, via measurements performed by Sensors located on in and proximate to Healthcare Facilities located on the Healthcare Facility.

In some embodiments, a virtual document library specific to a particular Healthcare Facility and location within the Healthcare Facility may be maintained for each Healthcare Facility and made accessible to an onsite HCP, technician and/or remote expert, or other Agent. The library may include, but is not limited to details descriptive of: a Healthcare Facility design, equipment included in the Healthcare Facility, and technological capabilities of resources within the Healthcare Facility. Appropriate how-to videos may also be made available based upon a location and orientation of an Agent within the Healthcare Facility.

In another aspect, a supplies ordering function may also be included in the AVM and include suggested supplies based upon a location and direction of interest. Supply ordering may allow a technician to view suggested supplies to have available during a scheduled procedure.

Aspects of the AVM may be presented via a user interface that may display on a tablet; smartphone, personal computer or other user interactive device, or in some embodiments be presented in a virtual reality environment, such as via an augmented reality headgear or a virtual reality headset.

Some exemplary embodiments may include updates to an AVM that include changes to: equipment; resources; patients or Agents within the Healthcare Facility; time and date notation of a change in location specific data; a location of an item, equipment or resource or Agent updated according to coordinates such as X,Y,Z coordinates, Cartesian coordinates, distance data and/or an angle and distance data (or other information pertinent to a chosen coordinate system); angle of arrival (AOA) of a wireless signal; angle of departure (AOD) of a wireless signal and the like. Location data may include hierarchical levels of location data, such as a high level location designation designating a street address of a Healthcare Facility via triangulation and highly specific position designation (e.g., particular room and location within a room) determined via wireless radio communications and protocols, such as WiFi RTT, Bluetooth, and sub-GHz communications.

In some preferred embodiments, a location will be determined based upon wireless communications with transceivers placed at accurately placed location reference points. The location reference points may be accessed during activities within a Healthcare Facility or in close to a Healthcare Facility (e.g., parking lot).

In various embodiments, reference points may be designated using various communication means, such as, by way of non-limiting example, a wireless transmission data transmitter operative to transmit an identifier and one or both of timing data and location data; a visual identifier, such as a hash code, bar code, color code or the like; an infrared transmitter; a reflective surface, such as a mirror; or other means capable of providing a reference point to be utilized in a triangulation process that calculates a precise location within the Healthcare Facility or other Healthcare Facility.

Highly accurate location position may be determined via automated apparatus and multiple levels of increasingly accurate location determination. A first level may include use of a GPS device providing a reading to first identify a Healthcare Facility. A second level may use position transmitters located within, or proximate to, the Healthcare Facility to execute triangulation processes in view of on-site location references. A GPS location may additionally be associated with a high level general description of a Healthcare Facility, such as, one or more of: an address, a unit number, a lot number, a tax map number, a county designation, Platte number or other designator. On-site location references may include one or more of: wireless communication reference point transceivers; laser distancing transceivers; line of sight with physical reference markers; patterned ID vehicle as bar code, hash tag, and alphanumeric or other identifier.

In some embodiments, triangulation may calculate a position within a boundary created by the reference points to within millimeter range, AOA and/or AOD and distance values may designate a polar and/or cylindrical coordinate. In some embodiments, one or more of: Bluetooth transmissions, WiFi RTT transmissions, sub GHZ transmissions, Differential GPS may be used to accurately determine a location of one or more of: a location Tag, a Node, a Smart Device, an Agent, a resource, an item of equipment, or other identifiable item with a sub centimeter accuracy.

In addition to a position determination, such as latitude and longitude, or other Cartesian Coordinate (which may sometimes be indicated as an "X" or "Y" coordinate), Polar Coordinate, or GPS coordinate, the present invention provides for a direction of interest, and/or an orientation of a device, such as a Smart Device or a headgear (sometimes referred to herein as a "Z" direction and elevation or "r") of an item of interest within the AVM.

According to the present invention, a direction dimension (which may include a direction of interest of an Agent and/or an orientation of a device, may be based upon wireless communications with a single antenna or an antenna array attached to or incorporated into the device. In addition, in some embodiments, a device with a controller and an accelerometer, such as mobile Smart Device, may include a user display that allows a direction to be indicated by movement of the device from a determined location acting as a base position towards an item of interest in an extended position. Similarly, a device with a controller and a laser (or other light based) distance and/or position indicator may be used in combination with wireless transceivers to improve accuracy of a location and direction or orientation determination.

In some implementations, the Smart Device may first determine a first position based upon triangulation with the reference points or angle of wireless transmissions and timing values for wireless transmissions; and a second position (extended position) also based upon triangulation with the reference points and/or angle of wireless transmissions and timing values. The process of determination of a position based upon triangulation with the reference points may be accomplished, for example via executable software interacting with the controller in the Smart Device, such as, for example via running an app on the Smart Device.

In combination with, or in place of directional movement of a device utilized to quantify a direction of interest to a user, some embodiments may include an electronic and/or magnetic Directional Indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, data storage medium, Image Capture Device, such as a Charge-Coupled Device ("CCD") capture device or an infrared capture device being available in a handheld or unmanned vehicle or other Agent.

An unmanned vehicle may include for example, an unmanned aerial vehicle ("UAV") or an unmanned ground unit ("UGA"), such as a unit with wheels or tracks for mobility and a radio control unit for communication.

In some embodiments, multiple unmanned vehicles may capture data in a synchronized fashion to add depth to the image capture and/or a three-dimensional and four-dimensional (over time) aspect to the captured data. In some implementations, UAV/UGV position will be contained within a perimeter and the perimeter will have multiple reference points to help each UAV/UGV (or other unmanned vehicle) determine a position in relation to static features of a building within which it is operating and also in relation to other unmanned vehicles. Still other aspects include unmanned vehicles that may not only capture data but also function to perform a task, such as transport a patient, or other action. As stated throughout this disclosure a quantification of a condition with the Healthcare Facility may be stored as digital data and stored in a digital storage for subsequent accessibility via a query, structured or unstructured, AI Analysis, and/or incorporated into an AVM of a Healthcare Facility.

In another aspect, captured data may be compared to an image library of stored data using image recognition software to ascertain and/or affirm a presence of particular HCPs, Agents or other persons, presence of particular equipment, a specific location, an elevation and a direction of an image capture location and proper alignment with the virtual model. Still other aspects may include the use of an accelerometer, a laser distance device, a compass, an audio based location device, incorporated into or in logical communication with a Smart Device.

In still other implementations, a line of sight from a Smart Device, whether user operated or deployed in an unmanned vehicle, may be used to align the Smart Device with physical reference markers and thereby determine an X,Y position as well as a Z position. Electronic altitude measurement may also be used in place of, or to supplement, a known altitude of a nearby reference point. This may be particularly useful in the case of availability of only a single reference point.

Reference points may be coded via identifiers, such as a unique identifiers, or UUID (Universally Unique Identifier), or other identification vehicle. Visual identifiers may include a bar code, hash tag, Alphanumeric or other symbol. Three-dimensional markers may also be utilized.

By way of non-limiting example, on site data capture may include designation of an X,Y,Z coordinate or angle and distance coordinate to describe a reference position and one or more of: image capture; infrared capture; temperature; humidity; airflow; pressure/tension; electromagnetic reading; radiation reading; sound readings (e.g., level of noise, sound pattern to ascertain equipment running and/or state of disrepair), and other vibration or Sensor readings (such as an accelerometer or transducer).

In some embodiments, vibration data may be used to profile activity within a Healthcare Facility and/or operation of equipment and machinery associated with the Healthcare Facility. For example, vibration detection may be used to determine a presence of a person or equipment, a type of activity taking place; equipment operation, including automated determination between proper operation of equipment and suboptimal or faulty operation of the equipment.

According to the present invention, a Healthcare Facility is provided with wireless Nodes capable of providing real time (without delay) position coordinates enabling succinct organization of healthcare procedures and allocation of healthcare providers and other staff and Agents. In addition, conditions present during a healthcare procedure are quantified and stored so that the conditions and relative positions of healthcare providers may be analyzed in view of success criteria in order to provide best practices and resource allocation for a given procedure.

The Healthcare Facility is combined with multiple transceivers, (which may be incorporated into Nodes or separately deployed) the transceivers are deployed in or proximate to the Healthcare Facility to provide data quantifying positions of the transceivers relative to each other and/or a Reference Point or other aspect of a Healthcare Facility.

In addition, Sensors may also be deployed with known positions relative to one or more transceivers. The Sensors are operative to quantify respective conditions in an environment available to the sensor. The data quantifying respective conditions registered by the Sensors may referenced to generate a status and/or condition of one or more of: a deployed Healthcare Facility, a Healthcare Facility in the process of being built; and/or a Healthcare Facility in the process of being retrofitted with a position of quantified conditions determined based upon use of a self-verifying array of Nodes.

In some embodiments, a location of one or more Sensors may be generated based upon wireless communications and represented as position coordinates, according to the methods herein. The location may be in relation to one or more of: a home position; a position of an Agent; and a position of one or more Reference Position Transceivers. An Agent may be guided to a Sensor and/or an area of interest based upon a Sensor reading using orienteering methods and apparatus presented herein. For example, a controller may receive Sensor data quantifying temperature and humidity that exceed an optimal range of temperature and humidity. Using Orienteering, an Agent may be guided to one or both of the Sensors that generated the data and an area of interest indicated by the measured data. A user interface may include human ascertainable indications of the conditions quantified and/or the location of the conditions quantified.

Additional examples may include guiding an Agent to a Sensor to replace a power source, such as a battery or battery pack. Other exemplary power sources include an antenna or array of antennas tuned to receive ambient energy and recharge an energy storage device (such as a battery).

Figure 1B:
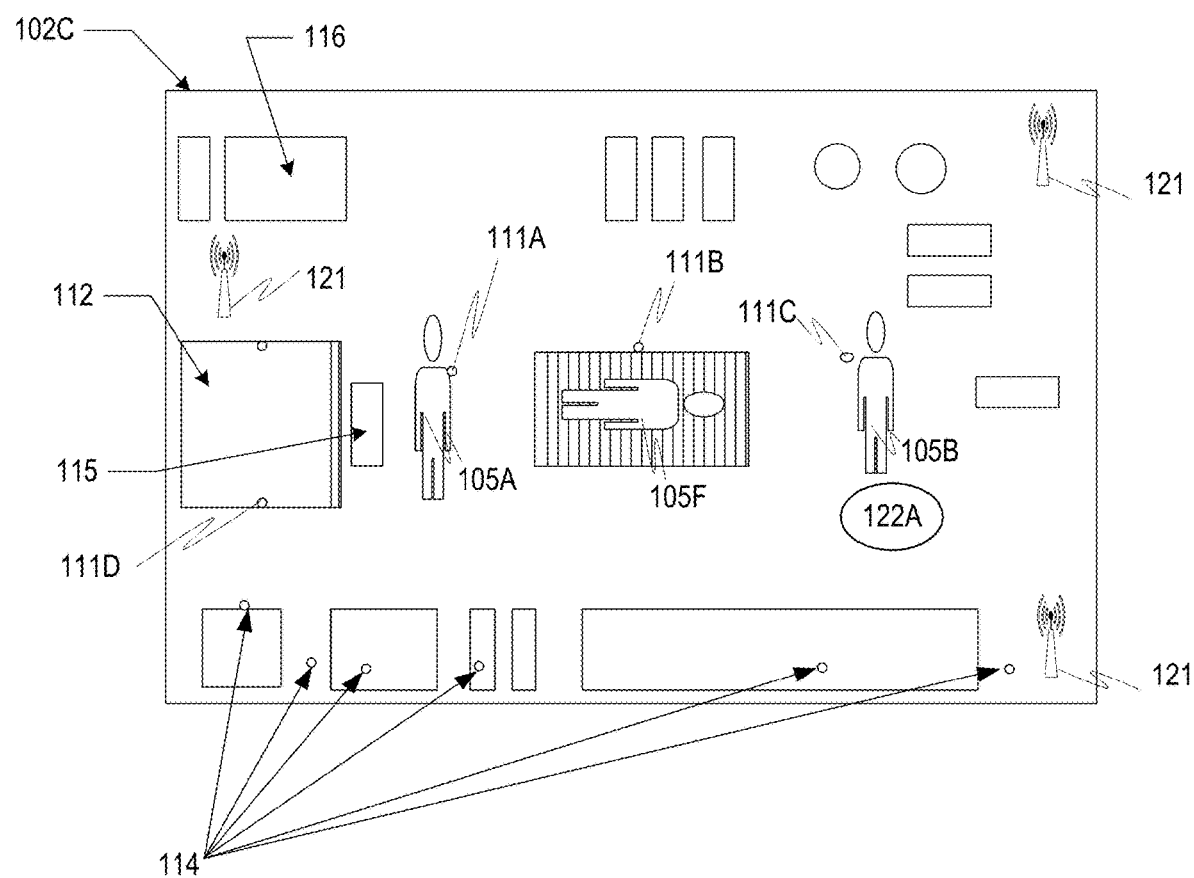
FIG. 1B illustrates a block diagram of automated functions based upon data capture via Smart Devices and Sensors and support for predictive modeling based upon the smart data capture.

Referring now to FIGS. 1A and 1B, a relational view of an AVM 100 of a Virtual Healthcare Facility 101B is illustrated, as well as a physical Healthcare Facility 101A. The AVM 100 includes a virtual model stored in digital form that is functional to model a healthcare procedure including one or more of: patient location(s); patient transport; HCPs involved; technicians involved; nurses involved, equipment involved, resource involved, all modeled in a virtual environment. The Virtual Healthcare Facility 101B and the AVM 100 may reside in a virtual setting via a controller 108 operative via executable software stored a digital storage medium 104 that is in logical communication with the controller 108. The controller 108 will typically include one or more computer processors as described more fully below, and may be accessible via digital networking protocols. The AVM 100 may be accessible via a user interface 101 on a smart device 106A-B.

The physical Healthcare Facility 101A may include Nodes or other type of wireless transceiver that may incorporate, or be co-located with, one or more Sensors that quantify a position or condition(s) in a physical area within the Healthcare Facility 101A, which may be designated, for example, as a resource 102C. Reference Point Transceivers 121 may be used as wireless references of a geospatial position. A Gateway Node 110 may link logical infrastructure within the Healthcare Facility 101A with a digital communications network, such as the Internet or a private network.

The present invention provides for wireless tracking of Agents 105A-105E (e.g., a technician; an HCP, a nurse, a transport agent, and a coordinator/healthcare procedure administrator) as well as other staff and Agents, prior to, during and subsequent a Healthcare procedure. Wireless tracking, according to the methods and apparatus of the present invention, includes generation of a position of each Agent 105A-105E and an orientation of each Agent 105A-105E and may also include a direction of interest designated by an Agent 105A-105E.

The present invention allows for scheduling of Agents 105A-105E to be present at a designated resource 102C, such as an operating room, that is a portion of a Healthcare Facility 101A. The present invention also provides for generating a position of each scheduled Agent 105A-105E capable of ascertaining the presence of each of the scheduled Agents 105A-105E at a designated resource 102C during a procedure.

In addition, as a procedure progresses, an additional Agent 105D may be summoned via wireless communication to come to the resource 102C. Orienteering methods may be used to provide a wireless guidance interface on a user device 106A to the Agent 105D that calculates a starting position 109A and a destination position 109B and a path 109 to get the Agent from the starting position 109A to the destination position 109B.

Wireless positioning and orientation and direction of interest designations may be generated relative to reference point transceivers 121 fixedly located within or proximate to the Healthcare Facility 101A. Positioning data and/or Sensor 102 quantification data may be transmitted to a gateway 110 that receives the Positioning data and/or Sensor 102 quantification data via a first wireless wavelength and modality and transmits the Positioning data and/or Sensor 102 quantification data to a controller via a wavelength and/or modality. For example, the Positioning data and/or Sensor 102 quantification data may be transmitted to the gateway 110 via Bluetooth and/or WiFi and/or sub-GHz wavelengths and transmitted from the Gateway 110 to a controller 108 via Internet Protocol, cellular transmission and/or satellite transmission.

A healthcare procedure administrator 105E or other Agent or user may access the AVM 100 to monitor progression of healthcare procedures; locations of patients and/or Agents 105A-105D, as well as monitor conditions quantified via a sensor 114, operation of an equipment item 112, a location tags 111A,111B, 111C and 111D positions.

The Virtual Healthcare Facility 101B may include one or both of: historical data and most current data relating to aspects viewable or proximate to a user device 106A while the user device 106A is at the calculated location in the physical Healthcare Facility 101A. In this way, the parallel virtual world of the AVM 100 and the Virtual Healthcare Facility 101B may present data from the virtual world that emulates aspects in the physical world, and may be useful to the user accessing the user device 106A, while the user device 106A is at a particular physical location.

As Sensors 102 quantify conditions within the Healthcare Facility 101A, the conditions are memorialized as digital data (sometimes referred to as Experiential Data) associated with a physical Healthcare Facility 101A.

In some embodiments, a Sensor 102A may quantify one or more biometric conditions present in an Agent 105D, or other person, that is about to enter a resource 102C or Healthcare Facility 101A involved in a healthcare procedure. For example, in some embodiments, a Sensor 102A may quantify a biometric that includes: body temperature, pulse rate, breathing rate, blood pressure reading, or other biologic and/or corporeal condition. In such embodiments, a person with a condition that exceeds a designated range for a biometric condition, such as, for example, a person with a fever and/or elevated heartrate may be denied access to the resource 102C or Healthcare Facility 101A or other structure or facility, in order to protect the patient 105F or other persons 105A-105C present from a bacteria or virus infection that may be causing the biometric condition. A physical location tag 111E and/or virtual location tag may be used to determine that an Agent 105D is about to enter a defined area, such as a Healthcare Facility 101A or a resource 102C, or other room or defined area.

Similarly, in some embodiments, a physical location tag 111A and/or virtual location tag may be used to determine an Agent 105A positioned to operate an item of equipment 112 or interface device 115. In some embodiments, an Agents location and orientation may be determined via the teachings herein and a controller may conclude that the Agent location and orientation supports that the Agent 105A is operating the item of equipment 112. A record may be stored in a digital storage 104 memorializing that the Agent 105A was in control of the equipment item 112 at a recorded time and on a recorded date.

In addition, Sensors 114 may quantify one or more conditions present in the Healthcare Facility 101A and the quantified condition as may be stored as Experiential Data in the digital storage 104. The Experiential Data may be retrieved via structured and/or unstructured queries and may also be analyzed with unstructured queries and/or artificial intelligence processes.

In some embodiments, Experiential Data may also be associated with an Agent interacting with the equipment item 112 and/or the Healthcare Facility 101A. A Healthcare Facility may be modified to optimally carry out a prescribed function, such as performance of a healthcare procedure within the Healthcare Facility 101A. Conditions associated with Agents 105A-105D may be quantified with Sensors 102 that are located on or proximate to the Agents 105A-105D. Alternatively, Sensors located in, or proximate to, a Healthcare Facility 101A may be used to monitor human variability. Biosensors may be used to provide empirical data of humans 118 interacting with a Healthcare Facility may be analyzed using structured or unstructured queries to device relationships between Healthcare Facility Performance and human biometrics.

Accordingly, Sensors 102 may be used to quantify interaction between an Agent 105A-105D and an item of equipment 112 and/or the Healthcare Facility 101A according to physiological and behavioral data, interactions, and environmental factors within the Healthcare Facility, actions undertaken, movements, and almost any quantifiable aspect may be quantified and converted to digital values and stored for future access.

As Built Features and biometrics may be further utilized to control various Healthcare Facility automation devices. Healthcare Facility automation devices may include, by way of non-limiting example one or more of: healthcare equipment items 112, automated locks or other security devices; thermostats, lighting, heating, and the like. Similarly, a Healthcare Facility 101A with recorded vibration Sensors may track activities in the Healthcare Facility 101A and determine that a particular activity is taking place, or that a particular Agent 105A-105D associated with a particular vibration pattern of walking (or other travel mode) is moving within the Healthcare Facility.

Moreover, as a healthcare procedure is being performed on a patient 105F in a particular resource 102C, patient biometric data and physical condition, as well as procedure metrics may be correlated with positions and/or orientations of Agents 105A-105D and/or equipment 112 during the Healthcare Procedure.

A Healthcare facility may be programmed to execute a remedial action in response to a condition quantified by a Sensor. By way of non-limiting example, vibration patterns may indicate that a particular or unidentified Agent 105A-105D is walking down a hallway and automatically turn on appropriated lighting and adjust one or more of: temperature, sound, and security. Security may include locking doors for which person one is not programmed to access. For example, a first pattern of vibration may be used to automatically ascertain that an Agent 105A-105E is traversing an area of a Healthcare Facility for which a high level of security is required or an area that is designated for limited access due to safety concerns. Other Healthcare Facility automation may be similarly deployed according to occupant profiles, biometric data, time of day, or other combination of available Sensor 102 generated data.

In some implementations, an augmented reality headgear, a virtual reality headset or other headgear may be worn by an Agent 105A-E to provide one or both of an augmented setting or an immersive experience from a Vantage Point 122A such that the Agent 105A-105B may combine virtual and physical input based upon being located at the Vantage Point 122A within the Healthcare Facility 101A at a specified point in time.

In still another aspect of the present invention, in some embodiments, a display screen 116 may be located within a resource or another location in the Healthcare Facility 101A to apprise Agents 105A-105B of conditions present within the Healthcare Facility 101A. The display screen may include user interactive portions that allow an Agent 105A-105B to query the digital storage 104 and or enter a command or other instruction or manually input data. In some embodiments, a display screen 116 may track steps included in a healthcare procedure and provide an indication of completion of steps as each respective step is concluded. The display may also indicate which Agent 105A-105B has compacted to complete a step and where the Agent 105A-105B was located and how the Agent 105A-105B was oriented during completion of the step. The display may still additionally display steps that are queued to be executed and an Agent scheduled to complete one or more queued steps.

Still further, the display 116 or an Agent supported Smart Device 106A-106B may be operated to request assistance from an Agent 105D that is not present in the resource 102C. A wireless communication may be used to summon the Agent 105D and to also provide Orienteering instructions on how to arrive at the resource 102E.

Figure 1C:
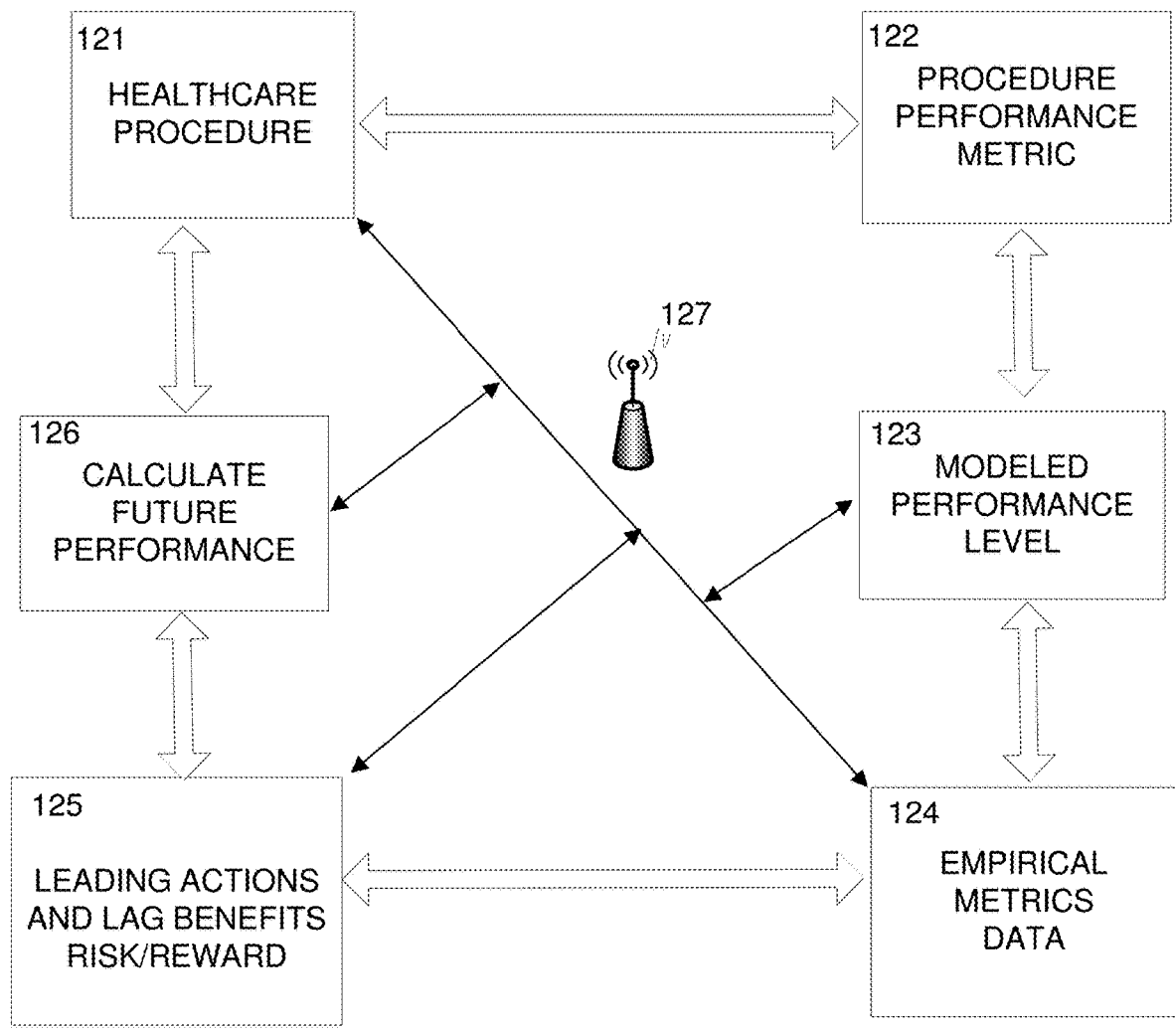
FIG. 1C illustrates geolocation aspects that may be used to identify a Healthcare Facility and corresponding wireless modalities that may be used.

Referring now to FIG. 1C, a block diagram illustrates various aspects of the present invention and interactions between the respective aspects. The present invention includes a healthcare procedure 111 of a Healthcare Facility that includes suggested procedure steps as well as Agents that will be involved in the procedure steps. A procedure steps are tracked via Sensors and Agent actions based upon location and direction-specific data capture. Data may be transmitted and received via one or both of digital and analog communications, such as via a wireless communication medium 127.

According to the present invention, one or more Procedure Performance Metrics 122 are entered into automated controller in logical communication with a controller or smart device containing steps included in the healthcare procedure 111. The Procedure Performance Metrics 122 may essentially include a purpose to be achieved during healthcare procedure that is performed in a Healthcare Facility. By way of non-limiting example, a Procedure Performance Metric may include one or more of: an improved health condition of a patient, repair of a malfunctioning body part, removal of a diseased or malignant body part, insertion of an artificial body part, application of a therapeutic substance, application of therapeutic energy, imaging of a body part, birth of a child, surgery, therapeutic manipulation of body parts, diminishment of pain levels, increased physical performance, improved biological functions or other procedure.

Modeled Performance Levels 123 may also be entered into the controller in logical communication with the healthcare procedure 111. The Modeled Performance Levels 123 may include an appropriate level of performance of an aspect of the Healthcare Facility. For example, a Performance Level 123 for a Healthcare Facility modeled may include one or more of: a threshold number of successfully completed procedures or treatment of patients, achievement of quality assurance goals, adherence to customary care standards and achievement of a daily or monthly utilization of healthcare equipment. Similarly, a target patient satisfaction, employee feedback, financial goal or other metric may be included.

Empirical Metrics Data 124 may be generated and entered into the automated apparatus on an ongoing basis. The Empirical Metrics Data 124 will relate to one or more of the Procedure Performance Metrics and may be used to determine compliance with a Procedure Performance Level and/or a Performance Levels. Empirical Metrics Data 124 may include, by way of non-limiting example, adherence to quality assurance procedures, maintenance of equipment schedules, environment cleanliness, employee absenteeism, patients who experience an improvement in health, achievement of safety goals or other measurable items.

In addition to Empirical Metrics Data 124, Lead Actions and expected Lag Benefits 125 that may cause an effect on one or both of a Procedure Performance Level 122 and a Performance Level 123, may be entered into the automated apparatus. A Lead Action may include an action expected to raise, maintain or lower an Empirical Metrics Data 124. For example, an action to quickly and thoroughly clean a resource following a procedure and make it deployable for a next patient and healthcare procedure may be scheduled based upon relative locations of healthcare providing Agents and Sensor readings. Other Lead Actions may include limiting access to a Healthcare Facility of person with certain biometric readings, such as an elevated body temperature, elevated heart rate, coughing or sneezing. An expected benefit may be measured in Lag Benefit measurements, such as those described as Empirical Metrics Data 124, or less tangible benefits, such as patient and employee satisfaction.

The automated apparatus may also be operative to calculate Future Performance 126 based upon one or more of: relative positions of Agents during a procedure, time of day of a procedure, day of week of a procedure, time of year of a procedure, which resource is occupied during a procedure, which healthcare facility is occupied during a procedure, which Agents perform procedure steps, which teams of Agents perform a procedure, which equipment is used to complete a procedure; equipment maintenance schedules, environmental conditions in a resource during a procedure, biometric conditions measured in a patient and/or healthcare practitioners during a procedure; Procedure Performance Metrics 122; Modeled Performance Levels 123 and Empirical Metrics Data 124. Future Performance may be calculated in terms of an achievement of a procedure performance metric based upon conditions quantified by Sensors, positions of Agents, which Agents are present, procedure steps executed and any other of the variables discussed herein.

Figure 1D:
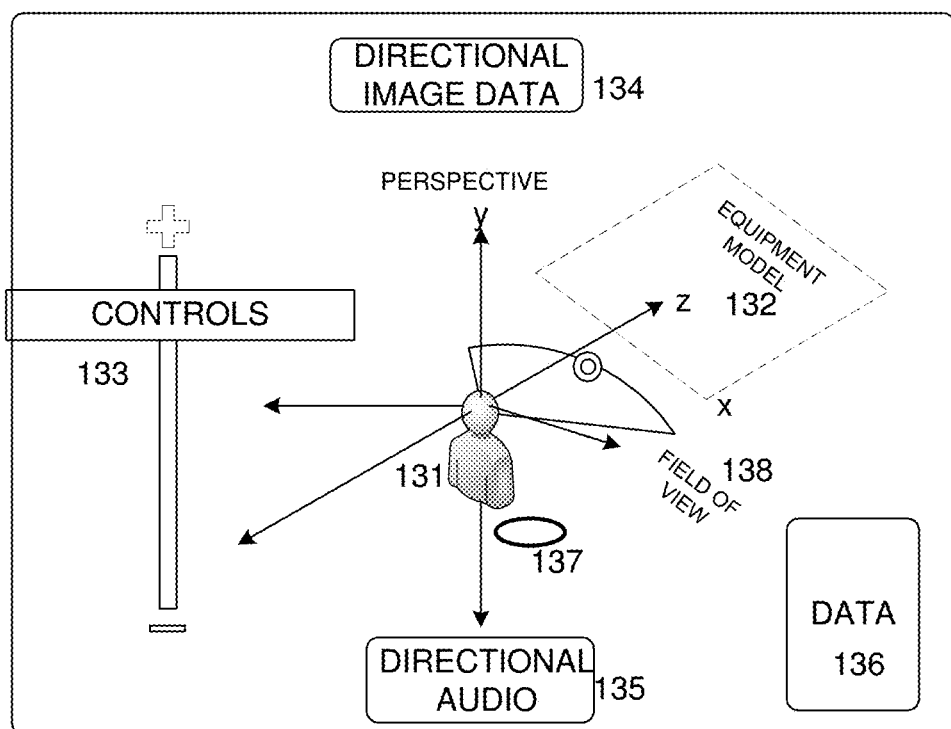
FIG. 1D illustrates an exemplary Healthcare Facility layout with various items delineated in a top-down representation, according to some embodiments of the present invention.

Referring now to FIG. 1D a user 131 is illustrated with a field of view that may be simulated via a user interface with an AVM 100 (not shown in this Figure). The user interface may be immersive, such as, for example, a virtual reality interface; or the interface may provide augmented reality, wherein a user is provided data related to a user environment or a vantage specified by the user. The user 131 may be virtually located at a Vantage Point 137 and may receive data 136, including, but not limited to one or more of: image data 134, audio data 135 and ambient environment data 136. The user 131 may also be provided with controls 133. Controls 133 may include, for example, zoom, volume, scroll of data fields and selection of data fields. Controls may be operated based upon an item of Equipment 132 within a Field of View 138 of the User 131 located at a Vantage Point 137 and viewing a selected direction (Z axis). The user is presented with Image Data from within the AVM 100 that includes As Built data and virtual design data.

Examples of content included in a virtual and/or augmented model include data generated by one or more of: Sensor arrays, audio capture arrays and camera arrays with multiple data collection angles that may be complete 360 degree camera arrays or directional arrays, for example, in some examples, a Sensor array (including image capture Sensors) may include at least 120 degrees of data capture, additional examples include a Sensor array with at least 180 degrees of image capture; and still other examples include a Sensor array with at least 270 degrees of image capture or 360 degrees of image capture. In various examples, data capture may include Sensors arranged to capture image data in directions that are planar, oblique, or perpendicular in relation to one another.

Figure 1E:
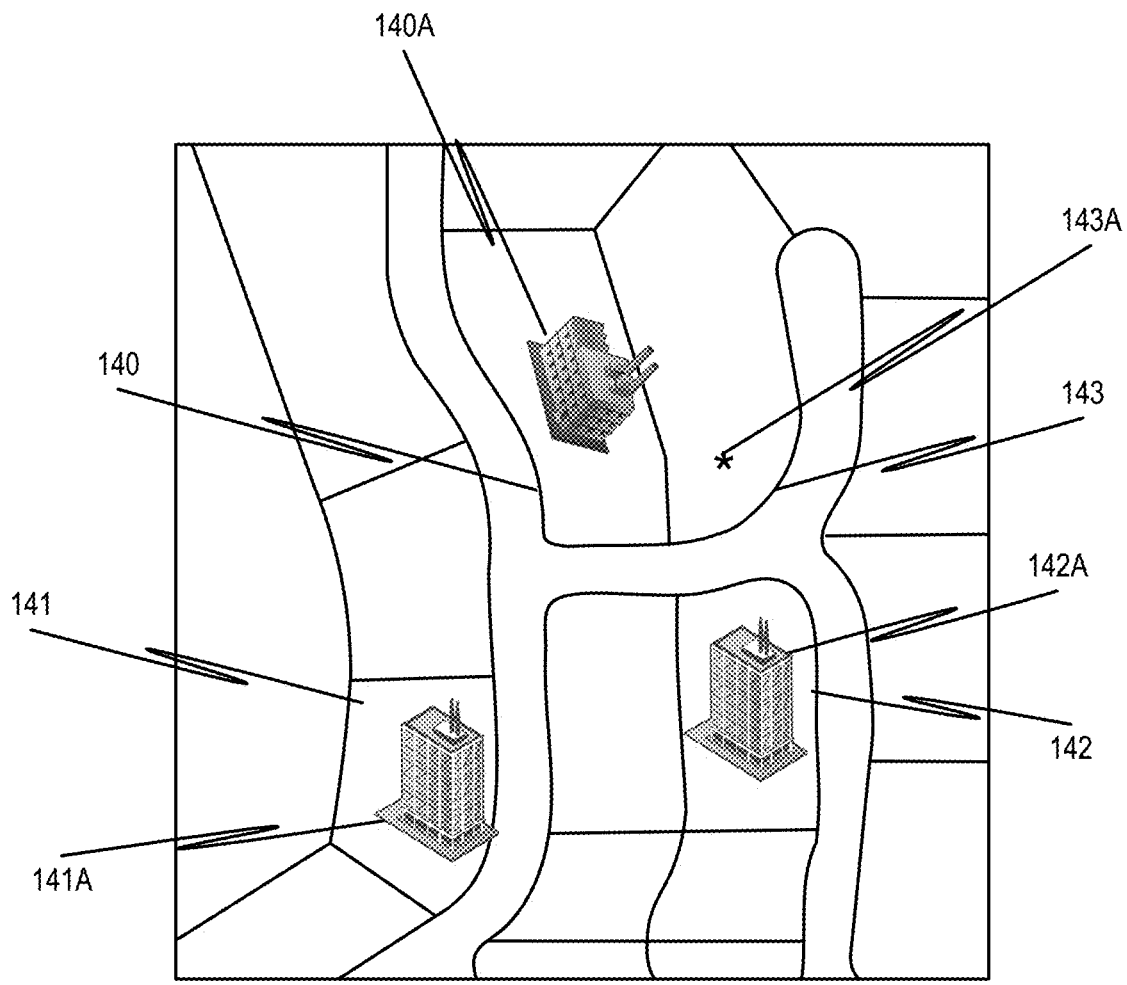
FIG. 1E illustrates a diagram of an Agent and Directional Image Data.

Referring now to FIG. 1E, in some examples, a tablet, handheld network access device (such as, for example a mobile phone) or other device with one or more antennas and a transceiver may be used to determine a general location of a physical Healthcare Facility 101A. For example, a smart phone with global positioning system (GPS) or cellular communication capabilities may be used to determine a physical address of a physical Healthcare Facility, such as 123 Main Street. Stored records containing data relating to 123 Main Street may be accessed via the Internet or other distributed network.

In addition to the use of GPS to determine a location of a Smart Device, the present invention provides identification of a real estate parcel 140-142 with icons 140A-142A of a physical Healthcare Facility based upon wireless communications with one or more satellites, cell towers, sub GHz transmitters or other long distance wireless communication. The Healthcare Facility may in turn include one more radio frequency (or other mechanism) location identifiers. Location identifiers (see reference point transceivers 121 in FIG. 1A-B) may include, for example, radio transmitters at a defined location that may be used to accurately identify via triangulation, a position of a user device 106, such as a: tablet, smart phone, or virtual reality device. The position may be determined via triangulation, single strength, time delay determination or other process. In some embodiments, triangulation may determine a location of a user device within millimeters of accuracy.

Other location identifiers may include, by way of non-limiting example, RFID chips, a visual markings (e.g., a hash tags or barcode), pins, or other accurately placed indicators. Placement of the location identifiers may be included in the AVM and referenced as the location of the physical user device is determined. As described above, specific location identifiers may be referenced in the context of GPS coordinates or other more general location identifiers.

Based upon the calculated location of the user device 106, details of the physical Healthcare Facility 101A may be incorporated into the Virtual Healthcare Facility 101B and presented to a user via a graphical user interface (GUI) on the user device 106.

For example, a user may approach a physical Healthcare Facility and activate an app on a mobile user device 106. The app may cause the user device 106 to activate a GPS circuit included in the user device and determine a general location of the user device 106, such as a street address designation. The general location will allow a correct AVM 100 to be accessed via a distributed network, such as the Internet. Once accessed, the app may additionally search for one or more location identifiers 121A of a type and in a location recorded in the AVM. An AVM may indicate that one or more RFID chips are accessible at an ingress into a Healthcare Facility. The user may activate appropriate Sensors to read the RFID chips and determine their location. In another aspect, an AVM 100 may indicate that location identifiers 121A are placed at two or more corners (or other placement) of a physical Healthcare Facility 101A and each of the location identifiers 121A may include a transmitter with a defined location and at a defined height. The user device 106, or other type of controller, may then triangulate with the location identifiers 121A to calculate a precise location and height within the physical Healthcare Facility.

In still another aspect of the present invention, in some embodiments, transmissions from one or more location identifiers 121A may be controlled via one or more of: encryption; encoding; password protection; private/public key synchronization; or other signal access restriction. Control of access to location identifiers 121A may be useful in multiple respects, for example, a location identifier may additionally function to provide access to data, a distributed network and/or the Internet.

As illustrated in FIG. 1E, a map of real estate parcels 140-143 is shown with icons 140A-142A indicating parcels 140-142 that have icons 140A-142A of virtual Healthcare Facilities included in a virtual model associated with the parcels. Other parcels 143 have an indicator 143A indicating that a virtual model is in process of completion.

In some methods utilized by the present invention, data in an AVM may be accessed via increasingly more accurate determinations. A first level of geospatial location determinations may be based upon the real estate parcels 140-143 themselves and a second geospatial determination may be made according to Reference Position Transceivers (discussed more fully below) included within the boundaries of the real estate parcels 140-143. Still more accurate location position may be calculated according to one or both of a direction determination and an accelerometer or other location determination technology. Accordingly, it is within the scope of the present invention to access a record of a design model for a specific wall portion within a Healthcare Facility based upon identification of a particular parcel of real estate parcels 140-143 and a location within a Healthcare Facility situated within the real estate parcels 140-143 and height and direction. Likewise, the present invention provides for accessing As Built data and the ability to submit As Built data for a specific portion of a Healthcare Facility based upon an accurate position and direction determination.

For example, in some embodiments, a first level of location identification may include a real estate parcel 140-143 identified based upon a first wireless communication modality, such as a GPS communication or a sub-GHz wavelength communication. A second level of location identification may include a Healthcare Facility 141A-143A identified via one or more of: GPS; UWB; Wi-Fi; sonic communications; a sub-GHz wavelength communication and Bluetooth communications. A third level of location identification may include an Agent position within a Healthcare Facility (or Healthcare Facility) based upon logical communications via one or more of: UWB; Wi-Fi; sonic communications; and Bluetooth communications. A fourth level of location identification may include a determination of a distance from an item to a Smart Device borne by an Agent, the distance determination may be based upon transceiving in a SVAN operating in a Bluetooth wavelength, a WiFi wavelength or a sub-GHz wavelength.

In some implementations of the present invention, a Healthcare Facility-unique identifier may be assigned by the AVM and adhere to a standard for universally unique identifiers (UUID), other unique identifiers may be adopted from, or be based upon, an acknowledged standard or value. For example, in some embodiments, a unique identifier may be based upon Cartesian Coordinates, such as global positioning system (GPS) coordinates. Other embodiments may identify a Healthcare Facility according to one or both of: a street address and a tax map number assigned by a county government or other authority.

In some embodiments, an AVM may also be associated with a larger group of Properties, such as a manufacturing plant, research and development, assembly, a complex, or other defined arrangement.

As illustrated, in some preferred embodiments, an electronic record correlating with a specific Healthcare Facility may be identified and then accessed based upon coordinates generated by a GPS device, or other electronic location device. The GPS device may determine a location and correlate the determined location with an AVM record listing model data, As Built data, improvement data, Performance data, maintenance data, cost-of-operation data, return-on-investment data and the like.

In another aspect, data generated by Sensors deployed in a Healthcare Facility may be aggregated and analyzed according to a Healthcare Facility location and/or Healthcare Facility location associated with the Sensor/Sensor Cluster/Sensor Gateway. In this manner, an event may be tracked in a larger geographic area with numerous data points. For example, an event such as the launch of a rocket may cause data to be generated by multiple Sensor/Sensor Cluster/Sensor Gateways and tracked across a geographic area. Similarly, a natural event, such as an earthquake, hurricane, wildfire and the like may be tracked with highly accurate Sensor data across tens, hundreds or many thousands of data points. Still other events may include, for example, power usage, power generation, water flow in a hydroelectric system, water management in a reservoir system, flooding, release of toxic components into the environment, etc.

Figure 2:
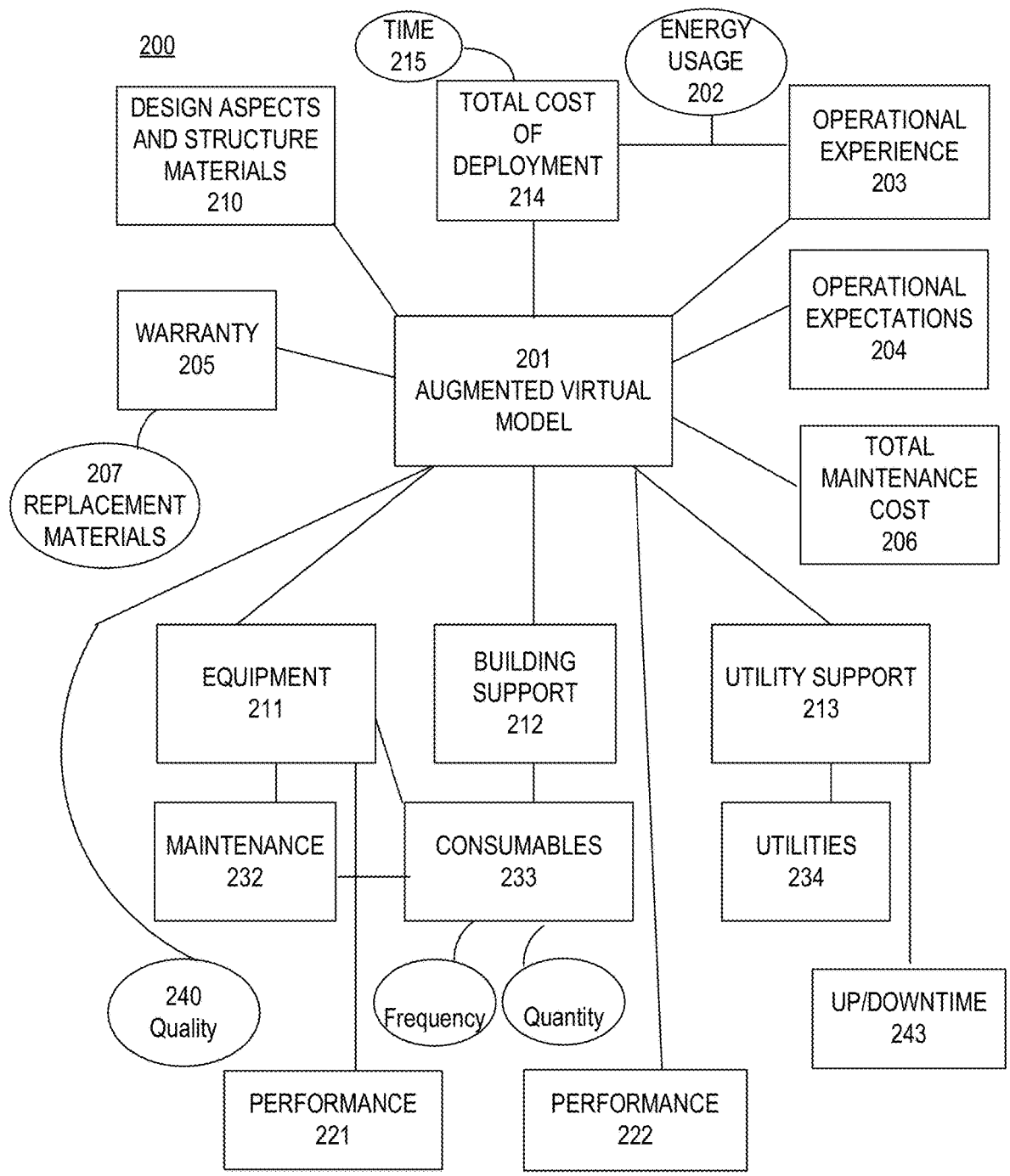
FIG. 2 illustrates a block diagram of an Augmented Virtual Modeling system.

Referring now to FIG. 2, a functional block illustrates various components of some implementations of the present invention. According to the present invention, automated apparatus included in the AVM 201 are used to generate a model of a Virtual Healthcare Facility and may also incorporate a model and associated real estate parcel. One or more pieces of equipment that will be deployed in the Healthcare Facility may be included into the AVM 201. This equipment may include, for example: equipment 211; building support items 212, and utilities support 213. The AVM 201 may model operational levels 204 during deployment of a Healthcare Facility and associated machinery and equipment included in the AVM 201. Machinery may include, by way of non-limiting example: imaging machines, life support, radiation treatment equipment, purification equipment, sterilization equipment, oxygen supply equipment, medical procedure support equipment, Healthcare Facility automation, air purification or filter systems, noise containment device and any other equipment conducive to performing a successful healthcare procedure. Utility support equipment may include cabling, Wi-Fi, water filter, chemical supply, gas supply, compressed air supply and the like, as well as uptime and downtime associated with a Healthcare Facility utility and uptime and down time 243 of one or more aspects of the Healthcare Facility.

The AVM 201 calculates a predicted Performance of the AVM and generates Operational Levels 204 based upon the Performance 222, wherein "Performance" may include one or more of: total cost of Deployment 214; operational experience 203 which may include one or both of: objective empirical measurements and satisfaction of a patient's experience in the Healthcare Facility, operational expectations 204, total maintenance cost 206, and residual value of an As Built Healthcare Facility following a term-of-years of occupation and use of an As Built Healthcare Facility based upon the AVM. Performance 221 may also be associated with a specific item of equipment 211.

In another aspect, actual Operational Experience 203 may be monitored, quantified and recorded by the AVM 201. Data quantifying the Operational Experience 203 may be collected, by way of non-limiting example, from one or more of: Sensors incorporated into an As Built Healthcare Facility; maintenance records; utility records indicating an amount of energy 202 (electricity, gas, heating oil) consumed; water usage; periodic measurements of an As Built Healthcare Facility, such as an infrared scan of climate containment, air flow through air handlers, water flow, water quality and the like; user surveys and maintenance and replacement records.

In still another aspect, a warranty 205 covering one or both of parts and labor associated with an As Built Healthcare Facility may be tracked, including replacement materials 207. The warranty 205 may apply to an actual Healthcare Facility, or one or more of equipment 211; building support 212 item; and utility support item 213.

The AVM 201 may consider a proposed usage of a deployment of a Healthcare Facility based upon values for Deployment variables and specify aspects of one or more of: equipment 211; building support 212; and utility support 213 based upon one or both of a proposed usage and values for Deployment variables. Proposed usage may include, for example, how many resource Agents will occupy a Healthcare Facility, demographics of the resources that will occupy the Healthcare Facility; percentage of time that the Healthcare Facility will be occupied; whether the Healthcare Facility is a leased Healthcare Facility and typical duration of leases entered into; and environmental conditions experienced by the Healthcare Facility, such as exposure to ocean salt, winter conditions, desert conditions, high winds, heavy rain, high humidity, or other weather conditions.

In another aspect, Deployment may relate to biometrics or other data associated with specific occupants of a Healthcare Facility. Accordingly, in some embodiments, Sensors may monitor biologically related variables of patients and/or proposed use patients. The biometric measurements may be used to determine one or both of Lead Actions and Lag Metrics. Lead Actions may include one or more of: use of specific materials, selection of design aspects; Deployment of Healthcare Facility equipment; Deployment of machinery; terms of a lease; length of a lease; terms of a maintenance contract; and Healthcare Facility automation controls.

According to the present invention, design aspects and Healthcare Facility materials 210 may also be based upon the proposed usage and values for Deployment variables. For example, a thicker exterior wall with higher insulation value may be based upon a Healthcare Facility's location in an adverse environment. Accordingly, various demographic considerations and proposed usage of a Healthcare Facility may be used as input in specifying almost any aspect of a Healthcare Facility.

In still another consideration, a monetary value for one or more of: a Total Cost of Deployment ("TCD"). Total Maintenance Cost ("TMC") and a desired return on investment ("ROI") for a Healthcare Facility may be used as input for one or more design aspects included in an AVM System 200. Total Cost of Ownership, TCD, TMC, and ROI may be used to determine optimal values of variables 202-205, 210-213 specified in an AVM System 200 and incorporated into an As Built Healthcare Facility, and other improvements to a real estate parcel.

A Total Cost of Deployment 214 may change based upon a time period 215 used to assess the Total Cost of Deployment 214. A ROI may include one or more of: a rental value that may produce a revenue stream, a resale value, a cost of operation, real estate taxes based upon Healthcare Facility specifications and almost any other factor that relates to one or both of a cost and value.

Desirable efficiency and Performance may be calculated according to one or more of: established metrics, measurement protocols, and past experience. The AVM 201 and associated technology and software may be used to support a determination of a TCD. In another aspect, a TCD may be based upon an assembly of multiple individual metrics, procedures to assess metrics, procedures to adjust and optimize metrics and procedures to apply best results from benchmark operations. In the course of managing Total Cost of Ownership, in some examples, initial steps may include design aspects that model an optimal design based upon Total Cost of Ownership metrics.

In the following examples, various aspects of Total Cost of Deployment 214, Total Maintenance Costs, and associated metrics, are considered in the context of calculating a target Total Cost of Deployment 214. Accordingly, the AVM may be used to attempt to optimize TCD based on one or more measured variables.

A designed Healthcare Facility is ultimately built at a site on a real estate parcel. A build process may be specified, which may provide metrics that may be used in a process designed by an AVM 201 and also used as a physical build proceeds. In some examples, time factors associated with a physical build may be important, and in some examples time factors associated with a physical build may be estimated, measured, and acted upon as they are generated in a physical build process. Examples of time factors may include one or more of: a time to develop and approve site plans; a time to prepare the site and locate community provided utilities or site provided utilities; a time to lay foundations; a time to build Healthcare Facility; a time to finish Healthcare Facility; a time to install internal utilities and facilities related aspects; a time to install, debug, qualify and release equipment; and times to start production runs and to certify compliance of production are all examples of times that can be measured by various techniques and sensing equipment on a Healthcare Facility's site. Various time factors for a build are valuable and may become increasingly valuable as a physical build proceeds since the monetary investment in the project builds before revenue flows and monetary investments have clearly defined cost of capital aspects that scale with the time value of money.

Various build steps may include material flows of various types. Material flow aspects may be tracked and controlled for cost and efficiency. Various materials may lower a build materials cost but raise time factors to complete the build. Logical variations may be calculated and assessed in an AVM 201 and optimal build steps may be generated and/or selected based upon a significance placed upon various benefits and consequences of a given variable value. Physical build measurements or Sensor data on physical build projects may also be used as input in an assessment of economic trade-offs.

The equipment deployed may incur a majority of a build cost depending upon user-defined target values. The AVM may model and present alternatives including one or more of: cost versus efficiency, quality 240, time to build, life expectancy, market valuation over time. A cost to build may be correlated with cost to deploy and eventual resale. An overall model of a Total Cost of Deployment 214 may include any or all such aspects and may also include external. In some examples, the nature of equipment trade-offs may be static, and estimations may be made from previous results. In some other examples, changes in technology, strategic changes in sourcing, times of acquisition, and the like may play into models of Total Cost of Deployment 214.

In some examples, an initial efficiency of design that incurs large costs at early stages of a project may have a dominant impact on Total Cost of Deployment 214 when time factors are weighted to real costs. In other examples, the ability of a Healthcare Facility to be flexible in its deployment or build order over time and to be changed in such flexible manners, where such changes are efficiently designed may dominate even if the initial cost aspects may be less efficient due to the need to design-in flexibility. As a Healthcare Facility is built, and as it is operated the nature of changing customer needs may create dynamic aspects to estimations of Total Cost of Deployment 214. Therefore, in some examples, estimates on the expected dynamic nature of demands on a Healthcare Facility may be modeled against the cost aspects of flexibility to model expectations of Total Cost of Deployment 214 given a level of change.

In some examples, factors that may be less dependent on extrinsic factors, such as product demand and the like may still be important metrics in Total Cost of Deployment 214. Included in the As Built factors may be calculations such as HVAC temperature load, in which personnel and seasonal weather implications may be important. AVM models may include a user interface to receive value useful in the AVM models. In addition, electronic monitoring, via Sensors that may determine energy consumption, includes for example monitoring any of: electricity, fuel oil, natural gas, propane and the like.

Temperatures may be monitored by thermocouples, semiconductor-junction-based devices or other such direct-measurement techniques. In other examples, temperature and heat flows may be estimated derived from photon-based measurement, such as surveying the Healthcare Facility with infrared imaging or the like.

Utility load may be monitored on a Healthcare Facility-wide basis and/or at point-of-use monitoring equipment located at hubs or individual pieces of equipment themselves. Flow meters may be inline, or external to, features such as pipes, wires, or conduits. Gas and liquid flows may be measured with physical flow measurements or sound-based measurement. In other examples, electricity may be monitored as direct current measurements or inferred-inductive current measurement.

In some examples, the nature and design of standard usage patterns of a Healthcare Facility and an associated environment may have relevance to Total Cost of Ownership. For example, usage that includes a larger number of ingress and egress will expose an HVAC system to increased load and usage that includes a significant number of waking hours with inhabitants in the building may incur increased usage of one or more of: equipment 211; building support devices 212; and utilities 234.

The nature and measurement aspects of vibration in the Healthcare Facility may also be modeled and designed as the Healthcare Facility is built. There may be numerous means to measure vibrations from capacitive- and resistive-based measurements to optical-based measurements that measure a subtle change in distance scale as a means of detecting vibration. Vibration may result from a Healthcare Facility being located proximate to a roadway, train, subway, airport, tidal flow, or other significant source of relatively consistent vibration. Vibration may also be more periodic, such as earthquake activity. In still another aspect, vibration may result from human traffic within the Healthcare Facility. The use of vibration-monitoring Sensors may indicate various activities that take place within the Healthcare Facility and facilitate more accurate modeling of a life expectancy of various aspects of the Healthcare Facility as well as machines located within the Healthcare Facility.

Noise levels are another type of vibrational measurement which is focused on transmission through the atmosphere of the Healthcare Facility. In some cases, noise may emanate from one location after moving through solid Healthcare Facility from its true source at another location. Thus, measurement of ambient sound with directional microphones or other microphonic sensing types may be used to elucidate the nature and location of noise emanations. In some cases, other study of the noise emanations may lead to establishment of vibrational measurement of different sources of noise. Floors, ceilings, doorways, countertops, windows, and other aspects of a Healthcare Facility may be monitored in order to quantify and extrapolate noise levels. Noise and vibrational measurement devices may be global and monitor a region of a Healthcare Facility, or they may be inherently incorporated into or upon individual equipment of the Healthcare Facility.

In some examples, models of a Healthcare Facility (including original models and As Built models) may include routings of pipes, wires, conduits and other features of a Healthcare Facility and the installed equipment that have Healthcare Facility. Together with models of the building Healthcare Facility and the equipment placed in the building the various routed Healthcare Facilities may be married in a detailed an AVM 201.

In another aspect, an AVM 201 may include conflicts between aspects included in the physical Healthcare Facilities may be detected and avoided in the design stage at far improved cost aspects. In some examples, a designer may virtually ascertain a nature of the conflict and alter a design in virtual space to optimize operational aspects. Additionally, in some embodiments, an As Built model may be generated during and after a Healthcare Facility is built for various purposes. In some examples, a technician may inspect a Healthcare Facility for conformance of the build to the designed model. In other examples, as an As Built Healthcare Facility is altered to deal with needed changes, changes will be captured and included in the As Built AVM 201.

In another aspect of the present invention, the AVM 201 may be used to generate a virtual reality model of a Healthcare Facility, including one or more Healthcare Facilities that may be displayed via user interface that includes an immersion of the user into a virtual setting. Immersion may be accomplished, for example, via use of a virtual reality headset with visual input other than a display screen is limited. In some embodiments, a virtual setting may be generated based upon a location of the user. For example, GPS coordinates may indicate a Healthcare Facility and a user may wear a headset that immerses the user in a virtual reality setting. The virtual reality setting may display one or more virtual models of Healthcare Facilities that may be potentially constructed on the Healthcare Facility.

Embodiments may include models generated using, for example, standard modeling software such as BIM 360™ field which may support the display of a Healthcare Facility design in a very complete level of detail. Modeling of a Healthcare Facility in its location or proposed location, or in multiple proposed locations, may be useful from a Total Cost of Ownership perspective, especially from an evaluation of the nature of a site layout including real estate Healthcare Facility parcel options and the like.

In some examples, a virtual display observed in the field at the site of an As Built or proposed build may allow for design changes and design evaluations to be viewed in a space before build is completed. For example, a Healthcare Facility may be completed to the extent that walls, floors, and ceilings are in place. A user may utilize a virtual display to understand the layout difference for different designs. Designs may be iterated from designs with the least flexibility to more flexible (yet more complex) designs.

In some examples, the design systems may include various types of features such as building Healthcare Facility, walls, ducts, utilities, pipes, lighting, and electrical equipment. The design systems are augmented with As Built Data and Experiential Data.

The design and modeling systems may be utilized to simulate and project cost spending profiles and budgeting aspects. The modeling systems may therefore be useful during the course of an audit, particularly when comparing actual versus projected spending profiles. The comparison of various spend sequencing may be used to optimize financing costs, maintenance, refurbishing and sequencing. The AVM 201 may be useful to provide early estimates and for cost tracking against projections. Such tracking may be visualized as displays across a virtual display of the building, facilities and equipment.

As described above, facing a Node (e.g., a Smart Device) towards an area in a Healthcare Facility and/or moving the mobile device in a particular pattern may be used to ascertain a specific area of the Healthcare Facility for which AVM 201 data should be accessed. A combination of one or more of: image, location, orientation, and other Sensors may also be used to identify to the mobile device specifically which wall segment, building aspect, machinery, or equipment the device is pointed towards. A location of smart device, a height, and an angle of view may also be utilized to determine aspects of the Healthcare Facility for which a virtual model is being requested.

In some embodiments, a user may be presented with various layers of data, including, for example, one or more of: structural aspects of the Healthcare Facility, plumbing, electrical, data runs, material specifications, or other documentation, including, but not limited to: basic identifying information, installation information, service records, safety manuals, process records, and expected service schedule, among many other possibilities.

An additional non-limiting example, data aggregation may include Sensors generating data that is associated with an IoT (Internet of Things)-based identification. Various IoT devices (or Sensors) may include a digital storage, processor, and transmitter for storing and conveying identifying information. Upon request, an IoT device may relay identifying information of itself to a human via a communications device, or to the IoT device's neighbors. It may also possibly convey information received from and/or sent to other internet connected devices as well.

As per the above listing, functionality may therefore include modeled and tracked Performance of a Healthcare Facility and equipment contained within the Healthcare Facility, including consumables 233 used and timing of receipt and processing of consumables; modeled and actual maintenance 232, including quality of maintenance performed; equipment Performance including yields; Consumables 233 tracking may include a frequency of replacement and quantity of replaced consumables; Utilities 234 tracking may include projected and actually units of energy consumed.

In one aspect of the present invention, data related to the position and identity of substantial elements of a Healthcare Facility first as designed and then recorded in their actual placement and installation. This may include locations of building features, such as beams, walls, electrical junctions, plumbing and etc. as the Healthcare Facility is designed and constructed. As part of the Healthcare Facility model, laser scanning may be performed on site at various disparate times during construction. An initial scan may provide general information relating to the location of the Healthcare Facility in relationship to elements on the Healthcare Facility such as roadways, utilizes such as electricity, water, gas, and sewer to identify non-limiting examples.

Additional events for scanning may occur during the construction process to capture accurate, three-dimensional As Built point-cloud information. Point cloud may include an array of points determined from image capture and/or laser scanning or other data collection technique of As Built features. In some examples, captured data may be converted into a 3D model, and saved within a cloud-based data platform.

In some examples other methods of capturing spatially accurate information may include the use of drones and optical scanning techniques which may include high-resolution imagery obtained from multiple viewpoints. Scanning may be performed with light-based methods such as a CCD camera. Other methods may include infrared, ultraviolet, acoustic, and magnetic and electric-field mapping techniques may be utilized.

Healthcare Facility-related information may include physical features generally associated with an exterior of a Healthcare Facility such as geolocation, elevation, surrounding trees and large landscaping features, underground utility locations (such as power, water, sewer, sprinkler system, and many other possible underground utility features), paving, and pool or patio areas. Healthcare Facility-related information may also include features generally related to a Healthcare Facility such as underground plumbing locations, stud locations, electrical conduit and wiring, vertical plumbing piping, and HVAC systems or other duct work. The acquisition of the data may allow the model system to accurately locate these interior and exterior features. Acquisition of As Built data during different points of the construction completion allows measurements to be taken prior to aspects involved in a measurement process being concealed by concrete, drywall or other various building materials.

Data is acquired that is descriptive of actual physical features as the features are built and converted into a 3D model which may be referred to as the "As Built" model. The As Built model will include key components of the Healthcare Facility and be provided with a level of artificial intelligence that fully describes the key component. In some embodiments, the As Built model may be compared to a design model. In some implementations, intelligent parameters are associated with key components within the 3D model. For example, key components and associated information may further be associated with intelligent parameters. Intelligent parameters for the key components may include the manufacturer, model number, features, options, operational parameters, whether or not an option is installed (and if so, its features and dimensions), any hardware associated with the key component (and its manufacturer and serial number), an owner's manual, and service contract information, as non-limiting examples. Intelligent parameters associated with a functional key component, such as HVAC Equipment, may include the manufacturer name, model number, capacity, efficiency rating, serial number, warranty start date, motor size, SEER rating, an owner's manual associated with the equipment, and service contract information.

In another aspect, the AVM system can autonomously and/or interactively obtain, store, and process data that is provided to it by Sensors located in, on or proximate to components of the Healthcare Facility, as the Healthcare Facility is built, or when additions are made to the Healthcare Facility. The generation, modeling, capture, use, and retention of data relating to Performances in specific equipment or in some cases, aspects relating to the design of a Healthcare Facility, may be monitored by the system.

A Healthcare Facility may be represented by a three-dimensional model, which may be integrated with information related to the key components and laser-scanned location information. This information may be made available to the Healthcare Facility owner/Healthcare Facility builder through a computer, an iPad or tablet, or Smart Device. The resulting system may be useful to support virtual maintenance support.

The three-dimensional model may support enhancement to the two-dimensional views that are typical of paper-based drawings. Although three-dimensional renderings are within the scope of information delivered in paper format, a three-dimensional electronic model may render dynamic views from a three-dimensional perspective. In some examples, the viewing may be performed with viewing apparatus that allows for a virtual reality viewing.

In some examples, a viewing apparatus, such as a smart tablet or a virtual reality headset, may include orienting features that allow a user such as a Healthcare Facility owner, Healthcare Facility builder, inspector, engineer, designer or the like to view aspects of a model based upon a location, a direction, a height and an angle of view. A current view may be supplemented with various other information relating to features presented in the view. In some examples, the interface may be accessible through a virtual reality headset, computer, or mobile device (such as an iPad, tablet, or phone), as non-limiting examples. Utilizing a device equipped with an accelerometer, such as a virtual reality headset or mobile device, as non-limiting examples, a viewable section of the model may be displayed through the viewing medium (whether on a screen, or through a viewing lens), where the viewer's perspective changes as the accelerometer equipped device moves, allowing them to change their view of the model. The viewer's Vantage Point may also be adjusted, through a certain user input method, or by physical movement of the user, as non-limiting examples.

The presented view may be supplemented with "hidden information", which may include for example, depictions of features that were scanned before walls were installed. This hidden information may include information about pipes, conduits, ductwork and the like. Locations of beams, headers, studs and building Healthcare Facility may be depicted. In some examples, depiction in a view may include a superposition of an engineering drawing with a designed location, in other examples images of an actual Healthcare Facility may be superimposed upon the image based upon As Built scans or other recordations.

In a dynamic sense, display may be used to support viewing of hypothetical conditions such as rerouted utilities, and rebuild walls and other such Healthcare Facility. In some examples, graphical- or text-based data may be superimposed over an image and be used to indicate specifications, Performance aspects, or other information not related to location, shape and size of features in the image.

As presented above, an image may allow for a user to "see through walls" as the augmented reality viewing device simulates a section of a model associated with a space displayed via the virtual reality viewing device. The viewer's perspective may change as an accelerometer in the virtual reality viewing device moves. A user may also change a view of the AVM to include different layers of data available in the AVM. The viewer's Vantage Point may also be adjusted by moving about a physical space that is represented by the model. To achieve this, it may be possible to incorporate positioning hardware directly into a building represented by the virtual model. The positioning hardware may interface with an augmented reality device for positioning data to accurately determine the viewing device's orientation and location with millimeter precision. The positioning hardware may include, for example, a radio transmitter associated with a reference position and height. Altitude is differentiated from height unless specifically referenced since the relative height is typically more important.

Accordingly, a user may access the AVM on site and hold up a Smart Device, such as an iPad or other tablet, and use the Smart Device to generate a view inside a wall in front of which the Smart Device is positioned, based upon the AVM and the location, height and direction of the Smart Device position.

In some examples, through the use of an augmented reality device, it may also be possible to view data, such as user manuals, etc. of associated devices in the view of a user, simply by looking at them in the viewing interface. In other examples, there may be interactive means to select what information is presented on the view.

Various electronic-based devices implementing of the present invention may also be viewed in a virtual reality environment without accelerometer such as a laptop or personal computer. A viewable section of a model may be displayed on a Graphical User Interface (GUI) and the viewer's Vantage Point may be adjusted, through a user input device.

The ability to track machinery and other components of a system and store the components associated information—such as, for example, user manuals, product specifications, and part numbers—may allow for much more efficient use and maintenance of the components included within a Healthcare Facility. Additionally, the system model may also maintain Healthcare Facility owner manuals and warranties and eliminate the need for storage and tracking of hard copy manuals.

In a non-limiting example, a user may access information related to a machinery a Smart Device acting as a Node within it in proximity to the machinery and accessing the parallel model in the Virtual Healthcare Facility. This access may occur such as by clicking on the machinery in the Virtual Healthcare Facility model or by scanning the Code label attached to machinery. In some examples, an IoT-accessible machine may have the ability to pair with a user's viewing screen and allow the system model to look up and display various information. Thus, the user may have access to various intelligent parameters associated with that machinery such as service records, a manual, service contract information, warranty information, consumables recommended for use such as detergents, installation-related information, power supply information, and the like.

In some examples, an AVM system may include interfaces of various kinds to components of the system. Sensors and other operational parameter-detection apparatus may provide a routine feedback of information to the model system. Therefore, by processing the data-stream with various algorithms autonomous characterization of operating condition may be made. Therefore, the AVM system may provide a user with alerts when anomalies in system Performance are recognized. In some examples, standard Healthcare Facility maintenance requirements may be sensed or tracked based on usage and/or time and either notification or in some cases scheduling of a service call may be made. In some examples, the alert may be sent via text, email, or both. The Healthcare Facility user may, accordingly, log back into the Virtual Healthcare Facility to indicate completion of a maintenance task. Additionally, if appropriate, a vendor of such service or maintenance may indicate a nature and completion of work performed.

By detecting operational status, a Virtual Healthcare Facility may take additional autonomous steps to support optimal operation of a system. A Virtual Healthcare Facility may take steps to order and facilitate shipping of anticipated parts needed for a scheduled maintenance ahead of a scheduled date for a maintenance event (for example, shipping a filter ahead of time so the filter arrives prior to the date it is scheduled to be changed). In another example, a Virtual Healthcare Facility may recall notes from an Original Equipment Manufacturer (OEM) that could be communicated to a user through the Virtual Healthcare Facility. In still further examples, a Virtual Healthcare Facility may support a user involved in a real estate transaction by quantifying service records and Performance of a real Healthcare Facility.

Benefits derived from monitoring and tracking maintenance with a Virtual Healthcare Facility may include positively reassuring and educating lenders and/or lien holders that their investment is being properly cared for. In addition, insurance companies may use access to a Virtual Healthcare Facility to provide factual support that their risk is properly managed. In some examples, a data record in a Virtual Healthcare Facility model system and how an owner has cared for their Healthcare Facility may be used by insurance companies or lenders to ensure that good care is being taken. Maintenance records demonstrating defined criteria may allow insurance companies to offer a Healthcare Facility owner policy discount. Such criteria may include, for example, installation of an alarm system. Additionally, access to a Virtual Healthcare Facility may allow municipalities and utilities to use the information for accurate metering of utility usage without having to manually check a meter. In the aggregate across multiple Healthcare Facilities, peaks in utility demand may then be more accurately anticipated.

In some examples, a Virtual Healthcare Facility may also be used to assist with Healthcare Facility improvement projects of various types. In some examples, the Healthcare Facility improvement projects may include support for building larger additions and modifications, implementing landscaping projects. Smaller projects may also be assisted, including in a non-limiting example such a project as hanging a picture, which may be made safer and easier with the 3D "as-built" point cloud information. Hidden water piping, electrical conduits, wiring, and the like may be located, or virtually "uncovered", based on the model database.

During construction of a Healthcare Facility corresponding to a Virtual Healthcare Facility, discrete features of the As Built Healthcare Facility may be identified via an identification device such as an IoT device or a QR code label. The ID device may be integrated to the feature or added during the build scope. Performance monitors may also be simultaneously installed to allow monitoring of Key Performance Indicators (KPIs) for selected features. In an example, an HVAC system may be added to a Healthcare Facility during construction and a simultaneously a Performance monitor may be added to the HVAC system. The Performance monitor may be used to monitor various KPIs for an HVAC system. These KPIs may include outdoor air temperature, discharge air temperature, discharge air volume, electrical current, and the like. Similar monitoring capabilities may be installed to all machinery and utilities systems in a Healthcare Facility. The combination of these numerous system monitors may allow for a fuller picture of the efficiency of operations of various systems.

Use of the Virtual Healthcare Facility, which may include data values contributed from communication of data from the various monitoring systems, may allow owners to receive periodic reports, such as in a non-limiting sense monthly emails which may show their current total energy consumption as well as a breakdown of what key components are contributing to the current total energy consumption.

The systems presented herein may be used by owners and Healthcare Facility managers to make decisions that may improve the cost effectiveness of the system. An additional service for Owners may allow the Healthcare Facility owner to tap into energy-saving options as their Healthcare Facility ages. As an example, if a more efficient HVAC system comes on the market, which may include perhaps a new technology Node, the user may receive a "Savings Alert". Such an alert may provide an estimated energy savings of the recommended modification along with an estimate of the cost of the new system. These estimates may be used to generate a report to the owner of an estimated associated return-on-investment or estimated payback period should the Healthcare Facility owner elect to replace their HVAC system.

In some examples, an AVM of a Virtual Healthcare Facility may set a threshold value for the required ROI above which they may be interested in receiving such an alert with that ROI is achieved. This information will be based on data derived from actual operating conditions and actual historical usage as well as current industry information. Predictive maintenance and energy savings to key systems via Smart Healthcare Facility Total Cost of Ownership ("TCO") branded Sensors.

With the ability to collect and utilize relevant Healthcare Facility information with the model system, the aggregation of data and efficiency experience from numerous systems may allow for analysis of optimization schemes for various devices, machinery and other Healthcare Facility components that includes real installed location experience. Analysis from the aggregated data may be used to provide feedback to equipment manufacturers, building materials fabricators and such suppliers.

Figure 3A:
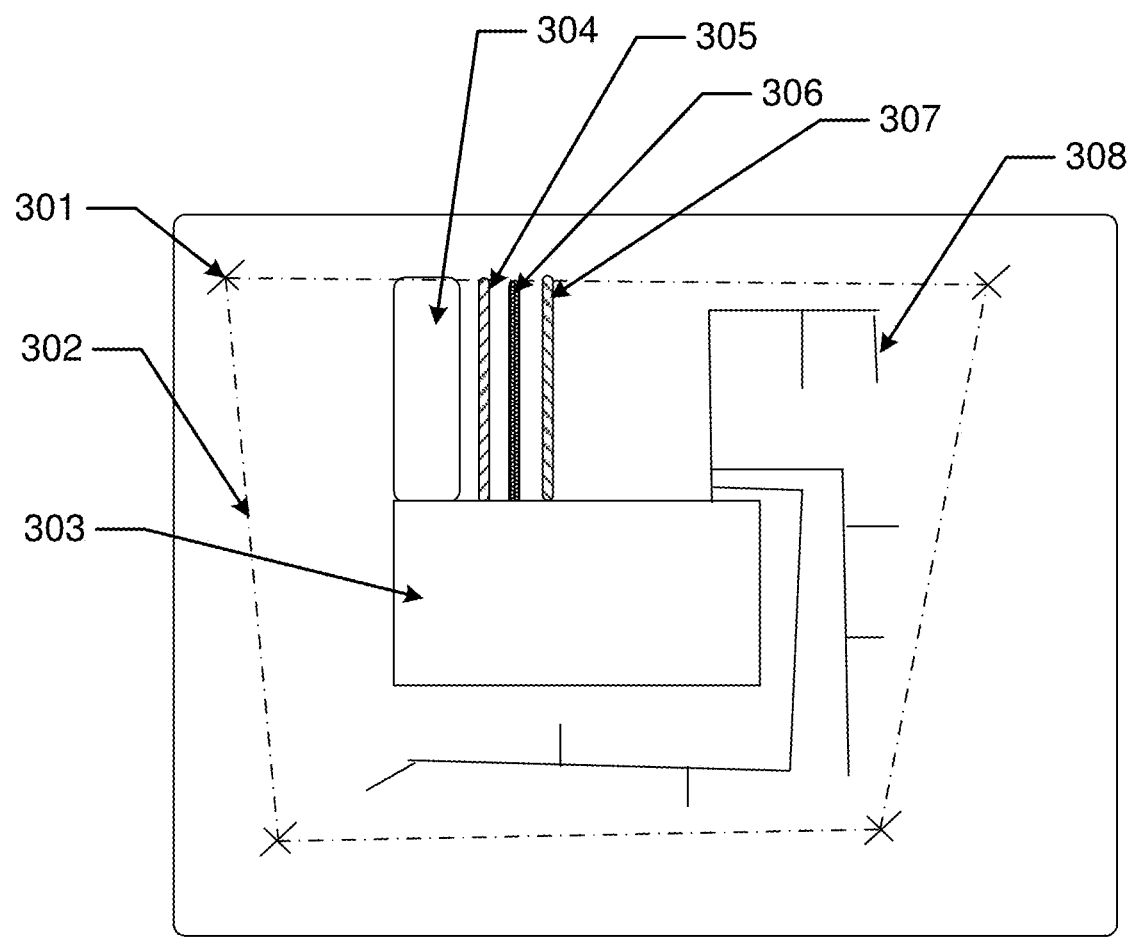
FIGS. 3A-3D illustrate exemplary aspects of collecting and displaying data generated within a Healthcare Facility.

Referring to FIGS. 3A-3D, an illustration of the collection of data by scanning a Healthcare Facility during its construction is provided. In FIG. 3A, a depiction of a site for building a Healthcare Facility is illustrated. The depiction may represent an image that may be seen from above the site. Indications of Healthcare Facility boundaries such as corners 301 and Healthcare Facility borders 302 are represented and may be determined based on site scanning with Healthcare Facility markings from site surveys or may be entered based on global coordinates for the Healthcare Facility lines. An excavated location 303 may be marked out. Roadways, parking and/or loading areas 304 may be located. Buried utilities such as buried telephone 305, buried electric 306, buried water and sewer 307 are located in the model as illustrated. In some examples, such other site service as a buried sprinkler system 308 may also be located.

Figure 3B:
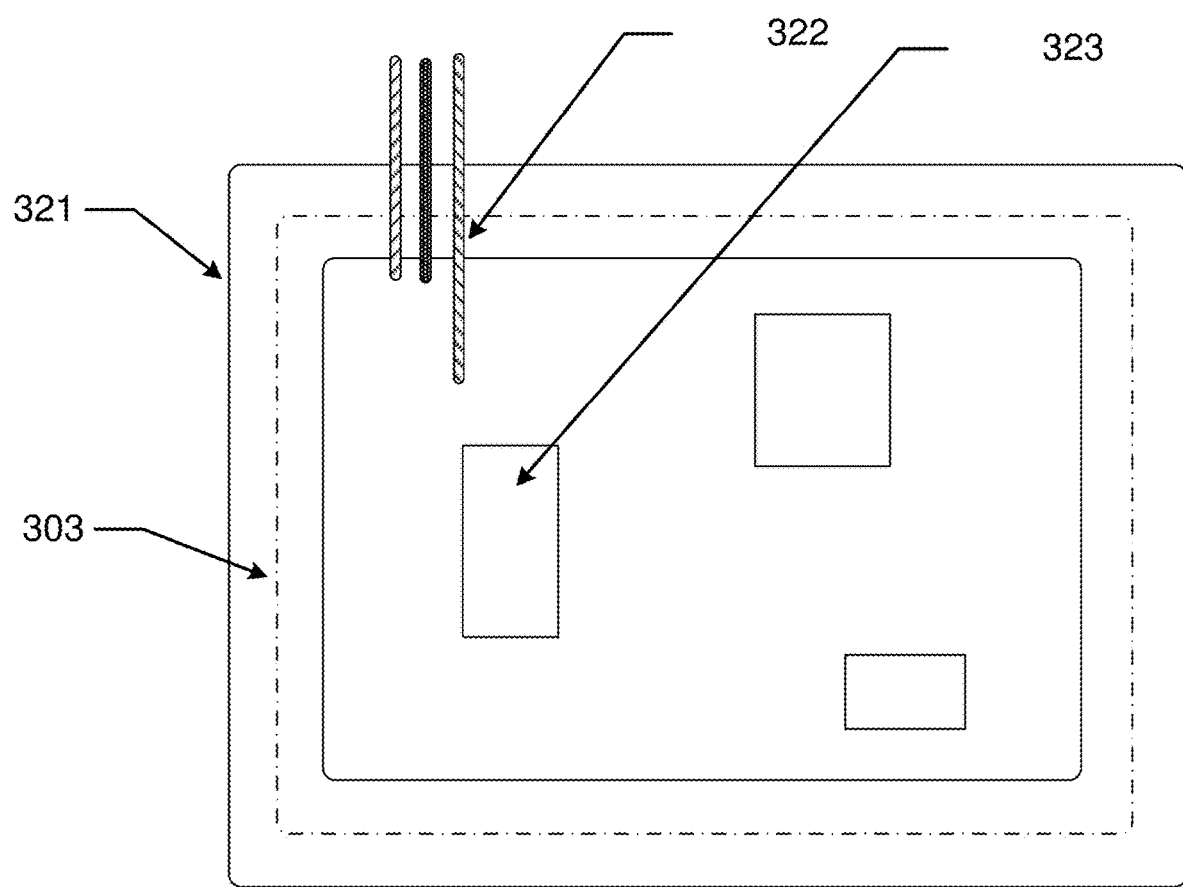

Referring to FIG. 3B, the excavated location 303 may be scanned or imaged to determine the location of foundation elements. In some non-limiting examples, a foundational footing 321 along with buried utilities 322 is illustrated. The buried utilities may include utilities such as electric lines, water supply (whether from a utility or a well on-location), sewer or septic system lines, and telecommunications lines such as telephone, cable and internet. Other footing elements 323 may be located at structural requiring locations as they are built. In some examples, a scanning system may provide the locational orientation relative to site-orientation markings. In other examples, aerial imagery such as may be obtained with a drone may be used to convert features to accurate location imagery.

Figure 3C:
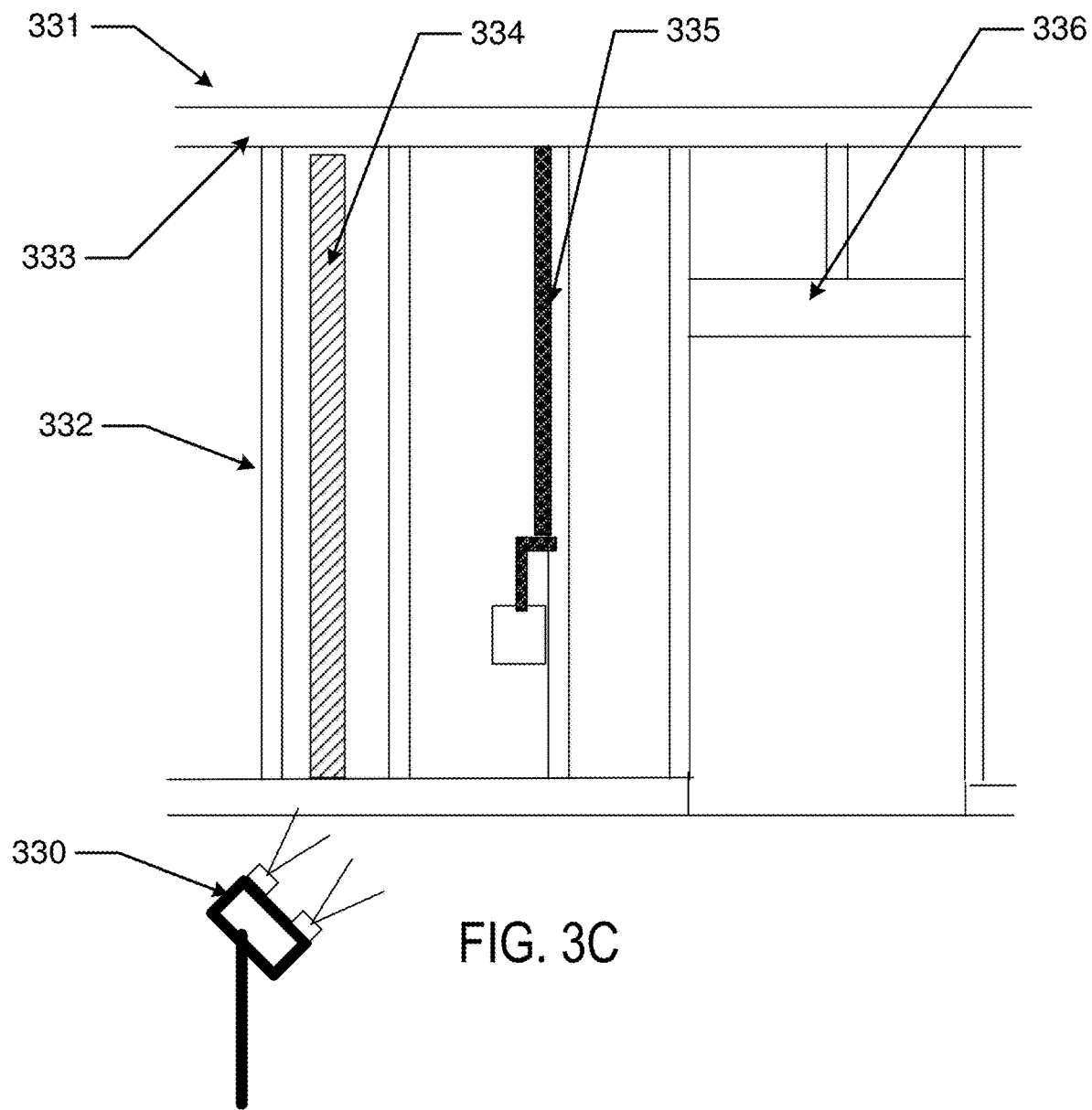

Referring to FIG. 3C, a wall 331 of the Healthcare Facility in the process of build is illustrated. The Healthcare Facility may be scanned by a scanning element 330. In some examples, a laser three dimensional Scanner may be used. The wall may have supporting features like top plates 333, headers 336, studs 332, as well as internal items such as pipes 334, electrical conduits 335, and wires. There may be numerous other types of features within walls that may be scanned as they occur such as air ducts, data cables, video cables, telephone cables, and the like.

Figure 3D:
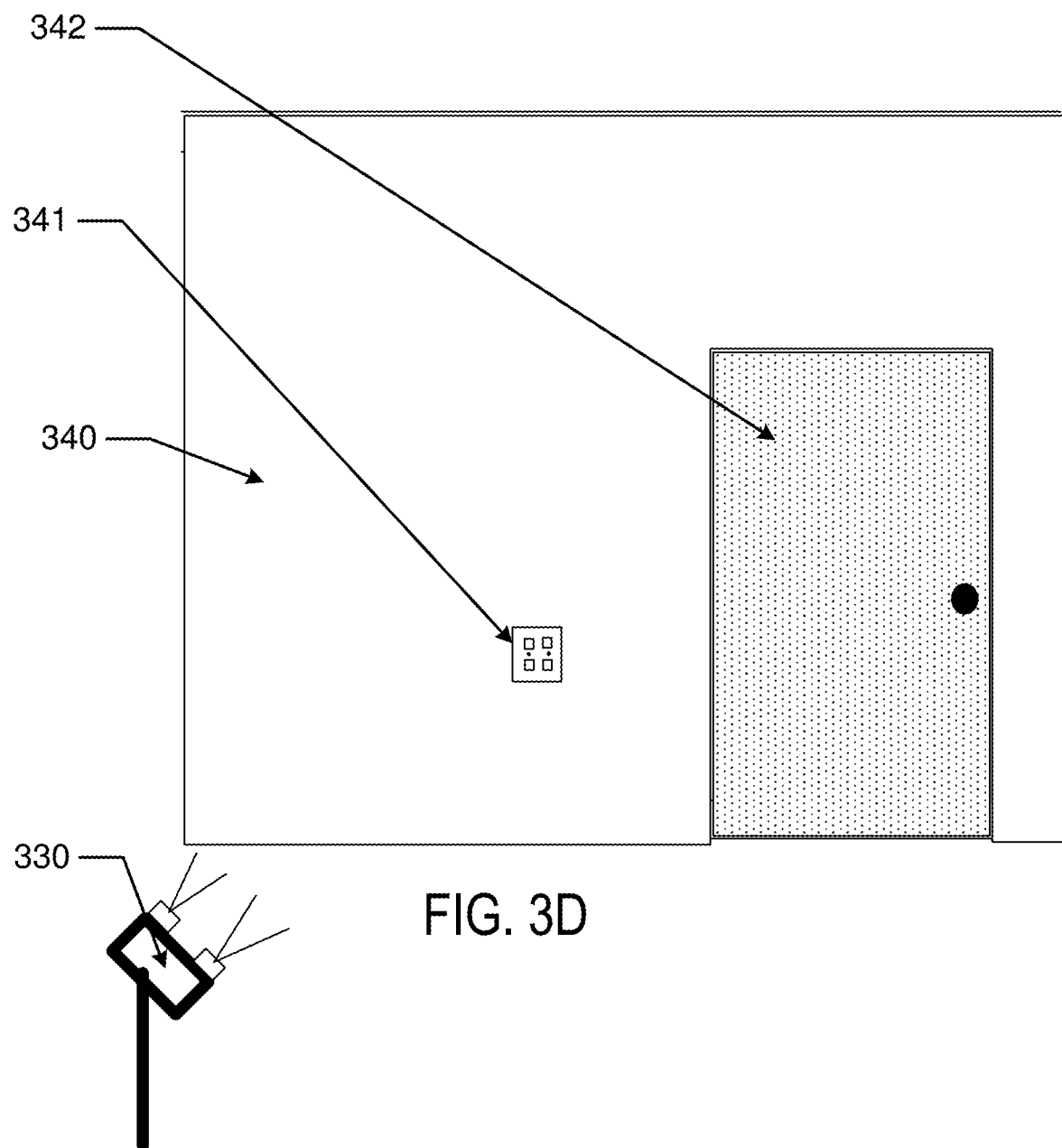

Referring to FIG. 3D, the wall may be completed with Healthcare Facility components behind wall facing 340 may no longer be visible. Electrical outlets 341 and door Healthcare Facilities 342 may be scanned by a scanning element 330.

Figure 3E:
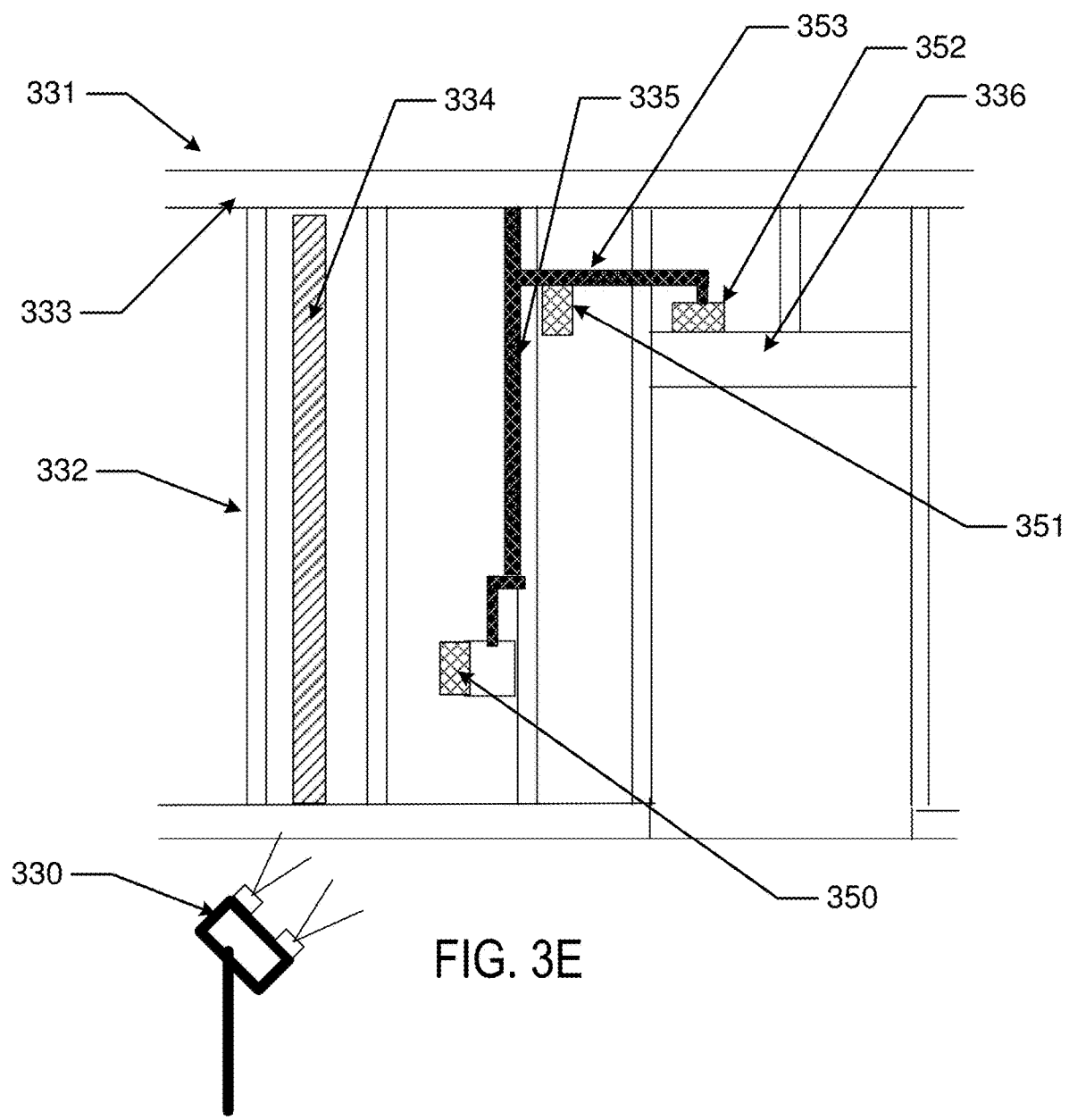
FIG. 3E illustrates the installation of wireless Nodes in a Healthcare Facility.

Referring to FIG. 3E, a wireless Node may be fixedly attached to a position in or proximate to a Healthcare Facility. In some embodiments, attachment may be accomplished during construction and/or retrofitting of a structure, in which case the functionality described herein may be made operational to track Agents, materials, equipment, and the like during a construction phase, and also track a location of materials and equipment included in the structure. Nodes may be installed as Reference Point Transceivers or be attached to items that dynamically change positions, such as, by way of non-limiting example one or more of: Agents, building materials, structural components, electrical components, plumbing components, equipment, machines and architectural aspects (e.g., a corner, an arch, an extremity, and the like).

In some non-limiting examples of a wireless Node, a Bluetooth communications hub compatible with a standard such as, for example BLE5.1, Bluetooth Low Energy, or Wi-Fi RTT may be fixedly attached to a structural component, such as a door header 336 as Node 350 acting as a Reference Point Transceiver. In another example, a Node 351 may act as a Reference Point Transceiver and be attached to a wall stud, preferentially one that has electrical conduit 335 running along it. In some embodiments, the electrical conduit 335 may supply power to the Node 351. Alternatively, a Node 352 may be configured as part of a receptacle box. In some examples, one or more Nodes 350-351 may be battery powered. One or more Nodes 350-351 may be powered via electrical supply wiring 353 from a nearby power conduit 335 so that the Node 350-351 may be tied into a centrally powered electrical system. Moreover, the Nodes may be adapted to de-power and de-couple from a network based on a power supply status or a power drain change.

Figure 3F:
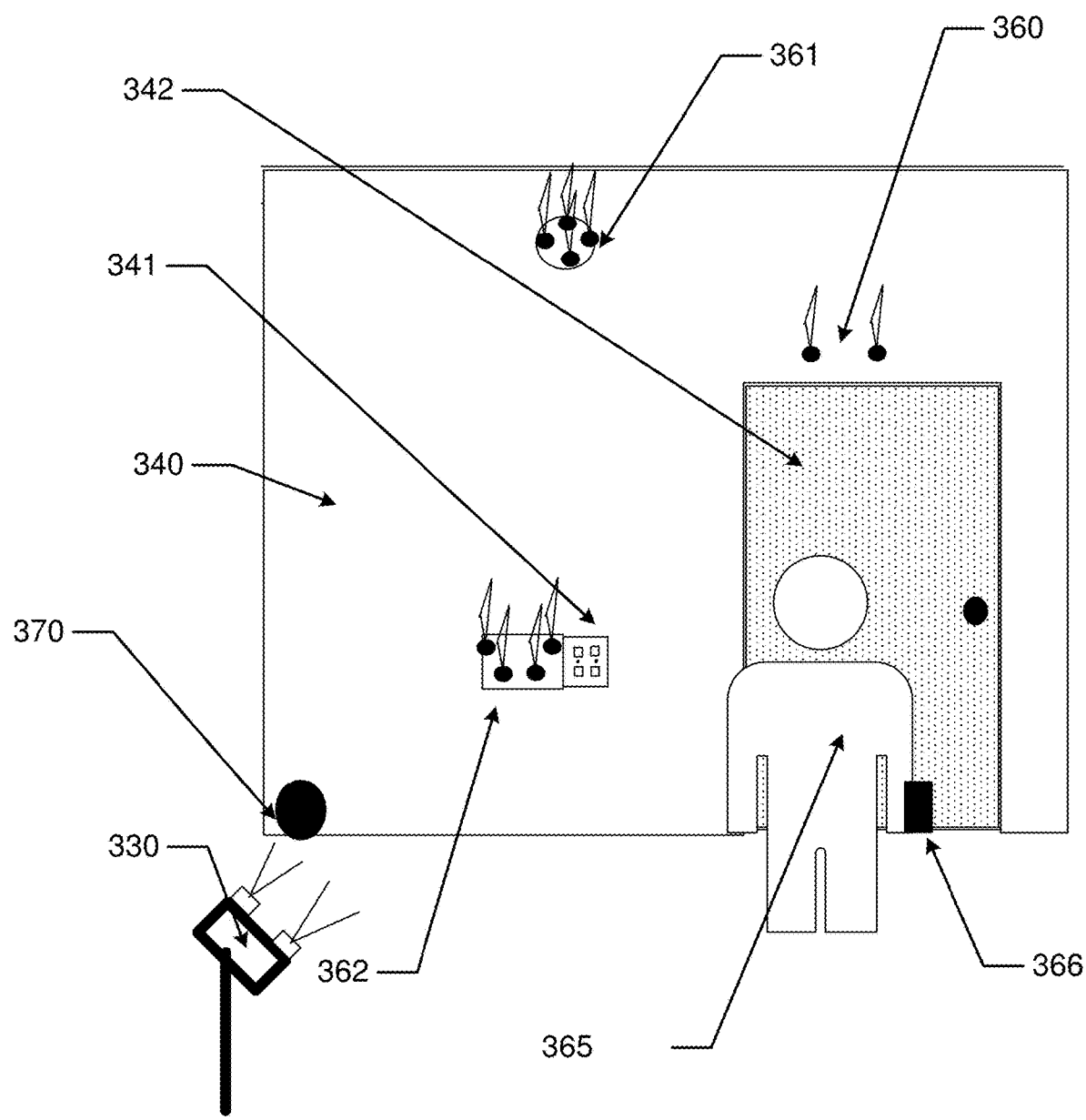
FIG. 3F illustrates an example of deployed wireless Nodes interacting with an Agent in proximity to a door.

FIG. 3F illustrates an exemplary Agent 365 supporting a Smart Device 366 with wireless communications components enabling RF communications such as, one or more of: Cellular, Wi-Fi, Bluetooth, Zigbee, and other wireless capabilities. The Smart Device 366 may also include devices capable of receiving and/or transmitting with infrared capabilities. The Smart Device 366 may also include, or be in logical communication with, transducers capable of emitting sound, and in some examples, infrasound and/or ultrasonic sound, as well as microphones capable of detecting ultrasonic sound and/or infrasound. An Agent 365 may become positioned proximate to a door Healthcare Facility 342 such that the Agent 365 supported Smart Device 366 may wirelessly communicate with a Node 362 fixedly attached to the Healthcare Facility 342. The Node 362 may be in electrical communication with one or more of: a set of protruding antennas 360, an antenna array device 361 (which may include a multitude of antennas separated at distances efficient for communication and/or location determination). A wireless Node 362 with antennas may be located proximate to a typical wall outlet Healthcare Facility. Any of these Nodes 360-362 may communicate with the Smart device for location protocols such as RSSI, Time of Flight, and Angle of Arrival as non-limiting examples. The Nodes 360-362 may have a carefully measured distance characterization for each of the antennas that they employ and one of the antennas involved in wireless communication may be further characterized as being a local or global origin point (0,0,0 in Cartesian notation). In other examples, none of the antenna locations may be located at a local or global origin point, but rather a known offset from a specified origin point 370 may be characterized for each of the hub antenna locations.

The Agent 365 may proceed through a threshold of the door Healthcare Facility 342 and be located on the other side. Nodes 360-362 may each protrude from both sides of a wall and/or may have a second set of antennas located on a distal side of the wall. In other examples, materials used in wall construction may be configured to provide minimal interference with wireless signals travelling through the wall materials. For configurations with a second set of antennas, as the user passes through the door, a communication between the Smart Device 366 and the Node 360-362 may transfer from antennas protruding on a proximate wall side to antennas protruding on a distal wall side.

A geographic position of a Healthcare Facility may be calculated via wireless communications, such as those using sub-GHz wavelengths, GPS, or other longer range wavelength a Smart Device from within the Healthcare Facility. The geographic position may be used to indicate a Healthcare Facility identification. A position within the Healthcare Facility may be determined based upon one or more of: an angle of arrival and angle of departure of a wireless signal and one or more timing signals used to determine a distance of the Smart Device from: a) a Node acting as Reference Point Transceiver; or b) a dynamic position Node.

In some embodiments, an angle of departure or an angle of arrival are not necessary and a position may be determined by measuring a distance to three or more positioning reference devices. However, in some embodiments, it may still be useful to compute an angle between the positioning reference devices and/or the Node.

Additional aspects that may be referenced to determine a location of a Node or Smart Device accurately may include one or more of: relative signal strength received from wireless transmissions emanating from another Nodes; time of arrival of radio signals of wireless transmissions emanating from another Node; generating a distance to another Node based upon a time difference of arrival of radio signals of wireless transmissions emanating from another Node; or an angle of arrival and/or angle of departure of a wireless transmission from another Node.

The above steps may be repeated for multiple Nodes of various types, including both reference point transceiver Nodes and dynamic position Nodes.

As mentioned above, in some embodiments, wireless communications may include a quantification of a condition within or proximate to a Healthcare Facility. The condition may include, for example, one or more of: a vibration measured with an accelerometer; a temperature of at least a portion of the Healthcare Facility; an electrical current measurement to equipment installed in the Healthcare Facility, a number of cycles of operation of equipment installed in the Healthcare Facility; a number of cycles of operation of an machinery installed in the Healthcare Facility; an electrical current measurement to an electrical device located within the Healthcare Facility; a vibration or other sensor measurement associated with movement of an Agent or person within the Healthcare Facility; or presence of water and/or humidity within the Healthcare Facility.

A vibration pattern may be associated with a specific occupant, and tracking the movement of the specific occupant through the Healthcare Facility may be based upon measured vibration patterns. Similarly, a vibration pattern may be associated with a particular activity of a specific occupant and the activity of the specific occupant may be tracked within the Healthcare Facility based upon measured vibration patterns.

Figure 4:
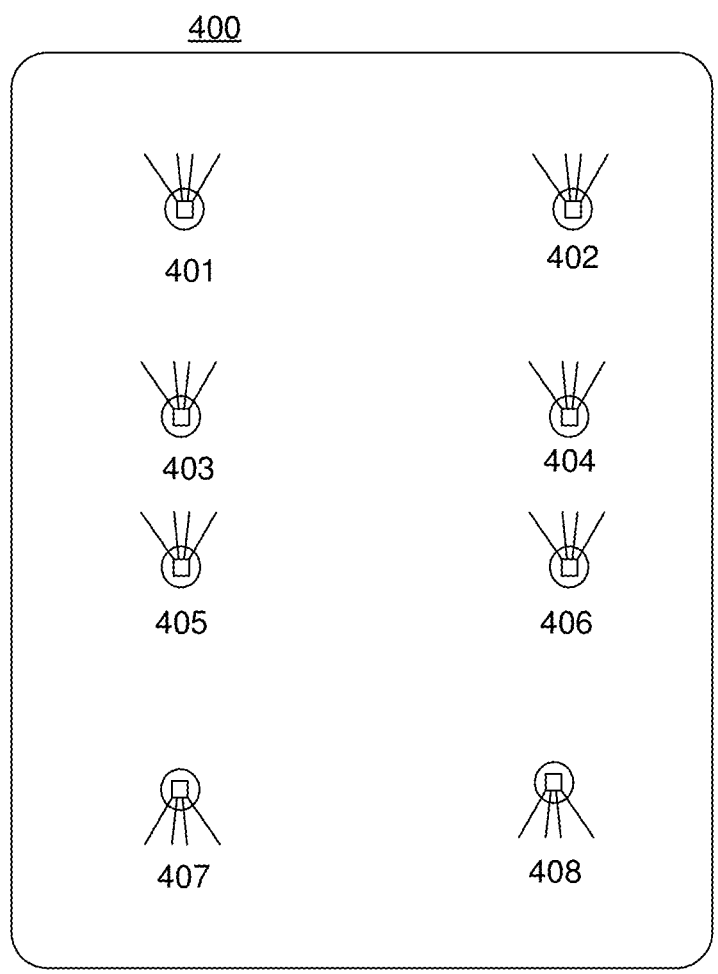
FIG. 4 illustrates a Node with wireless Transceivers useful for location determination and data transceiving.

Referring now to FIG. 4, according to the present invention, an Agent 400 may support a Node with one or more Transceivers. The Transceivers may include one or more of: a Multi-modality Transceiver 401; Transceivers having a same modality 402; Transceivers of different modalities 403; transmitters of a single modality 404; transmitters of multiple modalities 405; receivers of a single modality 406; and receivers of multiple modalities 407. Similarly, a Node deployed as a Reference Point Transceiver may include multiple Transceivers, transmitters, and receivers 401-408. The multiple Transceivers, transmitters, and receivers 401-408 may include one or both of: transmitters and receivers of a same modality; and transmitters and receivers of different modalities.

A modality, as used in conjunction with a Transceiver, transmitter, and/or receiver refers to one or both of a bandwidth of wireless communication and a protocol associated with a bandwidth. By way of non-limiting example, a modality, as used in relation to a Transceiver, transmitter, and/or receiver may include: Wi-Fi; Wi-Fi RTT; Bluetooth; UWB; Ultrasonic; sonic; infrared; or other logical communication medium.

Figure 5:
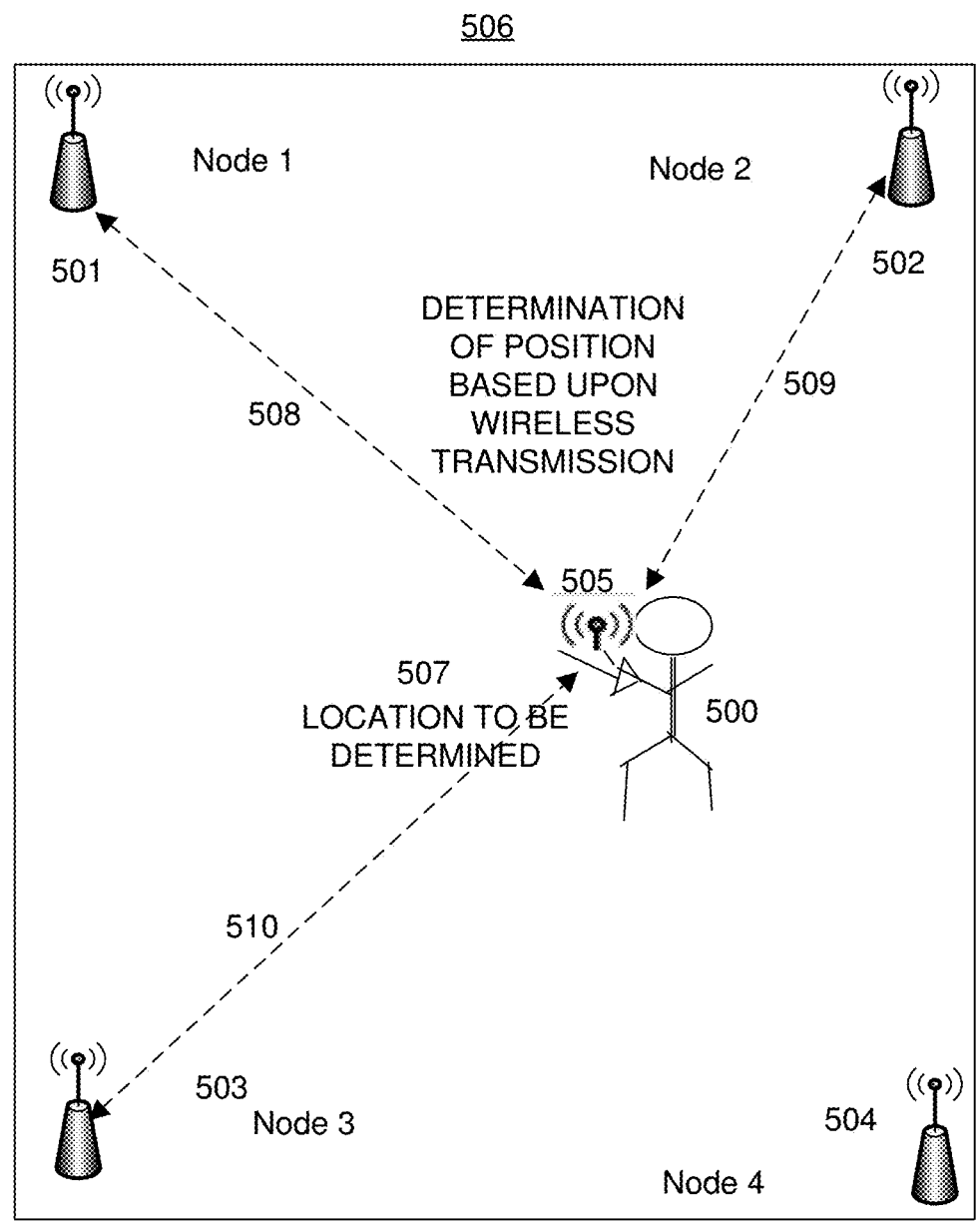
FIG. 5 illustrates Reference Point Transceivers useful for location determination and data transceiving.

FIG. 5 illustrates Nodes with Reference Point Transceivers 501-504 that may be deployed in a defined area 506, such as a Healthcare Facility to determine a location 507 of an Agent 500 supporting a Node 505. Nodes with Reference Point Transceivers 501-504 may be fixed in a location and wirelessly communicate in a manner suitable for determination a position of the Node Transceiver 505 supported by the Agent 500. Transceiving may be via wireless transmission using one or more bandwidths and communication protocols by a Node Transceiver 505 supported by the Agent 500.

By way of non-limiting example, Node Transceivers 505 supported by the Agent 500 may be included in, or be in logical communication with, a Smart Device, such as a smart phone, tablet or other Agent-supportable device, such as a headgear, ring, watch, wand, pointer with Node Transceivers 505 able to Transceive with the Reference Point Transceivers 501-504. The Reference Point Transceivers 501-504 may include devices, such as, for example, a radio transmitter, radio receiver, a light generator, or an image recognizable device. A radio transmitter may include a router or other Wi-Fi, Bluetooth or other communication device for entering into logical communication with a controller. In some embodiments, Reference Point Transceivers 501-504 may include a Wi-Fi router that additionally provides access to a distributed network, such as the Internet. Cartesian Coordinates, Polar Coordinates, Vector values, a GPS position, or other data that may be utilized for one or more of: locating one or both of an Agent 500; indicating a direction of interest; and identifying a Healthcare Facility or defined area 506.

A precise location may be determined based upon wireless transmissions between Nodes. Timing determinations—as well as angle of arrival, angle of departure, transmission strength, transmission noise, and transmission interruptions—may be considered in generating relative positions of Nodes. Additional considerations may include AI and unstructured queries of transmissions between Nodes and triangulation logic based upon a measured distance from three or more Reference Point Nodes 501-504. For example, a radio transmission or light emission may be measured and timing associated with the radio transmission or light to determine a distance between Nodes. Distances from three reference position identifiers 501-503 may be used to generate a position of a Node in consideration. Other methodologies include determination of a distance from one or more Nodes and a respective angle of arrival and/or angle of departure of a radio or light transmission between the Node in consideration and another Node (Reference Point Node or dynamic position Node).

Other embodiments may include a device recognizable via image analysis and a camera or other Image Capture Device, such as a CCD device, may capture an image of three or more Reference Point Nodes 501-504. Image analysis may recognize the identification of each of three or more of the Reference Point Transceivers 501-504 and a size ratio of the respective image captured Reference Point Transceivers 501-504 may be utilized to calculate a precise position. Similarly, a height designation may be made via triangulation using the position identifiers as reference to a known height or a reference height.

Triangulation essentially includes determining an intersection of three distances 508-510, each distance 508-510 calculated from a reference point 501-504 to node transceiver 505 on an Agent-supported device. The present invention allows for a first distance 508 to be determined based upon a wireless communication in a first modality; and a second distance 509 and a third distance 510 determined based upon a wireless communication in a same or different modality as the first modality. For example, a first distance 508 may be determined based upon a wireless communication using Wi-Fi; a second distance 509 may be determined based upon a wireless communication using Bluetooth; and a third communication may be determined based upon a wireless communication using ultrasonic communication (other combinations of same and/or different communication modalities are also within the scope of the present invention).

Figure 6:
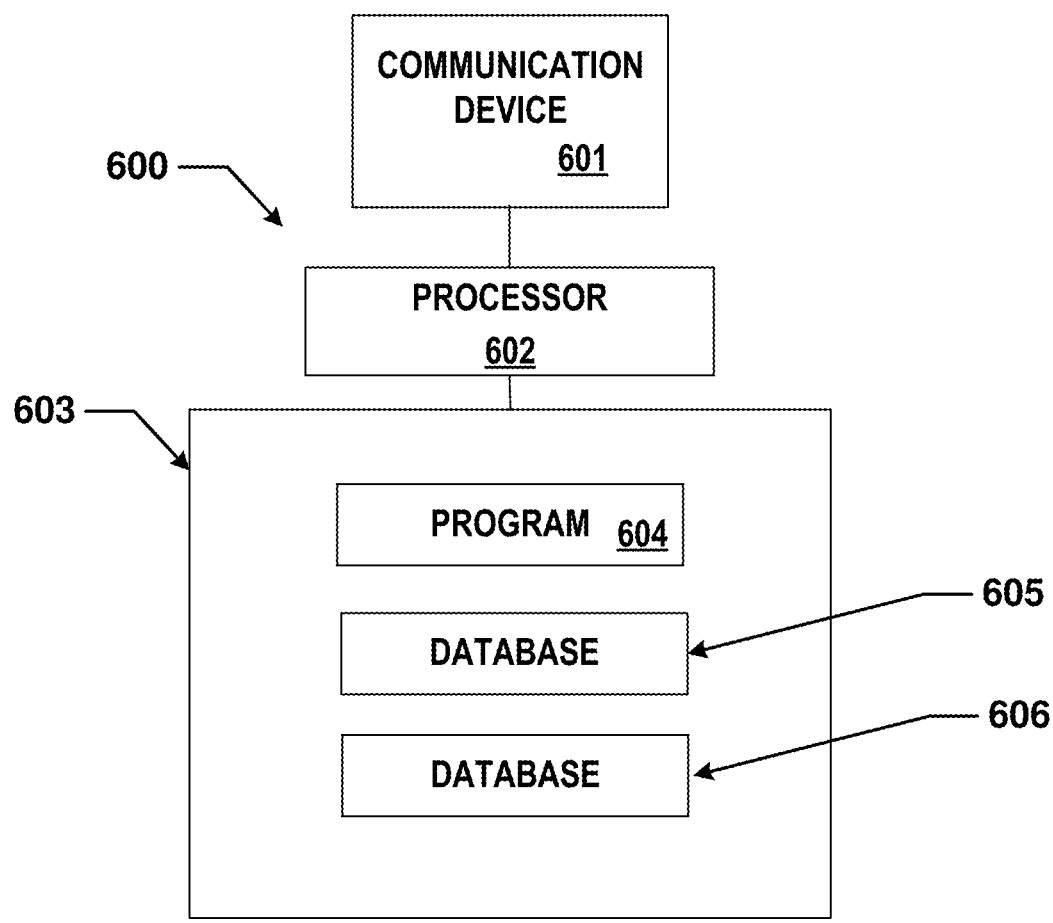
FIG. 6 illustrates apparatus that may be used to implement aspects of the present invention including executable software.

Referring now to FIG. 6, an automated controller is illustrated that may be used to implement various aspects of the present invention in various embodiments, and for various aspects of the present invention. Controller 600 may be included in one or more of: a wireless tablet or handheld smart device, a server, an integrated circuit incorporated into a Node, appliance, equipment item, machinery or other automation. The controller 600 includes a processor unit 602, such as one or more semiconductor based processors, coupled to a communication device 601 configured to communicate via a communication network (not shown in FIG. 6). The communication device 601 may be used to communicate, for example, with one or more online devices, such as a smart device, a Node, personal computer, laptop, or a handheld device.

The processor 602 is also in communication with a storage device 603. The storage device 603 may comprise any appropriate information storage device, including combinations of digital storage devices (e.g., an SSD), optical storage devices, and/or semiconductor memory devices such as Random Access Memory (RAM) devices and Read Only Memory (ROM) devices.

The storage device 603 can store a software program 604 with executable logic for controlling the processor 602. The processor 602 performs instructions of the software program 604, and thereby operates in accordance with the present invention. The processor 602 may also cause the communication device 601 to transmit information, including, in some instances, timing transmissions, digital data and control commands to operate apparatus to implement the processes described above. The storage device 603 can additionally store related data in a database 605 and database 606, as needed.

Figure 6A:
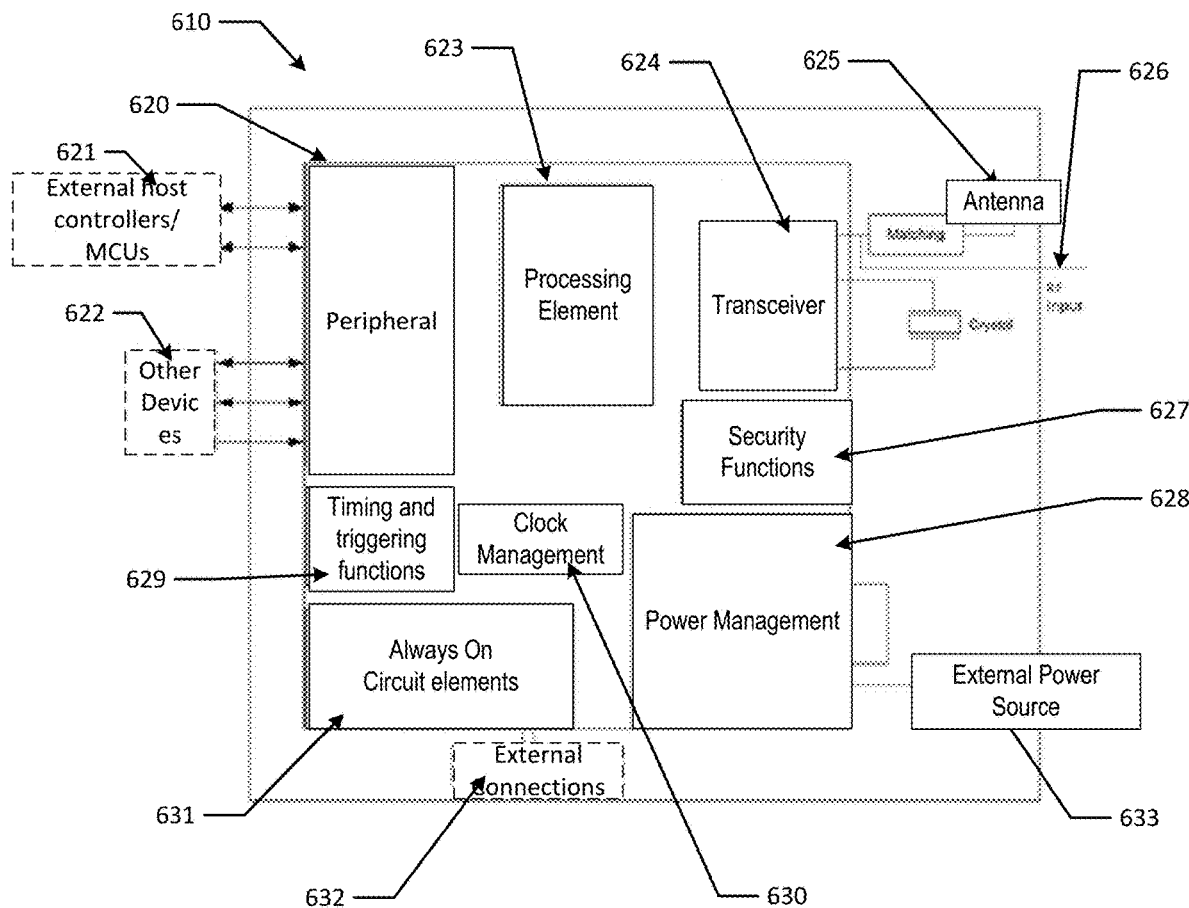
FIG. 6A illustrates an exemplary block diagram of a controller with angle of arrival and angle of departure functionality.

Referring now to FIG. 6A, an illustration of an exemplary transceiver module 610 configured with a transceiver 624 to wirelessly communicate via one or more wireless communication Modalities, including a bandwidth and protocol, such as the Bluetooth 5.1; BLE5.1; Wi-Fi RT and/or GPS standard is illustrated. As discussed, many different Modalities of wireless technology may be utilized with the content presented herein, but a BLE5.1 "radio" module is an interesting example since its standards provide for angle of arrival (AoA) capability as well as angle of departure (AoD) and a distance determination based upon a timing signal. With AoA/AoD a designed antenna array 625 can be used by an RF Transceiver 624 to measure a phase shift amongst multiple antenna elements to estimate distance differences between the antennas and to extract an angle from the antenna array to the source of radiation. A BLE5.1-consistent multichip transceiver 624 may include circuitry and software code to perform the acquisition of data and determine the angle of arrival in some examples. In other examples, a BLE5.1-consistent multichip transceiver 624 may control the acquisition of data from an antenna array while streaming the data to off module processing capabilities. The BLE5.1-consistent Node 610 may contain functional blocks of circuitry for peripheral 620 control. The peripherals may include a connection to external host controllers/MCUs 621. The peripheral 620 control may also interact with peripheral and IoT Sensors and other devices 622.

The BLE5.1-consistent transceiver module 610 may include a processing element 623 which may have its own memory of different types as well as capabilities for encryption of data. The BLE5.1 consistent transceiver module 610 may also have Transceiver 624. This circuitry may include Baseband and RF functions as well as control the AoA functions and the self-verifying array functions. The Bluetooth communications elements in a transceiver 624 may receive signals through an on-module antenna 625 or an external antenna or array of antennas may provide external RF input 626. The BLE5.1-consistent Node 610 may include functional circuitry blocks for control of Security functions 627, cryptogenerations, random number generation and the like. The BLE5.1-consistent Node 610 may include functional blocks for power management 628.

The BLE5.1-consistent Node 610A may be operative for quantification of temperature aspects of the Node 610A, battery-control functions and power-conversion functions. An external power source 633 may be included to provide electrical energy to a power management unit 628 which, in some examples. may be from a battery unit, or a grid connected power supply source in other examples. The BLE5.1-consistent Node 610 may include functions for control of timing and triggering 629. In a related sense, the BLE5.1-consistent Node 610 may include functions for clock management 630 within the module. The BLE5.1-consistent Node 610 may also include circuit elements that are always-on 631 to allow external connections 632 to interact with the device and perhaps awake it from a dormant state. There may also be other customized and/or generic functions that are included in a BLE5.1-consistent Node 610 and/or multichip module.

Figure 6B:
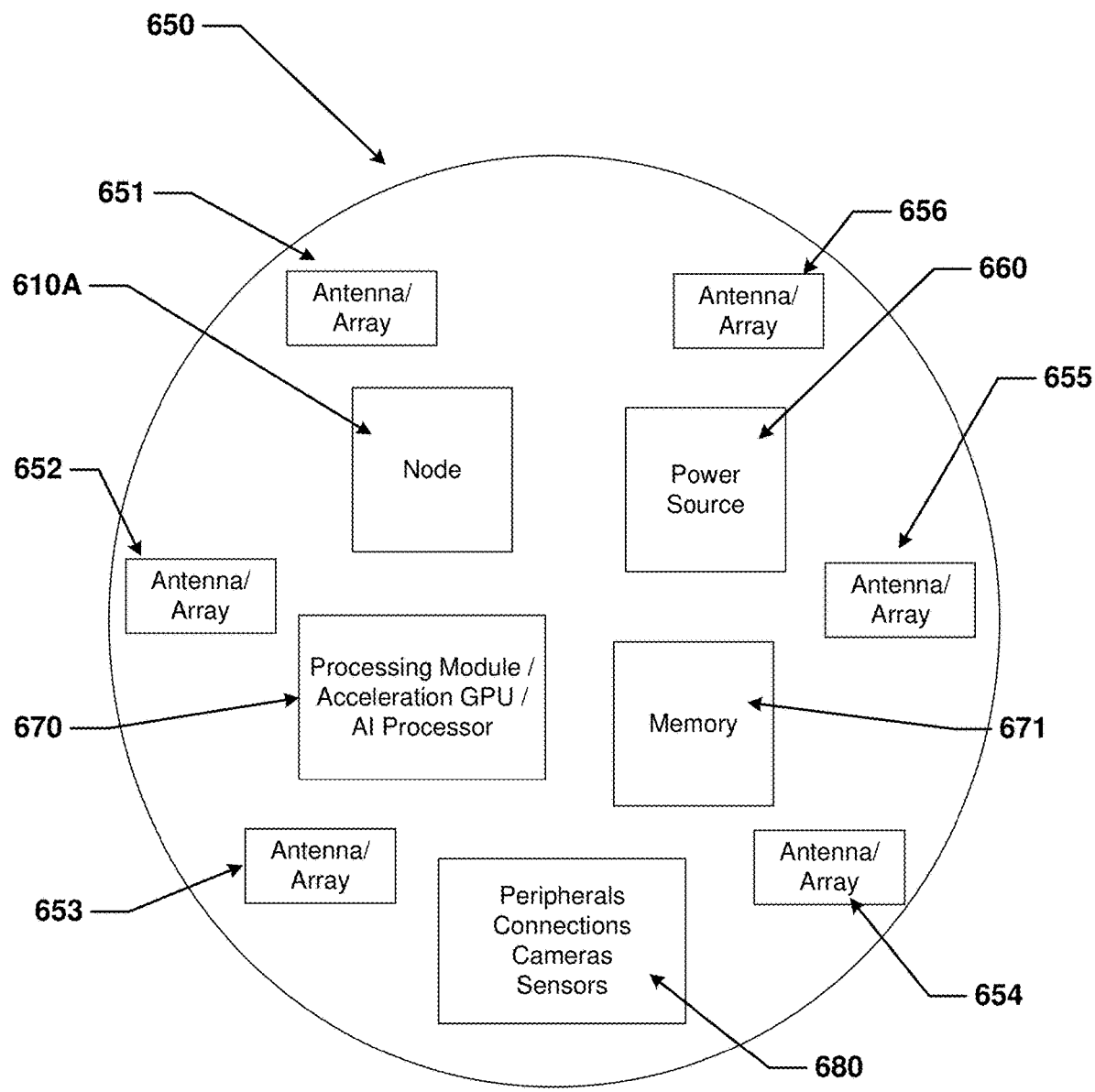
FIG. 6B illustrates exemplary block diagram of an assembly with multiple antenna arrays such as a "puck"

Referring now to FIG. 6B, a Node 610A included in a higher order deployment assembly is illustrated. A deployment Node 650 may be in logical communication with one or more of: sensors, customized control commands, antenna array designs and the like.

A Node 650 may include multiple antennas or antenna arrays 651-656. As described previously, the Node 650 may include a transceiver module 610, and in some examples, the transceiver module may include Bluetooth-adherent aspects. Communications received via an antenna 651-656 may be directly ported into the transceiver module 610. Embodiments may also include routing particular antenna/antenna array outputs to the transceiver module 610 in a controlled and timed sequence. A processing Module 670 may coordinate a connection of the Node 650 to external peripherals.

In some examples, circuitry 680 to logically communicate with one or more of: a Peripheral, a data Connection, Cameras and Sensors controllers, and components to perform data and image acquisition of various kinds, or it may interface external components with the Node 650.

The Node 650 may also include its own power management unit 660 which may take connected power or battery power or both and use it to prove the various power needs of the components of the assembly. The Node 650 may have its own processing modules 670 or collections of different types of processing functions which may have dedicated memory components 671. In some examples, specialized processing chips of various kinds such as Graphical Processing Units and fast mathematics function calculators as well as dedicated artificial intelligence processing chips may be included to allow the Node 650 to perform various computational functions including location determination of wirelessly connected devices amongst other functions. There may be numerous other functions to include in a Node 650 and alternative types of devices to perform the functions presented herein.

Figure 6C:
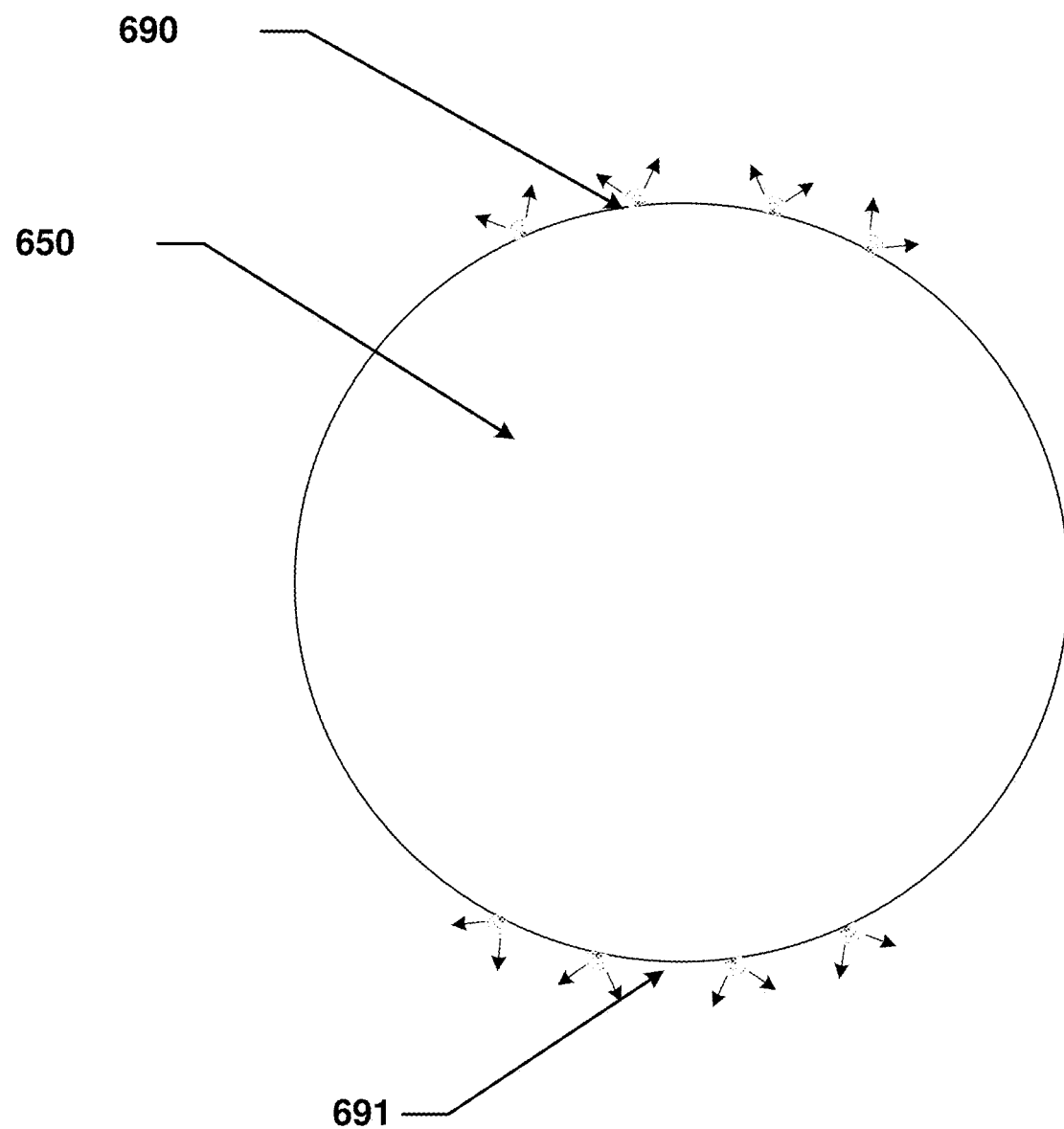
FIG. 6C illustrates another view of a puck with directional antenna arrays.

In some examples as illustrated in FIG. 6C antenna arrays 690, 691 may be assembled into a "Puck" shown as Node 650 wherein the antenna arrays are configured with antenna designs which have directional aspects to them. Directional aspects may mean that the antennas may be sensitive to incident radiation coming from a certain direction but not sensitive to radiation coming from a different direction. Antenna arrays 690, 691 may include antennas that may have maximized signals for a particular incident waveform, the identification of which antenna may provide or supplement angle of incidence calculations.

A directional antenna may include, for example, an antenna with RF shielding over some portion of an antenna's circumference. For example, 270° (or some other subset of a 360° circumference of an antenna), or an antenna array may have RF shielding to block and/or reflect back an RF signal towards the antenna-receiving portion. Other directional antennas may include a shield blocking less than 360° of RF transmissions that rotates around a receiving portion of an antenna and only receives RF communications from a direction of an opening in the shield. Shielded antennas may provide improved determination of a direction from which a wireless transmission is being received from, since RF noise is blocked from a significant portion of a reception sphere.

Figure 7:
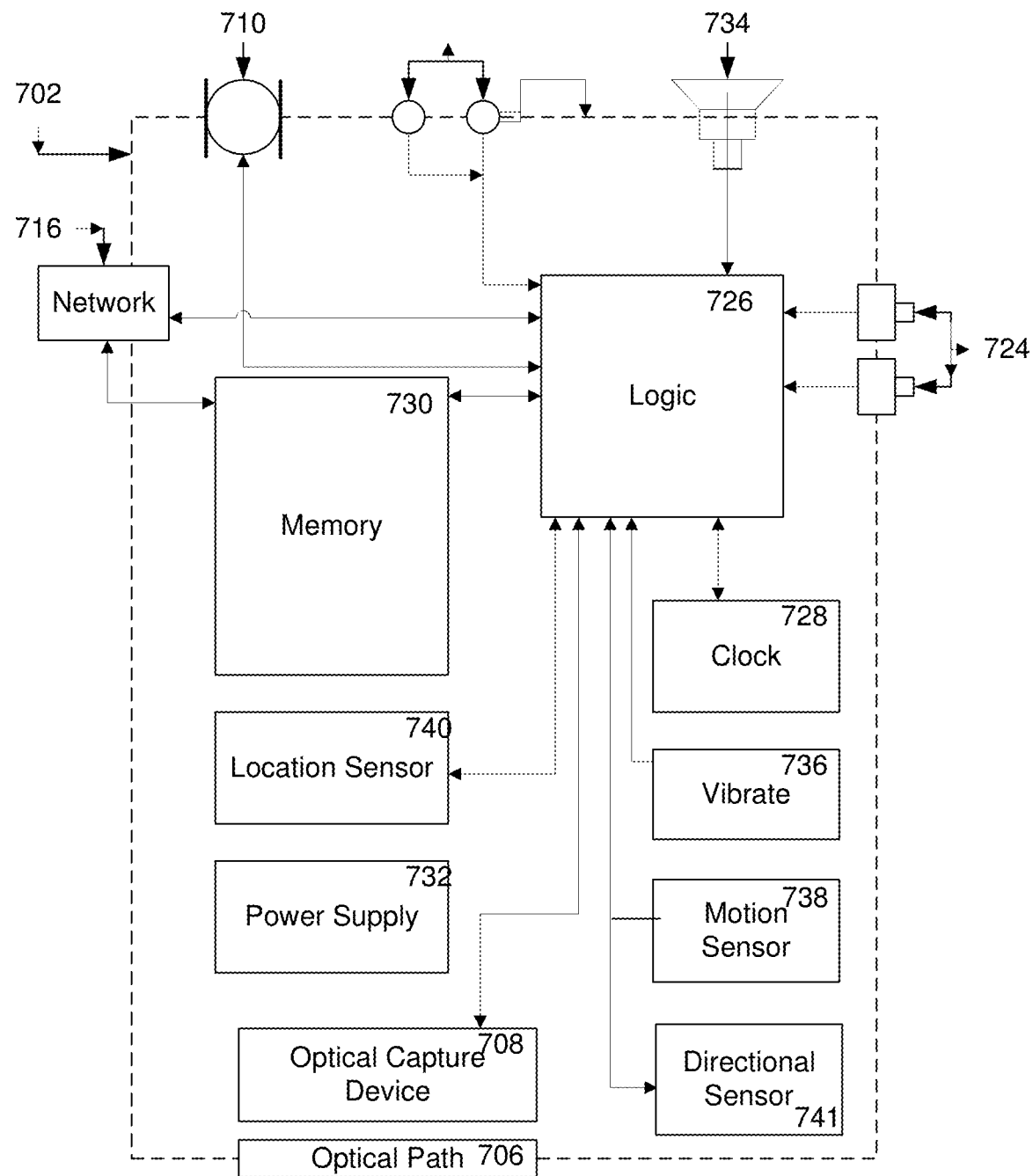
FIG. 7 illustrates an exemplary mobile Smart Device that may be used to implement aspects of the present invention including executable software.

Referring now to FIG. 7, a block diagram of an exemplary mobile device 702 is illustrated. The mobile device 702 comprises an optical capture device 708 to capture an image and convert it to machine-compatible data, and an optical path 706, typically a lens, an aperture or an image conduit to convey the image from the rendered document to the optical capture device 708. The optical capture device 708 may incorporate a CCD, a Complementary Metal Oxide Semiconductor (CMOS) imaging device, or an optical Sensor 724 of another type.

A microphone 710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 734 may come from a loudspeaker or other audio transducer. Tactile feedback may come from a vibrate module 736.

A motion Sensor 738 and associated circuitry convert the motion of the mobile device 702 into machine-compatible signals. The motion Sensor 738 may comprise an accelerometer that may be used to sense measurable physical acceleration, orientation, vibration, and other movements. In some embodiments, motion Sensor 738 may include a gyroscope or other device to sense different motions.

A location Sensor 740 and associated circuitry may be used to determine the location of the device. The location Sensor 740 may detect Global Position System (GPS) radio signals from satellites or may also use assisted GPS where the mobile device may use a cellular network to decrease the time necessary to determine location. In some embodiments, the location Sensor 740 may use radio waves to determine the distance from known radio sources such as cellular towers to determine the location of the mobile device 702. In some embodiments these radio signals may be used in addition to GPS.

The mobile device 702 comprises logic 726 to interact with the various other components, possibly processing the received signals into different formats and/or interpretations. Logic 726 may be operable to read and write data and program instructions stored in associated storage or memory 730 such as RAM, ROM, flash, or other suitable memory. It may read a time signal from the clock unit 728. In some embodiments, the mobile device 702 may have an on-board power supply 732. In other embodiments, the mobile device 702 may be powered from a tethered connection to another device, such as a Universal Serial Bus (USB) connection.

The mobile device 702 also includes a network interface 716 to communicate data to a network and/or an associated computing device. Network interface 716 may provide two-way data communication. For example, network interface 716 may operate according to the internet protocol. As another example, network interface 716 may be a local area network (LAN) card allowing a data communication connection to a compatible LAN. As another example, network interface 716 may be a cellular antenna and associated circuitry which may allow the mobile device to communicate over standard wireless data communication networks. In some implementations, network interface 716 may include a Universal Serial Bus (USB) to supply power or transmit data. In some embodiments other wireless links may also be implemented.

As an example of one use of mobile device 702, a reader may scan some coded information from a location marker in a Healthcare Facility with the mobile device 702. The coded information may be included on apparatus such as a hash code, bar code, RFID or other data storage device. In some embodiments, the scan may include a bit-mapped image via the optical capture device 708. Logic 726 causes the bit-mapped image to be stored in memory 730 with an associated time-stamp read from the clock unit 728. Logic 726 may also perform optical character recognition (OCR) or other post-scan processing on the bit-mapped image to convert it to text. Logic 726 may optionally extract a signature from the image, for example by performing a convolution-like process to locate repeating occurrences of characters, symbols or objects, and determine the distance or number of other characters, symbols, or objects between these repeated elements. The reader may then upload the bit-mapped image (or text or other signature, if post-scan processing has been performed by logic 726) to an associated computer via network interface 716.

As an example of another use of mobile device 702, a reader may capture some text from an article as an audio file by using microphone 710 as an acoustic capture port. Logic 726 causes audio file to be stored in memory 730. Logic 726 may also perform voice recognition or other post-scan processing on the audio file to convert it to text. As above, the reader may then upload the audio file (or text produced by post-scan processing performed by logic 726) to an associated computer via network interface 716.

A directional Sensor 741 may also be incorporated into the mobile device 702. The directional Sensor may be a compass and produce data based upon a magnetic reading or based upon network settings. A direction al sensor may also include a light source and receptor, such as an infrared distance device. The infrared distance device may be used to provide highly accurate distance determination from a selected surface.

Figure 8:
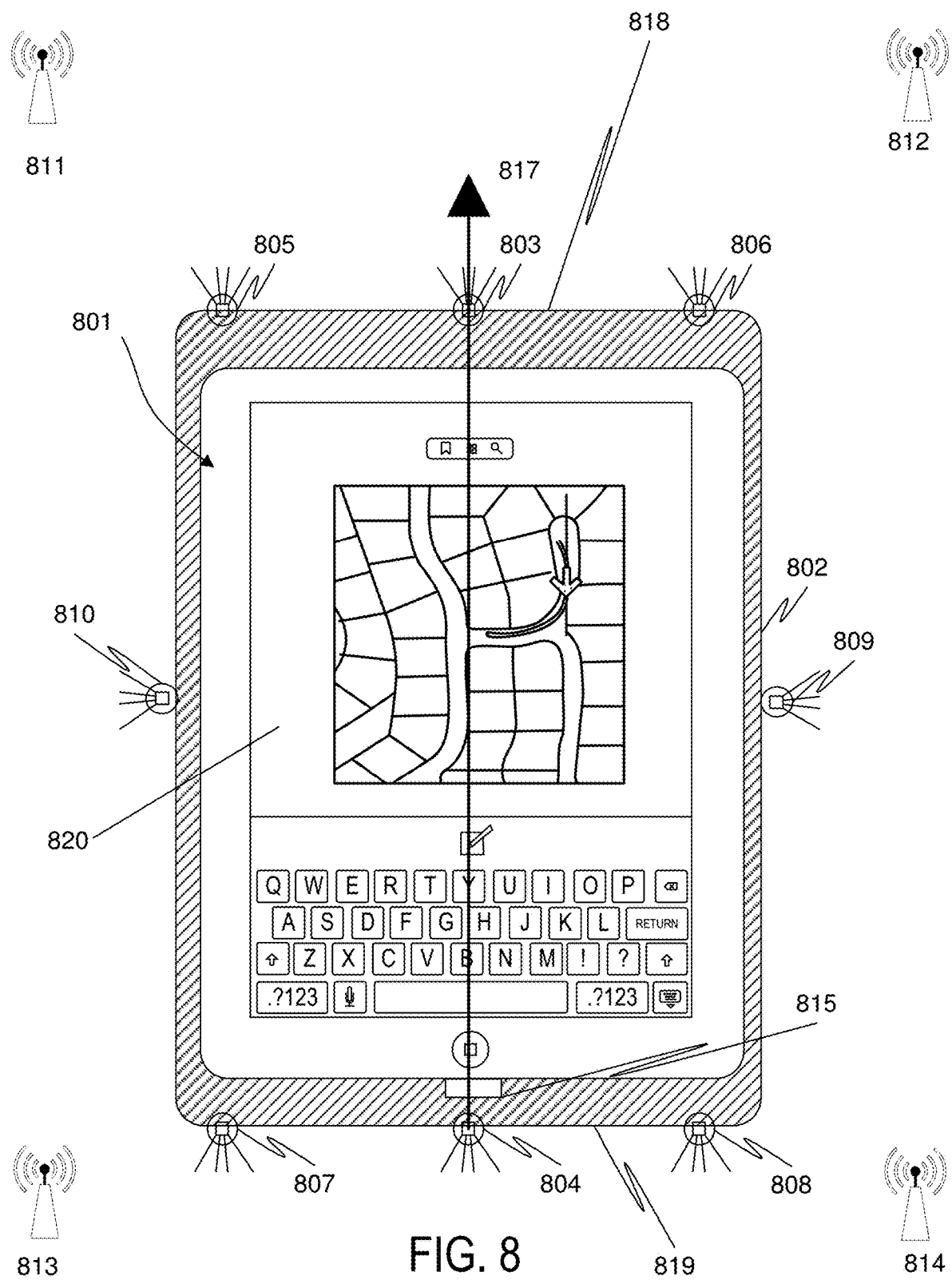
FIGS. 8, 8A-8D illustrate a device and Vectors according to various embodiments of the present invention.

Referring now to FIG. 8, additional apparatus and methods for determining a geospatial location and determination of a direction of interest may include one or both of an enhanced Smart Device and a Smart Device in logical communication with wireless position devices 803-810. The importance of geospatial location and determination of a direction of interest is discussed in considerable detail above. As illustrated, a Smart Device 801 may be in logical communication with one or more wireless position devices 803-810 strategically located in relation to the physical dimensions of the Smart Device. For example, the Smart Device 801 may include a smart phone or tablet device with a user interface surface 820 that is generally planar. The user interface surface 820 will include a forward edge 818 and a trailing edge 819.

In some preferred embodiments, the Smart Device will be fixedly attached to a smart receptacle 802. The smart receptacle 802 may include an appearance of a passive case, such as the type typically used to protect the Smart Device 801 from a damaging impact. However, according to the present invention, the smart receptacle 802 will include digital and/or analog logical components, such as wireless position devices 803-810. The wireless position devices 803-810 include circuitry capable of receiving wireless transmissions from multiple wireless positional reference Transceivers 811-814. The wireless transmissions will include one or both of analog and digital data suitable for calculating a distance from each respective reference point 811-814.

In some embodiments, the smart receptacle 802 will include a connector 815 for creating an electrical path for carrying one or both of electrical power and logic signals between the Smart Device 801 and the smart receptacle 802. For example, the connector 815 may include a mini-USB connector or a lightening connector. Additional embodiments may include an inductive coil arrangement for transferring power.

Embodiments may also include wireless transmitters and receivers to provide logical communication between the wireless position devices 803-810 and the Smart Device 801. Logical communication may be accomplished, for example, via one or more of: Bluetooth, ANT, and infrared media.

Reference Transceivers 811-814 provide wireless transmissions of data that may be received by wireless position devices 803-810. The wireless transmissions are utilized to generate a position of the respective wireless position devices 803-810 in relation to the reference Transceivers 811-814 providing the wireless transmissions to the wireless position devices 803-810. The wireless position devices 803-810 are associated with one or more of: a position in a virtual model; a geographic position; a geospatial position in a defined area, such as Healthcare Facility; and a geospatial position within a defined area (such as, for example a Healthcare Facility).

According to the present invention, a Smart Device may be placed into a case, such as a smart receptacle 802 that includes two or more wireless position devices 803-810. The wireless position devices 803-810 may include, for example, one or both of: a receiver and a transmitter, in logical communication with an antenna configured to communicate with reference Transceivers 811-814. Communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

The wireless position devices 803-810 may be located strategically in the case of a smart receptacle 802 to provide intuitive direction to a user holding the case of a smart receptacle 802, and also to provide a most accurate determination of direction. Accordingly, a forward wireless position device 803 may be placed at a top of a Smart Device case and a rearward Node 804 may be placed at a bottom of a Smart Device case. Some embodiments each of four corners of a case may include a wireless position devices 805, 806, 807, 808. Still other embodiments may include a wireless position device 809 and 810 on each lateral side.

The present invention provides for determination of a location of two or more wireless positioning devices 803-810 and generation of one or more directional Vectors 817 and/or Rays based upon the relative position of the wireless positioning devices 803-810. For the sake of convenience in this specification, discussion of a Vector that does not include specific limitations as to a length of the Vector and is primarily concerned with a direction, a Ray of unlimited length may also be utilized. In some embodiments, multiple directional Vectors 817 are generated and a direction of one or more edges, such as a forward edge, is determined based upon the multiple directional Vectors 817.

According to the present invention, a geospatial location relative to one or more known reference points is generated. The geospatial location in space may be referred to as having an X,Y position indicating a planar designation (e.g., a position on a flat floor), and a Z position (e.g., a level within a Healthcare Facility, such as a second floor) may be generated based upon indicators of distance from reference points. Indicators of distance may include a comparison of timing signals received from wireless references. A geospatial location may be generated relative to the reference points. In some embodiments, a geospatial location with reference to a larger geographic area is associated with the reference points, however, in many embodiments, the controller will generate a geospatial location relative to the reference point(s) and it is not relevant where the position is located in relation to a greater geospatial area.

In some embodiments, a position of a Smart Device may be ascertained via one or more of: triangulation; trilateration; and multilateration (MLT) techniques.

A geospatial location based upon triangulation may be generated based upon a controller receiving a measurement of angles between the position and known points at either end of a fixed baseline. A point of a geospatial location may be determined based upon generation of a triangle with one known side and two known angles.

A geospatial location based upon trilateration may be generated based upon a controller receiving wireless indicators of distance and geometry of geometric shapes, such as circles, spheres, triangles and the like.

A geospatial location based upon multilateration may be generated based on a controller receiving a measurement of a difference in distance to two reference positions, each reference position being associated with a known location. Wireless signals may be available at one or more of: periodically, within determined timespans, and continually. The determination of the difference in distance between two reference positions provides multiple potential locations at the determined distance. A controller may be used to generate a plot of potential locations. In some embodiments, the potential determinations generally form a curve. Specific embodiments will generate a hyperbolic curve.

The controller may be programmed to execute code to locate an exact position along a generated curve, which is used to generate a geospatial location. The multilateration thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In combination with, or in place of directional movement of a Smart Device 801 in order to quantify a direction of interest to a user, some embodiments may include an electronic and/or magnetic Directional Indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, and data storage medium, Image Capture Device, such as a Charge Coupled Device ("CCD") capture device and/or an infrared capture device being available in a handheld or unmanned vehicle or other Agent.

An unmanned vehicle may include for example, an unmanned aerial vehicle ("UAV") or an unmanned ground vehicle ("UGV"), such as a unit with wheels or tracks for mobility. A radio control unit may be used to transmit control signals to a UAV and/or a UGV. A radio control unit may also receive wireless communications from the unmanned vehicle.

In some embodiments, multiple unmanned vehicles may capture data in a synchronized fashion to add depth to the image capture and/or a three dimensional and 4 dimensional (over time) aspect to the captured data. In some implementations, a UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into an AVM.

In still other embodiments, captured data may be compared to a library of stored data using recognition software to ascertain and/or affirm a specific location, elevation, and direction of an image capture location and proper alignment with the virtual model. Still other aspects may include the use of a compass incorporated into a Smart Device.

By way of non-limiting example, functions of the methods and apparatus presented herein may include one or more of the following factors that may be modeled and/or tracked over a defined period of time, such as, for example, an expected life of a build (such as 10 years or 20 years).

Figure 8A:
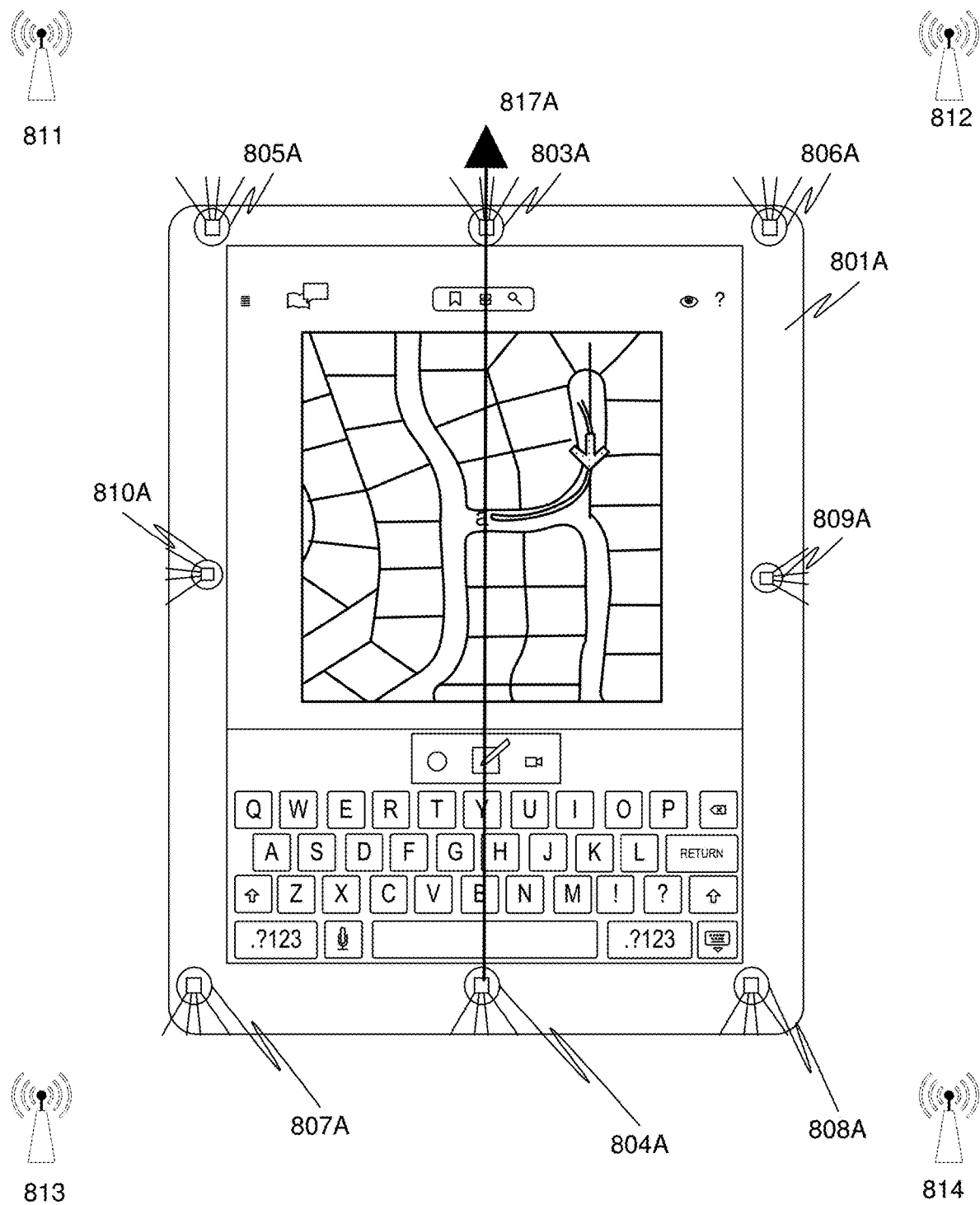

Referring now to FIG. 8A, in some embodiments, Nodes 803A-810A may be incorporated into a Smart Device 801A and not require a smart receptacle to house Nodes 803A-810A. Nodes 803A-810A that are incorporated into a Smart Device, such as a smart phone or smart tablet, will include internal power and logic connections and therefore not require wireless communication between the controller in the Smart Device 801A and the Nodes 803A-810A.

A Smart Device 801A with integrated Nodes 803A-810A and a Smart Device 801 with Nodes 803A-810A in a smart receptacle 802 may provide a directional indication, such as a directional Vector 817 817A, without needing to move the Smart Device from a first position to a second position since a directional Vector may be determined from a relative position of a first Nodes 803A-810A and a second wireless positional device Nodes 803A-810A.

In exemplary embodiments, as described herein, the distances may be triangulated based on measurements of Wi-Fi strength at two points. Wi-Fi signal propagates outward as a wave, ideally according to an inverse square law. Ultimately, a feature of the present invention relies on measuring relative distances at two points. In view of the speed of Wi-Fi waves and the real-time computations involved in orienteering; these computations may be as computationally simple as possible. Thus, depending upon a specific application and mechanism for quantifying a condition, such as a measurement, various coordinate systems may be desirable. In particular, if the Smart Device moves only in a planar direction while the elevation is constant, or only at an angle relative to the ground, the computation is more simple.

One exemplary coordinate system includes a polar coordinate system. One example of a three-dimensional polar coordinate system is a spherical coordinate system. A spherical coordinate system typically comprises three coordinates: a radial coordinate, a polar angle, and an azimuthal angle (r, $\theta$, and $\varphi$, respectively, though $\theta$ and $\varphi$ are occasionally swapped conventionally).

By way of non-limiting example, suppose Point 1 is considered the origin for a spherical coordinate system (i.e., the point (0, 0, 0)). Each Wi-Fi emitter e1, e2, e3 can be described as points (r1, $\theta$1, $\varphi$1), (r2, $\theta$2, $\varphi$2), and (r3, $\theta$3, $\varphi$3), respectively. Each of the $r_i$'s ($1 \leq i \leq 3$) represent the distance between the Wi-Fi emitter and the Wi-Fi receiver on the Smart Device.

It is understood that in some embodiments, an azimuth may include an angle, such as a horizontal angle determined in an arcuate manner from a reference plane or other base direction line, such as an angle formed between a reference point or reference direction; and line (Ray or Vector) such as a Ray or Vector generated from or continuing to; a Smart Device, or a positional Sensor in logical communication with a Smart Device or other controller. In preferred embodiments the Ray or Vector may be generally directed from a reference point Transceiver towards, and/or intersect one or more of: an item of interest; a point of interest; an architectural aspect (such as a wall, beam, header, corner, arch, doorway, window, etc.); an installed component that may act as a reference in an AVM (such as for example, an electrical outlet, a light fixture, a plumbing fixture, an architectural aspect; an item of equipment; an appliance; a multimedia device, etc.); another reference point Transceiver or other identifiable destination. Embodiments include a position of the Transceiver being determined via use of a polar coordinate system. The polar coordinate system may include a spherical coordinate system or a cylindrical coordinate system.

Accordingly, in some embodiments, spherical coordinate system may include reference point Transceiver that is capable of determining an angle of departure of a location signal and a Transceiver that is capable of determining an angle of arrival of the location signal; one or both of which may be used to facilitate determination of an applicable azimuth.

According to various embodiments of the present invention, one or both of an angle of departure and an angle of arrival may therefore be registered by a Transceiver that is transmitting and/or receiving wireless signals (e.g., radio frequency, Bluetooth 5.1, sonic frequency, or light frequency).

In some embodiments, orienteering occurs in a Healthcare Facility, in which Transceivers, (including, for example, one or more of: Wi-Fi Transceivers, UWB Transceivers, Bluetooth Transceivers, infrared Transceivers and ultrasonic Transceivers) may be located above and/or below an Agent. In these embodiments, a cylindrical coordinate system may be more appropriate. A cylindrical coordinate system typically comprises three coordinates: a radial coordinate, an angular coordinate, and an elevation (r, θ, and z, respectively). A cylindrical coordinate system may be desirable where, for example, all Wi-Fi emitters have the same elevation.

Figure 8B:
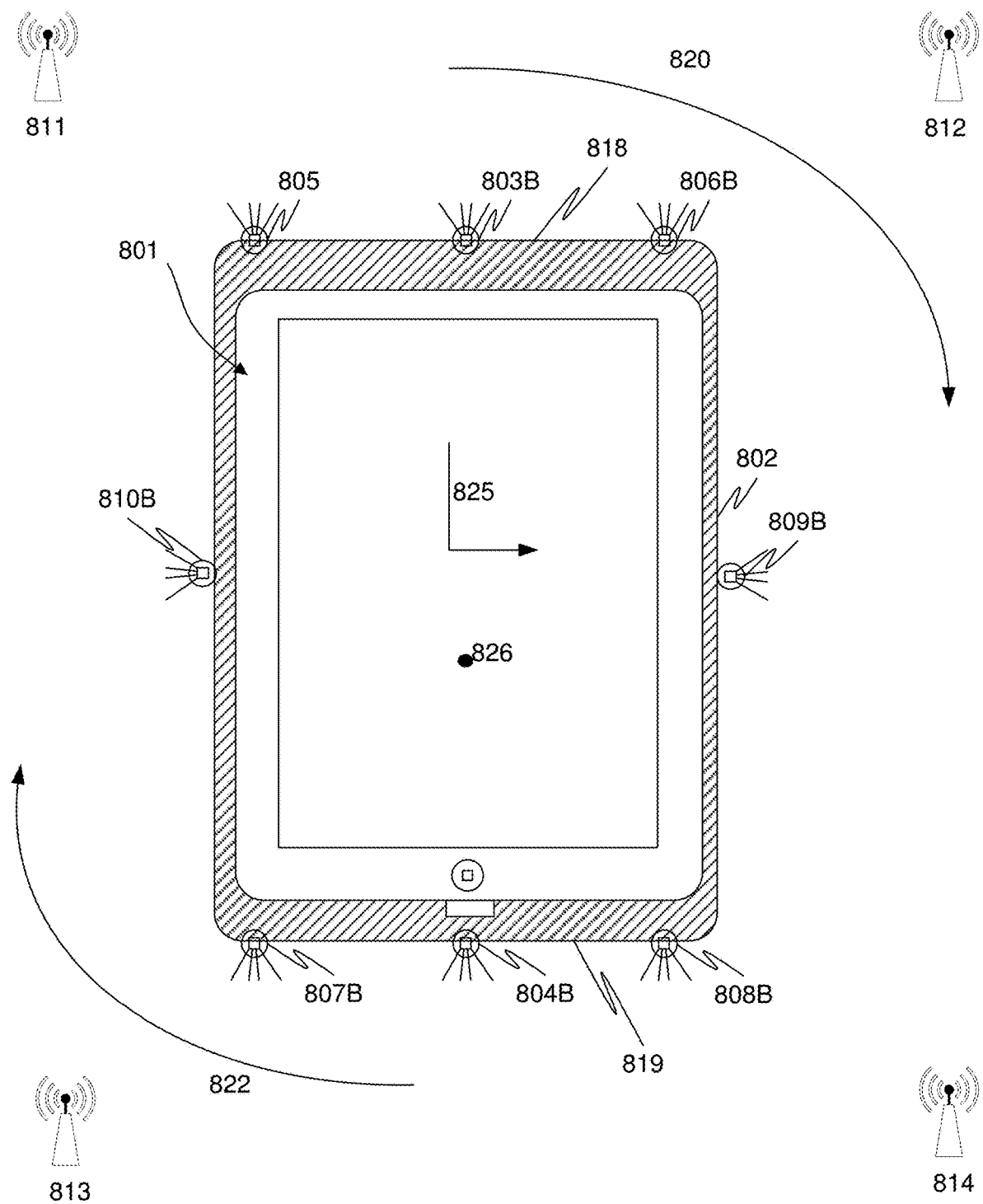

Referring now to FIG. 8B, in some embodiments, one or both of a Smart Device 801 and a smart receptacle 802 may be rotated in a manner (such as, for example in a clockwise 824 or counterclockwise movement 823 relative to a display screen) that repositions one or more Nodes from a first position to a second position. A Vector 826 may be generated at an angle that is perpendicular 825 or some other designated angle in relation to the Smart Device 801. In some embodiments, an angle in relation to the Smart Device is perpendicular 825 and thereby viewable via a forward looking camera on the Smart Device.

A user may position the Smart Device 801 such that an object in a direction of interest is within in the camera view. The Smart Device may then be moved to reposition one or more of the Nodes from a first position to a second position and thereby capture the direction of interest via a generation of a Vector in the direction of interest.

Figure 8C:
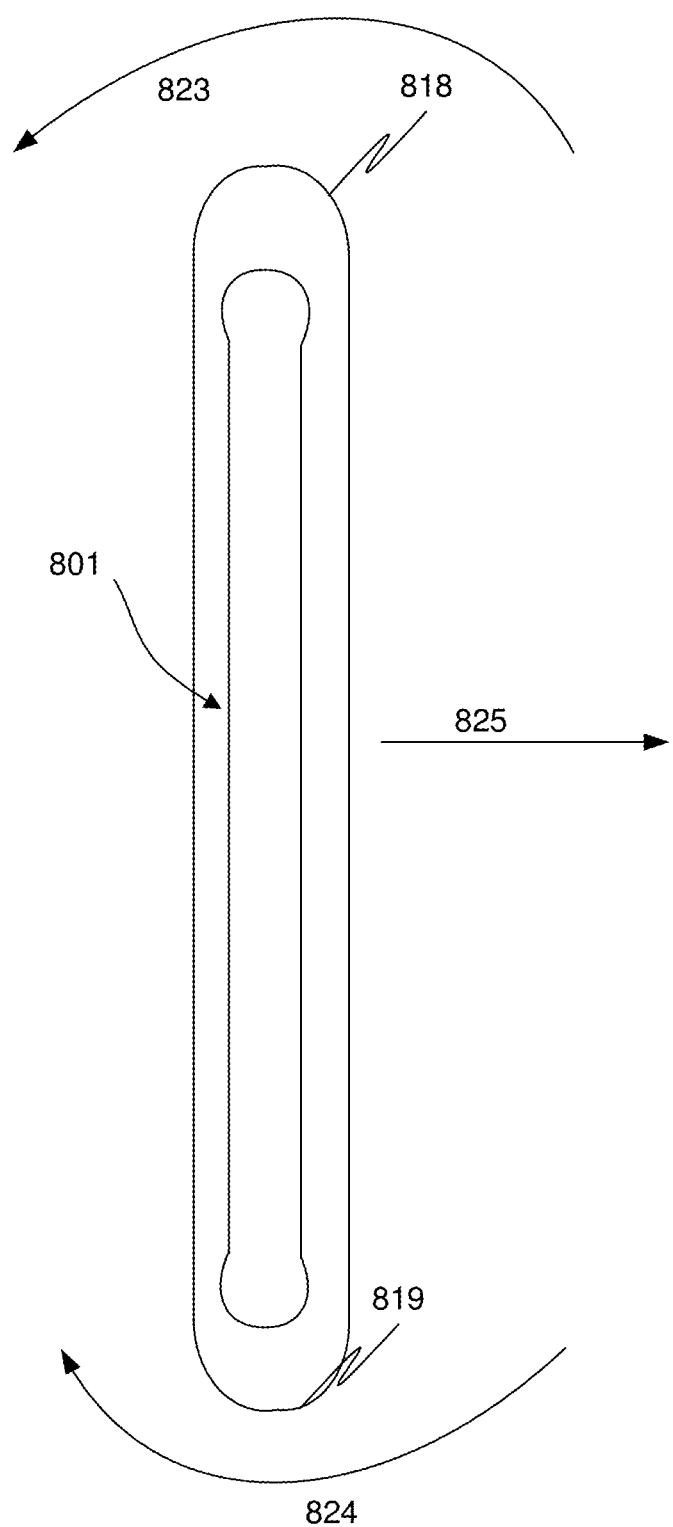

Referring now to FIG. 8C, as illustrated, a Vector indicative of a direction of interest may be based upon a rocking motion 823-824 of the Smart Device 801, such as a movement of an upper edge 818 in a forward arcuate movement 823. The lower edge 819 may also be moved in a complementary arcuate movement 824 or remain stationary. The movement of one or both the upper edge 818-819 also results in movement of one or more Nodes 803C-810C. The movement of the Nodes 803C-810C will be a sufficient distance to register to geospatial positions based upon wireless transmissions. A required distance will be contingent upon a type of wireless transmission referenced to calculate the movement. For example, an infrared beam may require less distance than a Wi-Fi signal, and a Wi-Fi transmission may require less distance than a cell tower transmission which in turn may require less distance than a GPS signal. In some embodiments, as discussed further below, hybrid triangulation may include one or more distances based upon wireless transmissions of different bandwidths or modalities. For example, a first modality may include Wi-Fi transmissions and a second modality may include Bluetooth transmissions, still another modality may include infrared or ultrasonic modalities.

Figure 8D:
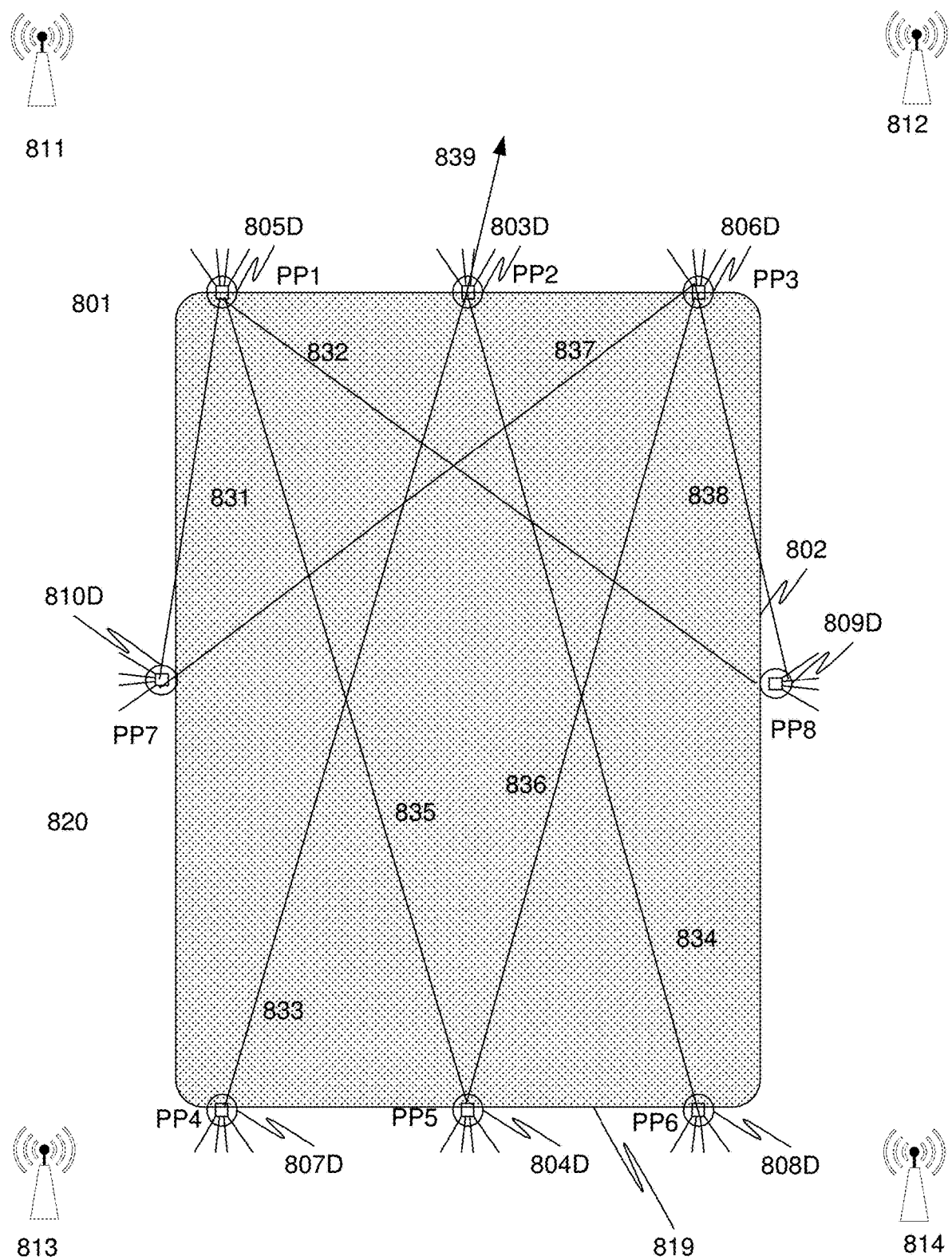

Referring to FIG. 8D, line segments 831-838 are illustrated that intersect various generated position points (PP1-PP8) for Transceivers 803D-810D. Position points PP1-PP8 may be generated according to the methods and apparatus presented herein, including a mathematical average, median, weighted average, or other calculation of multiple positions determined via triangulation techniques. In addition, a Vector 839 or Ray may be generated based upon one or more of the lines 831-838. In some embodiments, position points may be recorded in high numbers based upon thousands of logical communications per second and a virtual representation of the position points PP1-PP8 may be generated based upon the recorded position points PP1-PP8. Some embodiments may also include a cloud point type representation a device that comprises the Transceivers used to record position point PP1-PP8, wherein the cloud point representation is based upon the multiple positions calculated.

Directional Wireless Modalities

Some modalities, such as those modalities that adhere to the Bluetooth 5.1 or BL5.1 standards, allow a Node to determine an angle of arrival (AoA) or an angle of departure (AoD) for a wireless transmission. An array of antennas may be used to measure aspects of the Bluetooth signaling that may be useful to calculate these AoA and AoD parameters. By calibrating an antenna system, the system may be used to determine angles in one or two dimensions depending on the design of the antenna. The result may be significant improvement in pinpointing the location of origin of a signal.

An array of antennas may be positioned relative to each other and a transmitting transceiver to allow for extraction of an AoA/AoD. Such an array may include a rectangular array; a polar or circular array; a linear array; and a patterned array, where a number of antennas are deployed in a pattern conducive to a particular environment for transceiving. Antennas may be separated by characterized distances from each other, and in some examples, a training protocol for the antenna array results in antenna positioning incorporating superior angle and location precision. Some Nodes may transceive in 2.4-2.482 GHz frequency bands, and thus the RF transmissions may have wavelengths in the roughly 125 mm length scale. A collection of antennas separated by significantly less than the wavelength may function by comparing a phase of RF transmissions arriving at the antennas. An accurate extraction of phase differences can yield a difference in path length that when accumulated can lead to a solution for the angles involved.

Figure 9A:
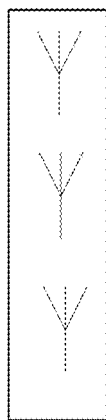
FIGS. 9A-D illustrate exemplary antenna array design examples.
Figure 9B:
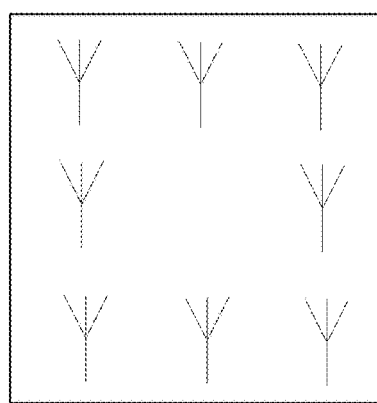
Figure 9C:
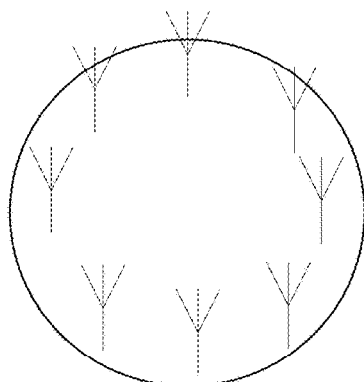
Figure 9D:
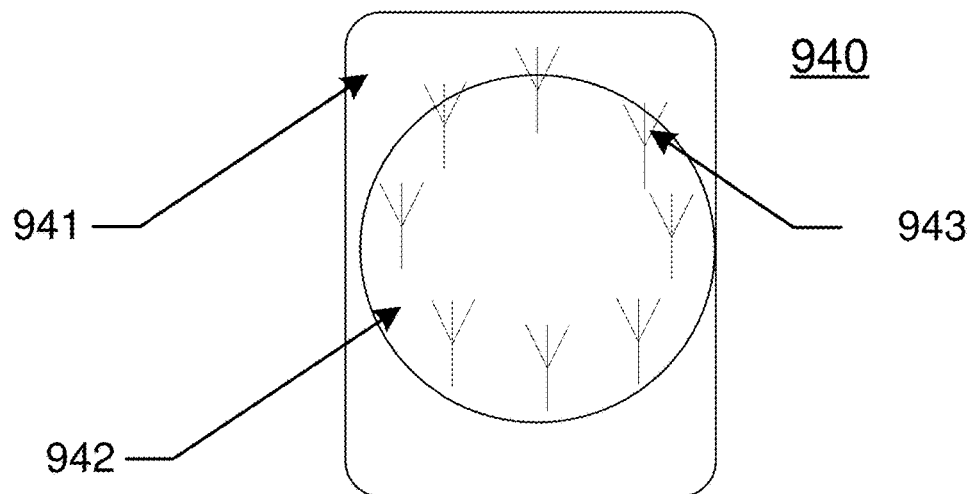

Referring to FIGS. 9A-D a series of exemplary devices employing matrices of antennas for use with Nodes that communicate via a Bluetooth standard, a Wi-Fi standard or other modality, is illustrated. Linear antenna arrays 910 are illustrated in FIG. 9A. Rectangular antenna arrays 920 are illustrated in FIG. 9B. Rectangular antenna arrays 930 are illustrated in FIG. 9C.

Nodes may include antenna arrays combined with batteries and circuitry to form complete self-contained devices. The Nodes or a controller may determine an AoA and/or AoD or other related angular determinations based upon values for variables involved in wireless communications. In an example, a composite device 940 may be formed when a Node 942 with a circular configuration of antenna elements 943 is attached to an exemplary Smart Device 941. The Node 942 attached to the Smart Device 941 may communicate information from and to the Smart Device 941 including calculated results received from or about another Node, such as a Node fixed as a Reference Point Transceiver or a Node with dynamic locations, wherein the wireless communications are conducive to generation of reference angles of transmission and/or receiving.

Figure 10A:
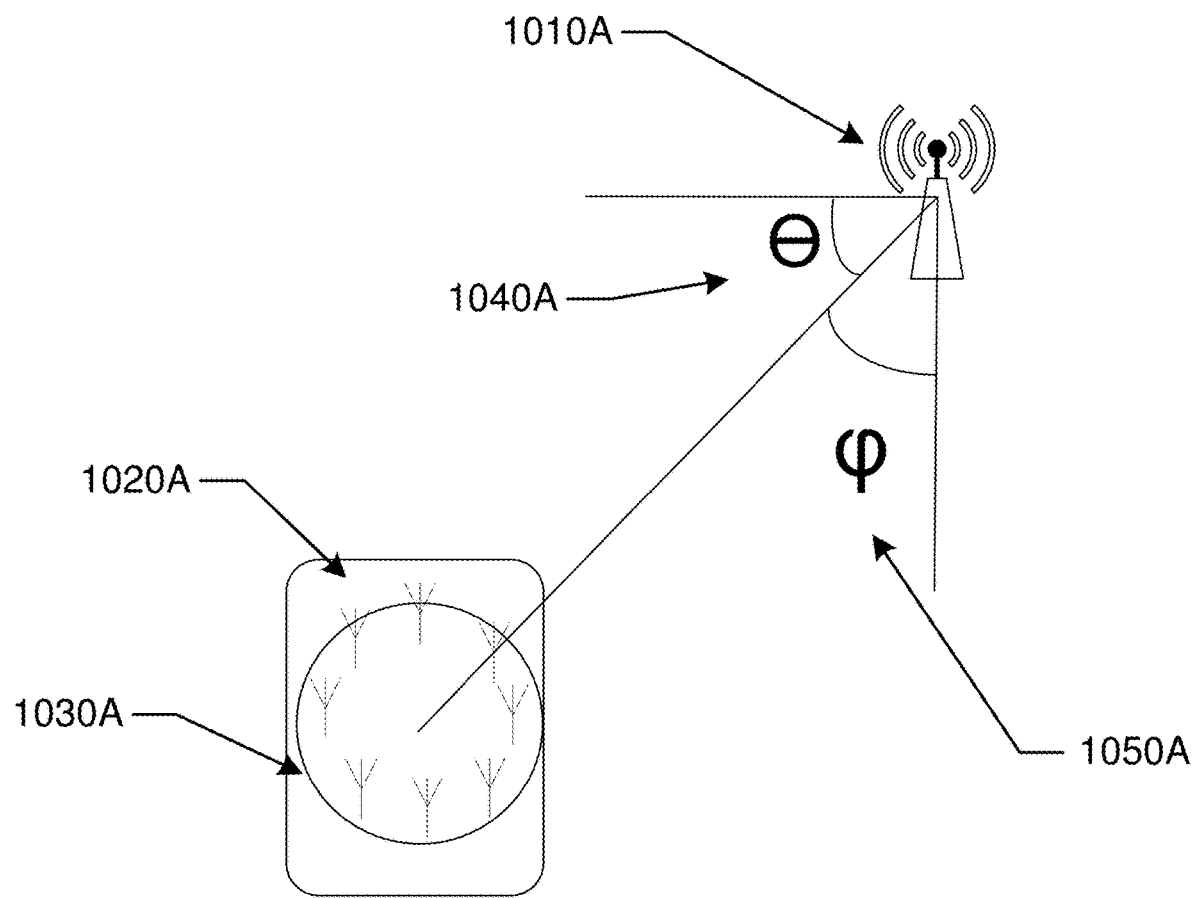
FIGS. 10A-C illustrate location determination with exemplary antenna arrays.

Referring to FIG. 10A, a Smart Device 1020A may be equipped with a Node 1030A that includes a self-contained Bluetooth 5.1 antenna matrix. In the example, the matrix of antennas in the Node 1030A may be configured in a circular pattern. Electronics in the device may capture communication signals sent from a wireless access point 1010A. Each of the paths from the wireless access point to the various antennas of the Node 1030A has a slightly different path through air from the wireless access point 1010A to the Smart Device. This may give each of the signals a slightly different phase alignment with each other. The electronics of the Node 1030A may include both hardware and software along, with training history of the antenna array for the device and may be able to use the different phase measurements and training history to determine both an azimuthal angle 1040A and altitude angle 1050A as an example. The resulting direction pinpoints a significantly improved understanding of the location of the Smart Device 1020A. In some examples, the calculated result may localize the Smart Device 1020A relative to the wireless access point with an accuracy better than 50 cm. In desirable noise and signal situations, a relative localization accuracy may be as good or better than 50 cm-level accuracy.

Figure 10B:
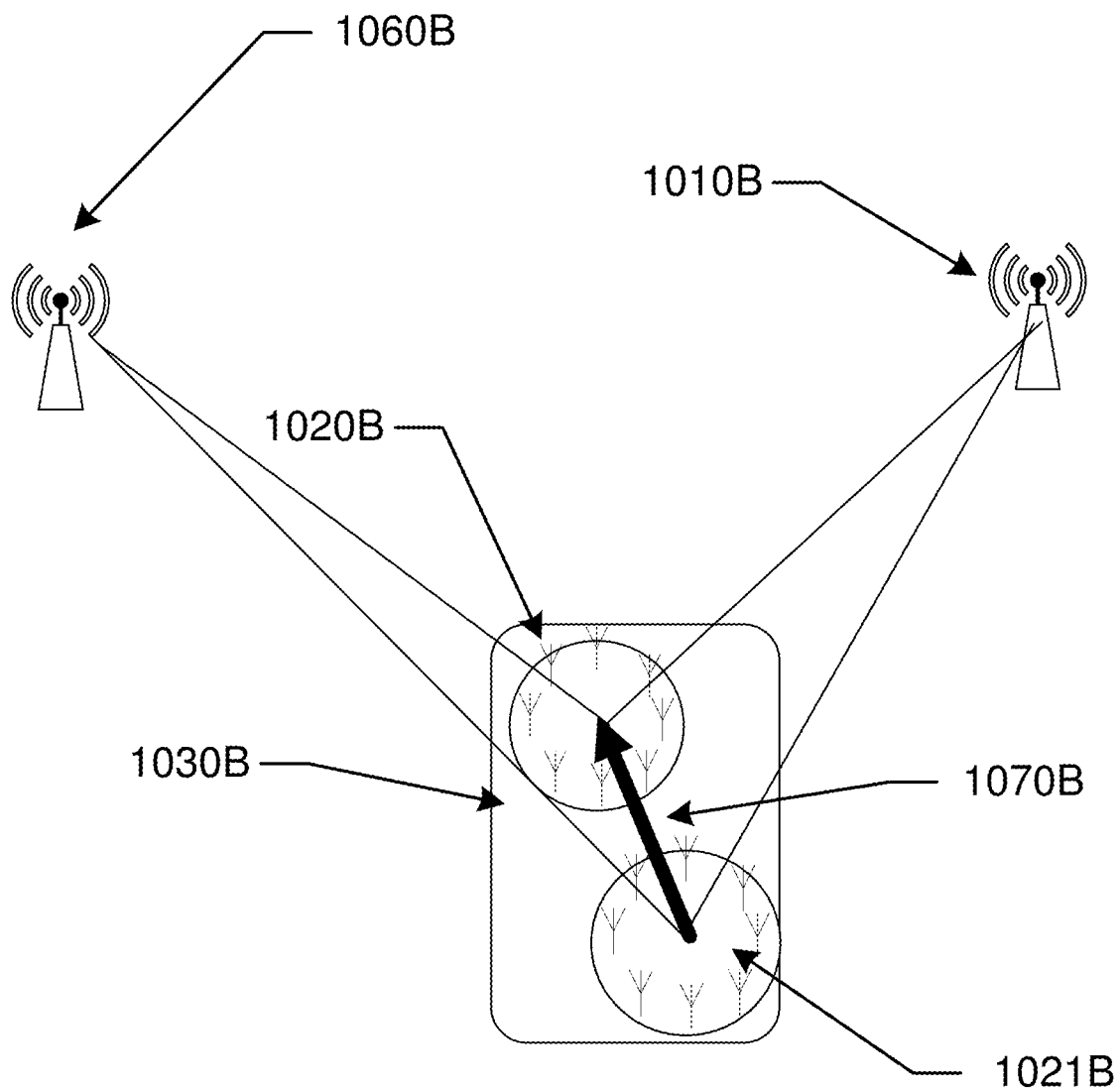

Referring to FIG. 10B, a combination of antenna arrays and electronics to determine the angle of arrival or angle of departure may be placed in proximity to the Smart Device. In some examples, a combination of two or more antenna array devices 1020B and 1021B may be configured to independently sit in a plane proximate to the Smart Device 1030B. The antenna arrays may interact with two or more wireless access points 1010B and 1060B which may also be called locators. When the multiple Rays are calculated from each of the wireless access points 1010B and 1060B to each of the antenna array devices 1020B and 1021B a set of positional points for the two antenna array device may result. These positions may again be used to calculate a Ray 1070B of direction between the two points. This Ray may represent the direction that the Smart Device is positioned in at a particular time.

Figure 10C:
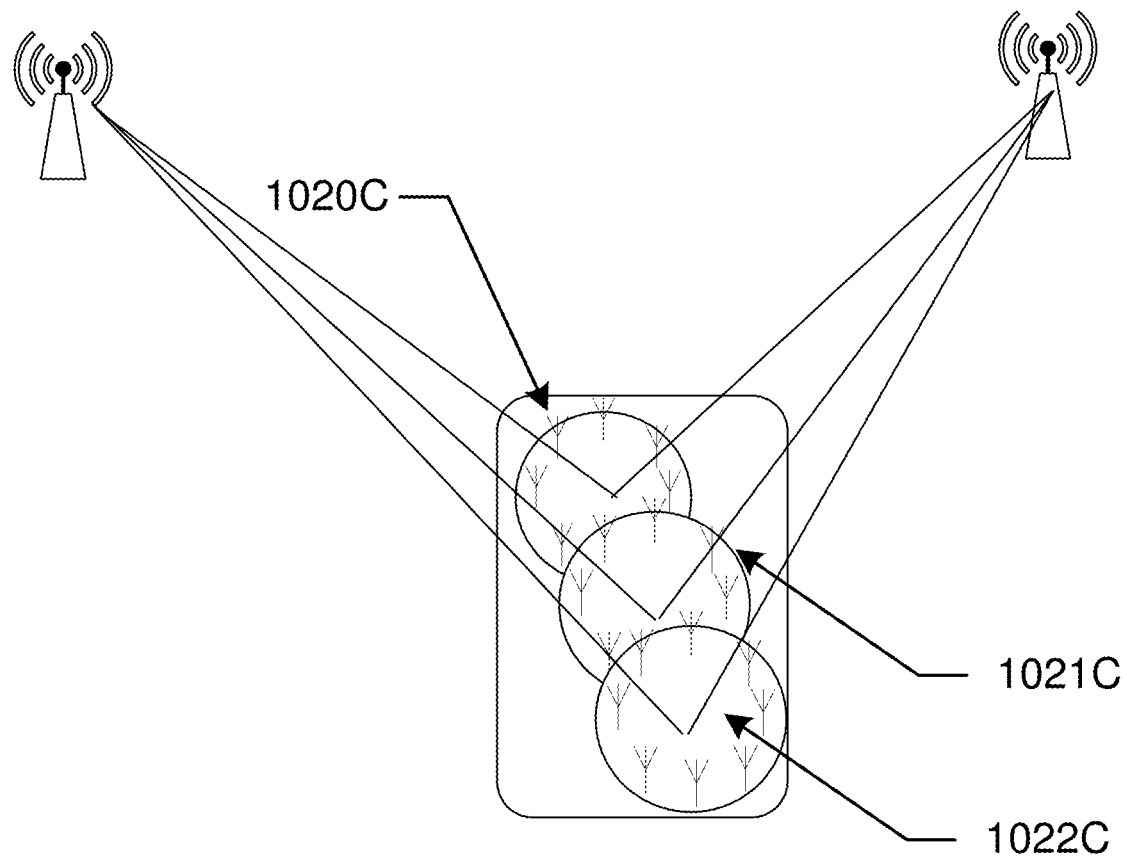

More complex combinations of the arrays of antennas may be configured to increase the signal to noise of the system and improve accuracy. In a non-limiting example, three arrays of antennas 1020C, 1021C, and 1022C, may be found in referencing FIG. 10C. In some examples, the size of the antenna devices may be such that a combination of them may be larger than a Smart Device that they are associated with. In some examples, such as the illustrated example in FIG. 10C, the arrays of antennas may be overlapped in space. The result may physically relate to multiple overlapped regions of the antenna Healthcare Facility. The resulting interaction of the Healthcare Facilities may be very complex, and training of the algorithms to extract results from the signals received by the complicated Healthcare Facility may be required to achieve a directional result. The integration of multiple Healthcare Facilities can improve signal-to-noise ratios related to transmission or reception of signals in some examples; however, as the multiple results can be averaged (in some embodiments, a weighted average) to extract a direction of the orientation of the Smart Device.

Referring now to FIG. 11, method steps are illustrated that may be practiced in some embodiments of the present invention. At step 11, a unique identifier is established for each Node to be included in a self-verifying array. The unique identifier may be an alphanumeric string that is unique to available Nodes, a characteristic variable of a signal (e.g., characteristic frequency or wavelength), a public-key encryption scheme, or any similar unique identifier.

At step 12, each Node (Node X) communicates with each other Node (Node X+Y) with which Node X may establish wireless communications.

At step 13, sets of values for variables descriptive of respective wireless communications are generated. Variables may include, for example: which Nodes are involved in a wireless communication (which may be determined for example via a unique Node identifier); timing values related to time of transmission of a data packet; timing values related to a time of arrival of a data packet; an angle of arrival of a wireless transmission; an angle of departure of a wireless transmission; a strength of a received wireless communication; a quality of a received wireless communication; or other variable. Each Node may generate a set of values for the variables for each wireless communication.

At step 14, optionally, each Node may record aspects of a wireless communication that may influence accuracy of one or more values for variables descriptive of respective wireless communications between Nodes. Example of such aspects may include the presence of an obstruction to transmission of wireless communications, a strength of a received transmission (for example a weak strength of a received transmission may indicate a significant distance between the Nodes in communication), and the like.

At step 15, each Node may store sets of values for the variables for respective communications and aspects that may influence accuracy of the sets of values. In some embodiments, this step is optional; a Node may be capable of immediately retransmitting a value for a variable without first storing it. In some embodiments, a Node may perform certain computations relating to the values for the variables, such as taking a weighted average of values received through multiple modalities or Sensors.

At step 16, respective Nodes transmit respective sets of values for the variables for respective communications and aspects that may influence accuracy of the sets of values to any other Node with wireless communication range. In some embodiments, a Node may also transmit the sets of values for the variables for respective communications and aspects that may influence accuracy of the sets of values via hardwire communication.

At step 17, each Node within communication range receives the transmitted sets of values for the variables and aspects that may influence accuracy of values. By the process of generating sets of values for variables of communications, receiving sets of values of variables for communications, and transmitting the same values, each Node may acquire multiple sets of values relating to itself and to other Nodes, even Nodes that are out of range for direct communication and/or obstructed from direct communication. The multiple sets of values may be used to verify each other. In some embodiments, sets of outlier values may be disregarded.

At step 18, using a controller with a processor and executable software, a position of a particular Node (X) may be generated based upon a composite of sets of values, or a mathematical algorithm involving multiple sets of values. In addition, aspects that may influence the sets of variables may be given mathematical weight in generating a position of Node (X).

At step 19, in some embodiments, a presence of an obstruction may be inferred based upon the multiple sets of values for variables in communication. Still further a position of the perceived obstruction may be generated based upon the same multiple sets of values for variables in communication.

At step 20, a visual representation of a verified location for each Node included in the array may be generated, and in some embodiments, the visual representation may include a position of a perceived obstruction. Each location is verified by sets of values for variables in communications between multiple Nodes. Using this process, a position of a Node may be made available to a Smart Device or another Node that is not within direct communication range and/or is obstructed from direct transmission. Each Node generates values of variables for communication that may be used to determine a particular Node's position relative to other Nodes and/or a base position.

Figure 11A:
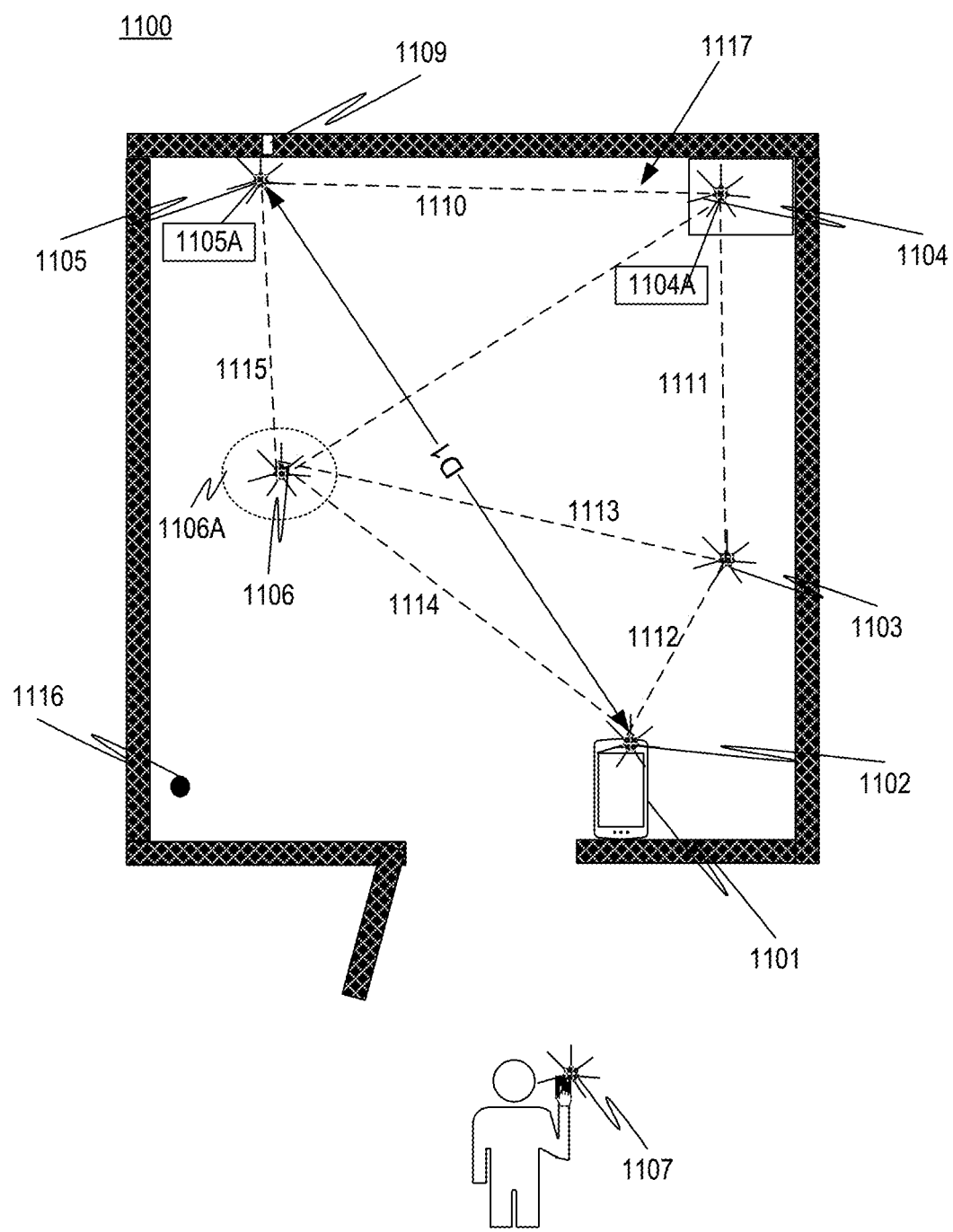
FIG. 11A illustrates a user entering a room with a Smart Device, wherein the room includes various and numerous wireless communicating devices.

Referring now to FIG. 11A, a Healthcare Facility space 1100 having a multitude of wireless Nodes 1102-1106 is illustrated. Nodes 1102-1106 are shown located within or proximate to Healthcare Facility space 1100. Nodes 1102-1106 include Transceivers operative to communicate via a wireless modality, such as one or more of: Bluetooth 5.1; BLE5.1; Wi-Fi RTT, infrared, and ultrasonic communications. In some examples, Nodes 1102-1106 include components capable of supporting positioning and data transfer functions useful in establishing a self-verifying array of Nodes (i.e., a SVAN).

Nodes 1102-1106 may establish a self-verifying array 1117 with direct communication paths 1110-1115 between Nodes illustrated by the dashed lines between the Nodes 1102-1106 positioned at disparate locations. Nodes that are within direct communication range are shown forming direct communication connections along the direct communications paths 1110-1115. Communications between Nodes include data useful for determining one or both of: a position relative to each other; and a position of a Node to a base position 1116. Direct communications within the self-verifying array may also provide improved signal to noise ratios. In some embodiments, Sensors may be co-located with one or more Nodes and in logical communication with the Nodes, thus allowing transmission of Sensor data across the Nodes.

According to the present invention, the self-verifying array 1117 enables overall separations of Nodes that are larger than the direct communication range of the individual Nodes 1102-1106. In other words, self-verifying array 1117 may allow a single Node to transmit to locations greater than the Node's own transmission limits using other Nodes in the self-verifying array. For example, Node 1102 and Node 1105 may not be within a direct communication range of each other due to the distance D1 between Node 1102 and Node 1105 exceeding a range supported by a modality of communication used by Node 1102 and Node 1105. However, data generated at Sensor 1105A that is co-located with Node 1105 may be transmitted to Node 1104 and then to Node 1103 and then to Node 1101; alternatively, and/or in addition, data generated at Sensor 1105A may be transmitted to Node 1106 and then to Node 1102, thereby extending the communications range of the modality in use.

In addition to Sensor data, values for variables of communications between various Nodes 1102-1106 may be transmitted amongst each Node 1102-1105, where the values may enable a determination of a relative position of respective Nodes 1102-1105 to each other and/or to a base position 1116. In this manner, a position of any two Nodes 1102-1105 relative to each other and/or to the base position 1116 may be generated. Verification of Node 1102-1105 positions is accomplished via generation of a particular Node 1102-1105 in relation to another Node 1102-1105 and/or a base position 1116 using multiple sets of values of variables involved in disparate communications between disparate Nodes 1102-1105.

In an example, the Healthcare Facility space 1100 may be considered a Bluetooth arena which is covered by a collection of Nodes 1102-1105 operative to communicate with at least the BLE5.1 standard and thereby form a self-verifying array, such as self-verifying array 1117. In the Healthcare Facility space 1100, the self-verifying array 1117 may establish a base position 1116 from which positions of the various Nodes 1102-1105 may be represented.

In some examples, the base position 1116 may be a spatially significant feature such as a corner, door threshold, physically marked space, or the like, which is established in a model sense with Nodes 1102-1105 including Bluetooth Transceivers that are fixed within the space 1100. In other examples, the base position 1116 may be established at one of the stationary Node 1102-1105 locations.

Referring again to FIG. 11A, one exemplary Node (such as Smart Device Node 1102) may include an Agent-supported Smart Device. The Smart Device Node 1102 may be located at a fixed position and may serve as the base position. In some examples, the Smart Device may be a pad or touch screen which is mounted to a wall position, or it may be a Kiosk-type device also located in a fixed position.

In other examples, a fixed Node 1103 may be located within the Healthcare Facility space 1100 such as at a ceiling-mounted position. Here too, this Node 1103 may be established as the base position for Nodes 1102, 1104-1105 across the network. In other examples, a base position 1116 may be at a location offset from a physical, spatially significant architectural feature such as a corner of a Healthcare Facility or a doorway.

An Agent supporting a Smart Device 1107 with a Bluetooth transmitter may enter the Healthcare Facility space 1100 containing the self-verifying array 1117 and act as a Node in the self-verifying array. The various positioning capabilities of the various Nodes 1102-1105 in the space 1100 may activate to provide location-positioning data to the Agent-supported Smart Device 1107. In some examples, a base position unit is swapped to the Agent-supported Smart Device 1107, in which case, all positions may be dynamically updated relative to the Agent-supported Smart device 1107. In some examples, multiple (and in some cases temporary) additional coordinate systems may be established in addition to a base definition of coordinate system which may have a fixed base unit. Exemplary coordinate designations may include Cartesian Coordinates, Polar Coordinates, Spherical Coordinates, and Cylindrical Coordinates, wherein Bluetooth-type designations of AoD and/or AoA and radius may be represented as coordinates in a Polar, Spherical, or Cylindrical Coordinate system.

There may be Nodes 1104 that are located upon equipment or appliances 1104A, and may therefore be stationary in most cases. The Node 1104 co-located with the appliance 1104A may be powered by the appliance power supply and also have battery-backup aspects. In the example illustrated, the Node 1104 on the appliance 1104A may be classified as the base unit. However, as illustrated, it may be located at a remote position from a doorway to the space. Thus, the use of a self-verifying array may allow for a remote Smart Device 1107 to be an active Node in the space 1100.

There may be Nodes 1105 that are located on wall buttons or in wall-positioned devices. Here too, such a device may be defined as the base position unit. Such a device may be battery-powered and may require means of battery replacement or charging. In some examples, the Node 1105 may have a connection to utility power 1109 and or data conduit. The use of self-verifying array may allow for a User device (not shown) to be tied into a network that connects to the self-verifying array 1117 that covers the bulk of the area of the Healthcare Facility space 1100.

In some examples, a region 1106A of the Healthcare Facility space 1100 may be generally devoid of coverage to the self-verifying array 1117. In designing the communications environment of the space 1100, therefore, a Node 1106 with a Bluetooth transmitter may be fixedly located to a ceiling, support pole, or other Healthcare Facility feature in a region 1106A that is otherwise devoid of communications coverage.

A visual representation of a self-verifying array may include some or all of the Nodes include in the array and, in some embodiments, it will include a representation of a perceived obstruction based upon the values for communication variables. Some embodiments of a visual representation may have one or both of layers of spatial grid definition and polar coordinate definition. In a base layer, a coordinate system for the Healthcare Facility space may be established using a fixed device as a base unit. The origin of this first layer's coordinate system may be established as a zero point in numerous coordinate system types such as cartesian, polar, cylindrical, spherical or other topographical coordinate models.

In some examples, an overlay second layer may include a coordinate system which is spatially similar to the self-verifying array, where for example, each connection of three devices may create a regional coordinate system, and the Healthcare Facility space 1100 is represented as a mosaic of local coordinate systems within self-verifying-array-defined spaces. In some other examples, an overlay third or more layers may be a dynamic coordinate system where a specific communication Node, which is mobile, is dynamically tracked as the coordinate system origin and the rest of the space is adjusted relative to the moving origin.

Various embodiments may include schemes and layers of coordinate system definitions that become defined for a composite of self-verifying array Nodes 1102-1105. In some examples, one or more of the coordinate layers may be defined, tracked, and communicated by a single network member defined as a base position unit. In other examples, a SVAN may distribute coordinate definition and communication to Nodes 1102-1105 dynamically. A routine update of calculated and measured position and coordinate system may be maintained that not only defines a coordinate system but also indicates where some or all self-verifying array connected Nodes 1102-1105 are located on a grid system. A routine update at a schedule of time may therefore track Nodes 1102-1105 that are moving in time, recalculating their position.

In some examples, a Bluetooth-enabled device may not be authorized or may not have the capabilities to enter the self-verifying array as a Node 1102-1105, but it may emit signals including identification information and may receive communications from the self-verifying array. In such embodiments, the self-verifying array may identify these non-Node-type communication devices and establish their positions. As will be defined in more detail, in some examples, a position determination for a particular non-Node device may be defined in reference to a Node 1102-1105 that the non-Node device communicates with, along with an estimate of a range in which the non-Node device is capable of communicating.

Figure 11B:
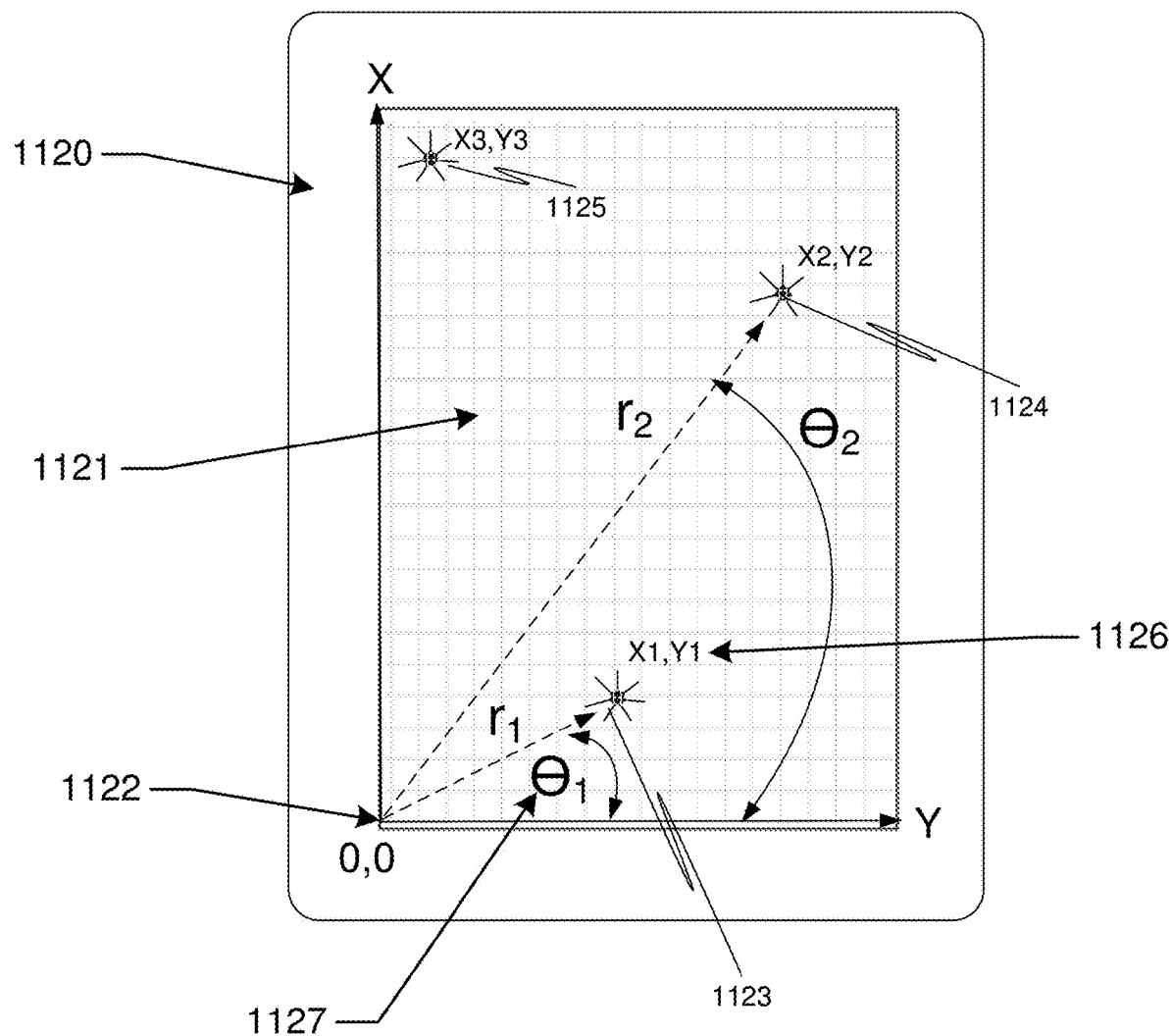
FIG. 11B illustrates a map displayed on a Smart Device with Cartesian Coordinates as well as Polar Coordinates displayed.

Referring now to FIG. 11B, a Smart Device may receive a communication from a Node 1102-1105 in a self-verifying array, wherein the communication includes multiple positional coordinates for each Node included in the array. The communication may also include positional coordinates of items of interest associated with Nodes 1102-1105 on the network, such as an item co-located with a Node 1102-1105. In some examples, the network may be interrogated by the Smart Device to provide information related to one or more Nodes included in the self-verifying array. The data may be used by the Smart Device to generate a user interface 1121 with a pictorial/image representation of the various Bluetooth transmitters and network Node devices. The representation may utilize one or more coordinate systems. For example, a Smart Device 1120 may portray the user interface 1121 may include image representation of a region of the Healthcare Facility space which may be user selectable on the Smart Device. The image representation in the user interface 1121 may include an origin 1122 designation for a particular coordinate layer. In an example, where the coordinate layer is one where the origin is dynamically updated for the position of the Agent, then the origin may represent the position at which the Agent is located.

In another example, an origin may be congruent with an origin of a coordinate layer for a spatially relevant origin and the Agent may or may not be represented as an item on the user interface 1121. For this example, an Agent may be represented by position 1123. A pictorial representation may show the Agent position 1123 and also present parameters that refer to the Agent position such, as a two dimensional cartesian reference 1126 and/or a polar notation reference 1127. Other wireless Nodes of relevance 1124 and 1125, within the scale of the image may be portrayed as well.

In some examples, the self-verifying array may include a feature where some or all of the network connected Nodes have identification information associated with them. Each of the Nodes may have stored (locally or in another network data layer) a multitude of references such as an identification information internal to a transceiver. For example, a Bluetooth transceiver may transmit identification information like a 48-bit Bluetooth transceiver address, a user-assignable name to the transmitter, or a user-assignable name to an element that the transmitter is a component of may be stored. As an example of an assignable name, in a non-limiting sense, an appliance may be a Node in self-verifying array which may have the name "Downstairs Refrigerator."

In some examples, identification information may be related to different levels of security access that a Node may access, store, transmit, and the like. Information useful for generation of a user interface may be transmitted from a Node via IP on a digital communications network, such as the Internet, and a user may be located anywhere that is connected to the communications network. In this manner, a user interface may be presented to a remote user regardless of the user's location.

In some examples, a stable base unit of the self-verifying array may act as a standard repository and access point for all information stored or archived for the self-verifying array. In other examples, the data storage may be distributed across the self-verifying array. In an example, a standard portion of the data stored on the self-verifying array, such as in a non-limiting sense, the identifications, timestamps, positions, characteristics, and security levels of all Nodes, and identifications and positions of all transmitters within the Healthcare Facility space/self-verifying array extent may be assembled into a data table/layer.

In some examples, a routine transmittal of a data table/layer may be broadcast throughout the self-verifying array. In an example, every self-verifying array Node may have an assigned broadcast order such that at a standard time indexed to the broadcast order, it will broadcast its current version of the table. All Nodes within range of a transmitting Node will receive the table and update it as the current version. Then, at their prescribed broadcast time, they might transmit the table. There may be rules that overlay such a broadcast to ensure that current data is not updated with previous versions for a Node that does not receive the update before its broadcast time. Such rules may also prevent unauthorized alteration of data through hacking or other network penetration. The Nodes may act as participants in a Blockchain in this manner.

One such rule may be that transmission may occur only when the data table has been updated at the Node. Another rule may inhibit transmission for any Node that is dynamic/moving, or alternatively initiate immediate transceiving for a Node that is dynamic/moving. Transmission may include diverse types of data. Periodic transmissions may be timed based upon a time needed for a transmission, energy required for transmission, available energy, receipt of new data, and the like. Therefore, each Node may have a configuration setting that defines conditions when, how, and for how long it transceives. Such condition may include, for example, a frequency upon which it listens for and upon which it communicates data. The various definitions of coordinate layers may be transmitted.

In some examples, a remote user-connected digital communications network to a self-verifying array Node or a Bluetooth device entering into a self-verifying array Node may request a copy of a standard data table transmission. The data table transmission may include positions of Nodes relative to a fixed origin, to the user position, to particular fixed Nodes of the network or a collection of some or all of these.

Some data layers may be created to store Sensor information that may be obtained at some or all of the Nodes. The data layer may be segregated based on types of Sensor data. For example, all Nodes of a self-verifying array may include a Sensor providing a quantification of one or more of: ambient temperature, humidity, water presence, current draw, vibration, movement, image data, and the like. A timestamped reading of this Sensor quantification may be included into a data layer along with co-located Node identification information.

In other examples, a subset of the devices may include an ambient-light Sensor as part of its infrastructure. In this case, another data layer may be created for this type of Sensor data. In some examples, the pictorial image representation may include one or more of the data layer Sensor information. The pictorial image representation may represent the Sensor readings in a textual form, or in other manners such as a color indication at a Node position or at regions around a Node position.

Figure 12A:
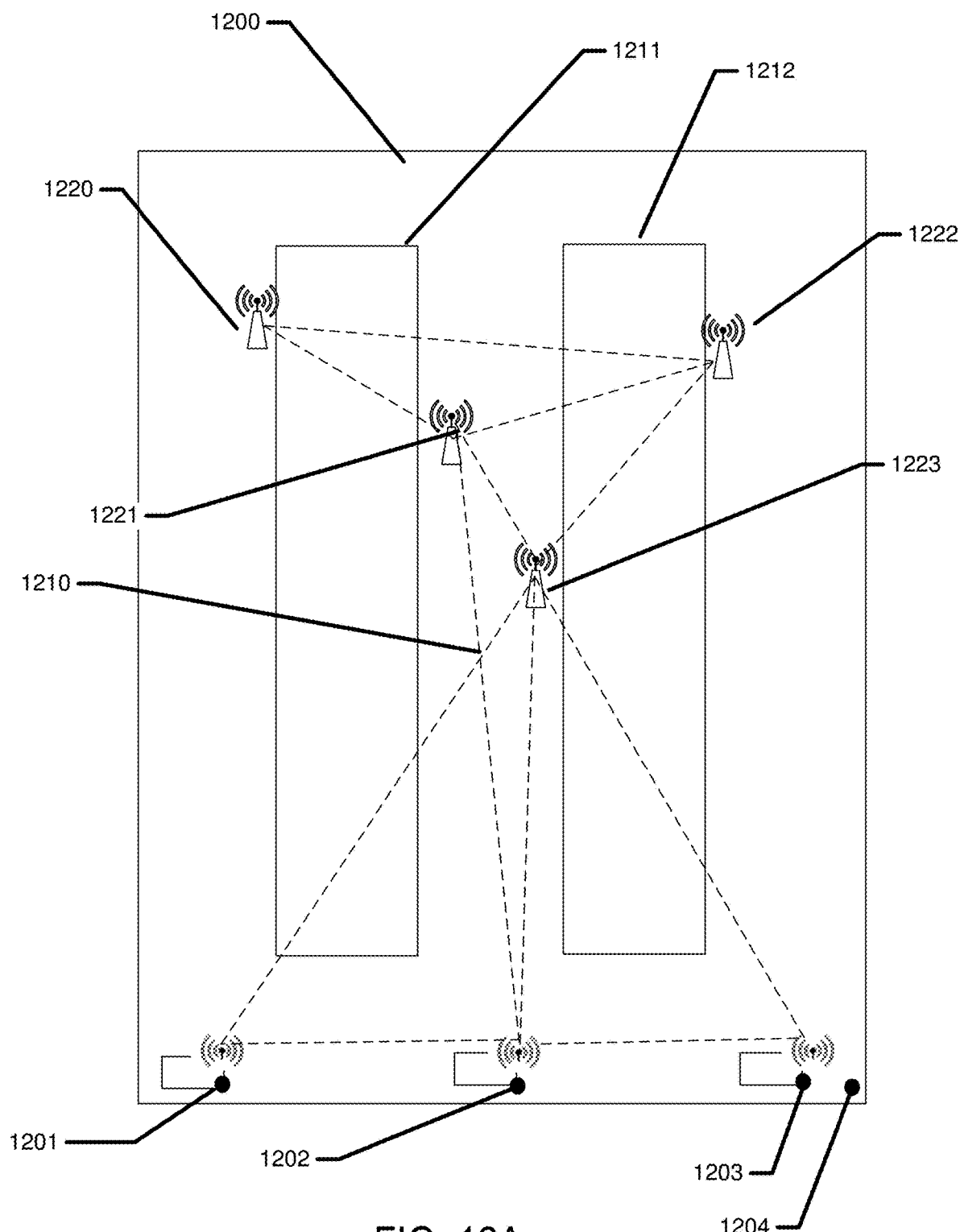
FIG. 12A illustrates a physical location with various stationary and movable wireless Nodes including camera equipped devices.

Referring to FIG. 12A, another representation of a SVAN 1210 is displayed. In this embodiment, space 1200 may include Healthcare Facilities 1211 and 1212. Healthcare Facilities 1211 and 1212 may have a variety of different characteristics that may impact the performance of self-verifying array (SVAN 1210). For example, Healthcare Facilities 1211 and 1212 may be physically closed (e.g., walls, solid Healthcare Facilities) or partially closed (e.g., shelves). Healthcare Facilities 1211 and 1212 may also comprise solid materials and the like. Accordingly, the presence of these Healthcare Facilities may change the transmission characteristics of a wireless network (e.g., Bluetooth). Some Healthcare Facilities may block signals, impede signals, or partially impede signals. For example, shelves may have physical regions that block and other regions that are fully transmissive.

Shelves may provide an example in which the Healthcare Facilities in the space 1200 may have dynamic characteristics. Such dynamic characteristics may make self-verifying arrays (and corresponding spatial schema) more useful than traditional mapping methods. These characteristics may create different operational characteristics for self-verifying arrays.

In another sense, a shelf may hold a combination of both fixed and mobile devices that comprise a self-verifying array in the space at some given time. This may provide more accurate and more dynamic coverage for the schema. For example, the space 1200 may be interspersed with an assembly of fixed (or roughly fixed) network Nodes that form a grid pattern (as an example) to ensure that a minimal self-verifying array may be established that covers the entire space 1200. This minimal network may be supplemented with "migrant" Nodes that are moved into the space 1200 and become part of the SVAN 1210. From a signal coverage perspective, more participants may improve characteristics. However, more participants may increase information traffic levels, and a control formalism that limits bandwidth differentially to different network participants may be necessary in some examples.

In FIG. 12A, an example of a space 1200 with shelving units that make up Healthcare Facilities 1211 and 1212 is illustrated. The space may have a "global" reference point 1204 for positioning. There may be fixed wireless communication Nodes 1201, 1202, and 1203 (for this example, all Nodes are at least compliant with Bluetooth 5.1 and transmit at least as Bluetooth radio transmitters; however, this deployment is merely illustrative). The fixed wireless communication Nodes 1201-1203 may also include other aspects/components to them such as an integrated camera system. The integrated camera system may provide a visual perspective of a portion of the space that its corresponding wireless radios may cover. In a self-verifying array, Nodes may be collocated or located relative to a Sensor, such as an image-capture device. Based on a known set position of the Sensor relative to the Node, the Node may transmit information captured by the Sensor to other Nodes. Accordingly, a Node out of both Sensor and radio range of another Node may still receive data from the Sensor through the array. The data from the Sensor reflects a range of data in which a physical characteristic is quantified or capable of being quantified by the Sensor. For example, a Sensor may be an image-capture device, limited in range by both wavelength of image capture (e.g., limited to infrared) and spatial range (e.g., field of view of the image-capture device). This may be particularly desirable in embodiments in which the self-verifying array is deployed in or adjacent to an environment having a characteristic adverse to a Sensor. For example, the low temperatures may impair operation of certain Sensors. Through the self-verifying array comprised of these Nodes, data from the Sensors may be freely transferred among the Nodes, including through fiber optic communication throughout the freezer. It may be desirable to deploy spectrometers and hydrometers in this fashion. Moreover, redundant Nodes may be able to redirect Sensor readings from one Node to a base Node, especially in scenarios when an optimal Node pathway may be obstructed, such as by shelving.

The space 1200 may also include other fixed Nodes, such as Node 1223, that may not have cameras included. Node 1223 may be important to ensure that regardless of a makeup of migrant communication Nodes, fixed wireless communication Nodes may be able to form a complete SVAN space 1200 in the absence of items that block radio transmissions. There may also be migrant communication Nodes 1220-1222 affixed on packages, materials, or other items that may be placed and/or stored upon the shelving units.

In some examples, at least a subset of the SVAN-participant Nodes may communicate periodically. The various aspects of data layer communications as have been discussed may occur between the Nodes of the network. At a base level, at least a subset of the Bluetooth transmitters may periodically transmit information such as their unique identifiers, time stamps, known positions and the like. In some embodiments, Nodes may transmit between each other or to a base information about variables between the Nodes, such as computed distances or angles between the Nodes. A Node may receive transmissions from other transmitters and may store the transmissions. In some examples, a Node may act as a repeater by receiving a transmission and then retransmitting the received transmission. A Node acting as a repeater may then take various actions related to the data involved. In an example, the Node may effectively just stream the data where no storage of any kind is made. Alternatively, a Node may store the transmission, then retransmit the transmission (immediately or after a delay) and then delete the stored data. In other examples, a repeater Node may store a received transmission and then retransmit the transmission either for a stated number of times, or until some kind of signal is received after a transmission. Thereafter the Node may also delete the data. In some examples, a Node may store data from an incoming transmission and take the various retransmission actions as have been defined, but then not delete data until its data store is filled. At that point, it may either delete some or all of the stored data, or it may just overwrite stored data with new incoming data and then clean up any remaining data with a deletion or other process.

When a Node acts as a repeater, it may receive data and then merely retransmit the data. Alternatively, a repeater Node may either use the transmission of data or the time during the transmission to acquire and calculate its position and potentially the position of other transmitters in range. During retransmission of the received data, it may also include in the transmission calculations of its own position relative to other transmitters, calculations of other transmitter positions relative to itself, calculations of its own and other transmitter positions relative to an origin, and the like. It may also include other information such as a time stamp for the calculation of positions.

The combined elements of a SVAN may be operated in a way to optimize power management. Some of the network Nodes and transmitting elements may operate in connection with power-providing utility connections in the Healthcare Facility. Other network Nodes may operate on battery power. Each of the Nodes may self-identify its power source, and either at a decision of a centralized controller or by a cooperative decision making process, optimized decisions may be taken relative to data transmission, low-power operational modes, data storage and the like. In some examples, where multiple Nodes provide redundant coverage and provide information to a central bridge acting as a repeater, the Nodes may alternate in operation to share the power-draw on individual Nodes. For example, if one of these Nodes is connected to a utility power source, that Node may take the full load. The battery-powered elements may have charge-level detectors and may be able to communicate their power-storage level through the network. Accordingly, an optimization may reduce traffic on the lower battery capacity Nodes.

In some examples of operations, a transmitting Node may transmit a message for a number of redundant cycles to ensure that receivers have a chance to detect the message and receive it. In low power operating environments, receivers may transmit acknowledgements that messages have been received. If a base unit of the network acknowledges receipt of the message, control may be transferred to the base unit to ensure that the message is received by all appropriate network members. Message receivers may make a position determination and broadcast their position if it has changed. A self-verifying array of Bluetooth receivers may provide one of a number of Transceiver network layers where other communication protocols based on different standards or frequencies or modalities of transmission may be employed, such as Wi-Fi, UWB, Cellular bandwidth, ultrasonic, infrared and the like. A Node that is a member of different network layers may communicate and receive data between the different network layers in addition to communicating through a Bluetooth low-energy self-verifying array.

Figure 12B:
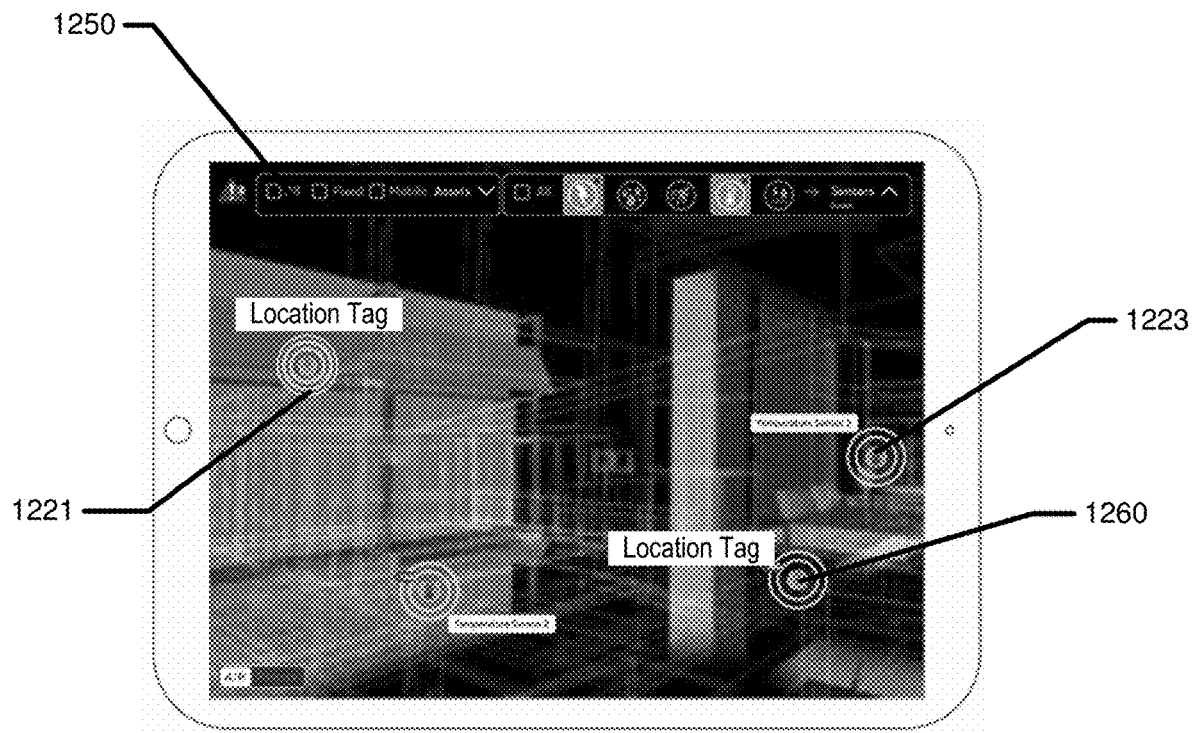
FIG. 12B illustrates a view on a Smart Device incorporating a camera video display with superimposed wireless device location.

Referring to FIG. 12B, an illustration of the view from a camera on a network Node position is presented. A Smart Device 1250 may interact with the self-verifying array and communicate a desire to receive images or video from a camera. In an example, referring back to FIG. 12A, the Node 1201 may have a camera that produces an image that in FIG. 12B is presented on the smart phone as image 1260. Processing either on the Smart Device or on processors connected to the network may collect information about the location of other network Nodes through the various processes as described herein and then determine a correct location on the collected image to display icons over the position of the Nodes 1221 and 1223. There may be numerous other types of information that may be overlaid onto the imagery such as Sensor measurements, textual presentations of data values, data related to status and transactions on the network, and the like.

In some examples, the cameras may be maintained in a fixed position or positioned on mounts that can allow the plane of view of the camera to be moved. The Smart Device 1250 may be supported by an agent such that it is oriented in such a manner to point to a particular view-plane from the perspective of the screen. This may either be from a perspective of looking through the smart screen (i.e., in the field of view of a camera associated with the Smart Device 1250) or, in other examples, supporting a screen of a Smart Device flat (i.e., parallel to a ground plane) and pointing in a direction of interest based on a direction of orientation of the Smart Device 1250. In related applications, it is disclosed that a direction of interest may be determined based on wireless communications. In some examples, orientation aspects of Transceivers upon the Smart Device 1250 may be employed to determine Rays of interest of the user (for example, to point the Smart Device 1250 in a direction of interest to the user). In other examples, other Sensors on the Smart Device such as accelerometers, magnetometers, and the like may be able to infer a direction in which the Smart Device is pointed. Once a direction of interest is determined, the camera may be moved to correspond to a plane perpendicular to a Ray associated with the direction of interest (i.e., such that the Ray is a normal vector to the plane). An assessment of items of interest whose coordinates may lie in the field of view of the selected view plane may be made, thus presenting data to the user and allowing the user to filter out or learn more about the items.

Figure 12C:
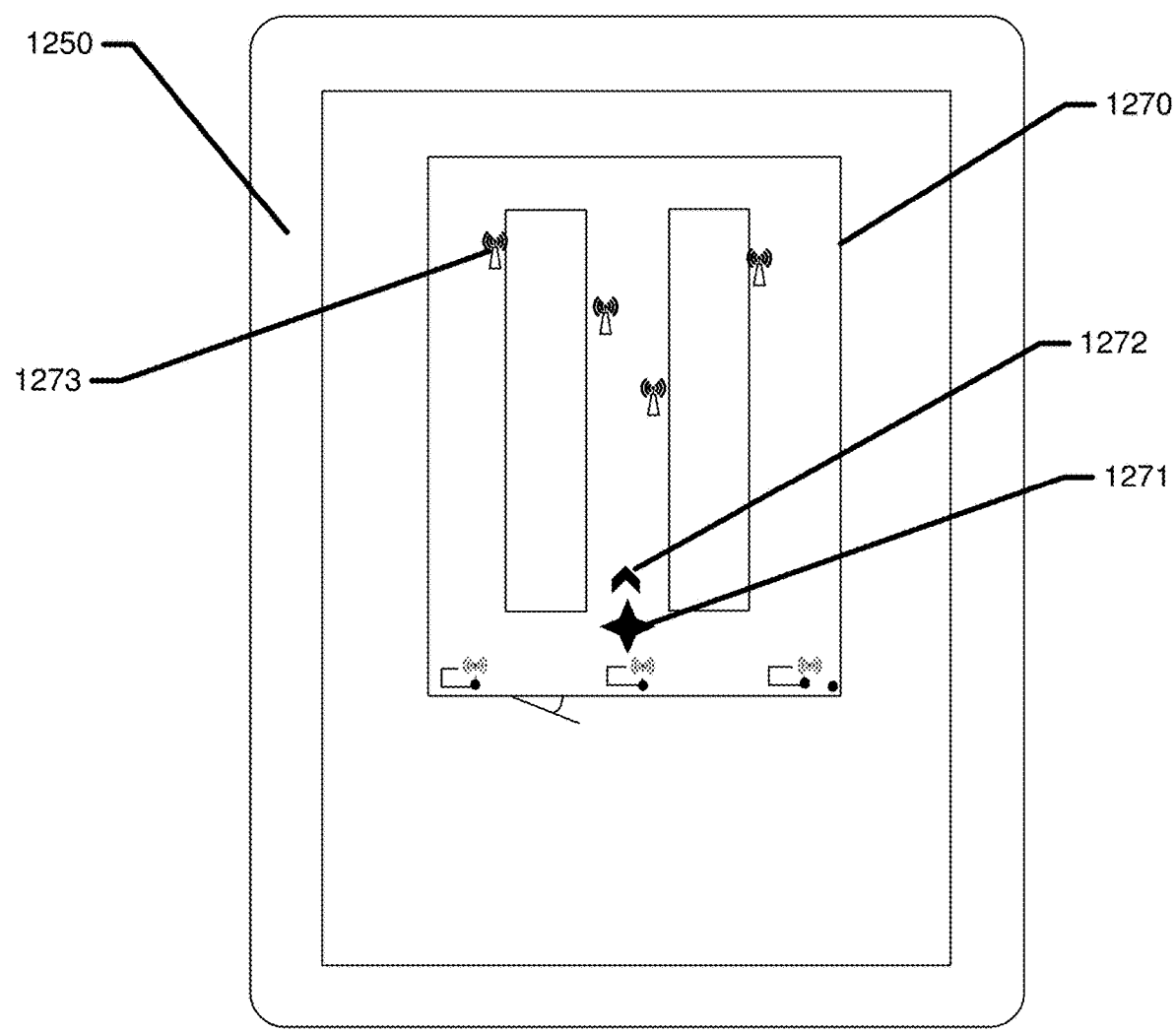
FIG. 12C illustrates a view on a Smart Device showing a map of known device locations as well as known user location and user orientation.

Referring now to FIG. 12C, another type of presentation is illustrated where a plan view or map view of the space 1270 may be presented. In some examples, a Smart Device may access a virtual model (AVM) or other spatial schema that contains spatial data relating to the space that the user is in. The view may also include a presentation of the Healthcare Facility, including features such as walls, doors, supports, shelving, equipment and the like. The location of network Nodes may be illustrated by icons at the two-dimensional locations determined by the various position-mapping processes as described herein. The location of the user 1271 may also be superimposed upon the map with a different icon, and this location may be dynamically updated as the user 1271 is moving. There may also be an iconic representation of the heading 1272 of the user which may be determined by the wireless protocols as discussed herein or it may be estimated based on the time-evolution of the position of the user. Items of interest may be presented on the map at any location surrounding the user such as in front, to the side or behind the user. In some other examples, only items in the view-plane (determined by the heading of the user) may be illustrated on the Smart Device 1250. Textual data and other types of information display such as color gradation may also be superimposed on the map to represent data values such as Sensor input, network characteristics, and the like. In some examples, a relative height of items of interest relative to the floor or to the Smart Device may be presented on the image as a text presentation.

Figure 12D:
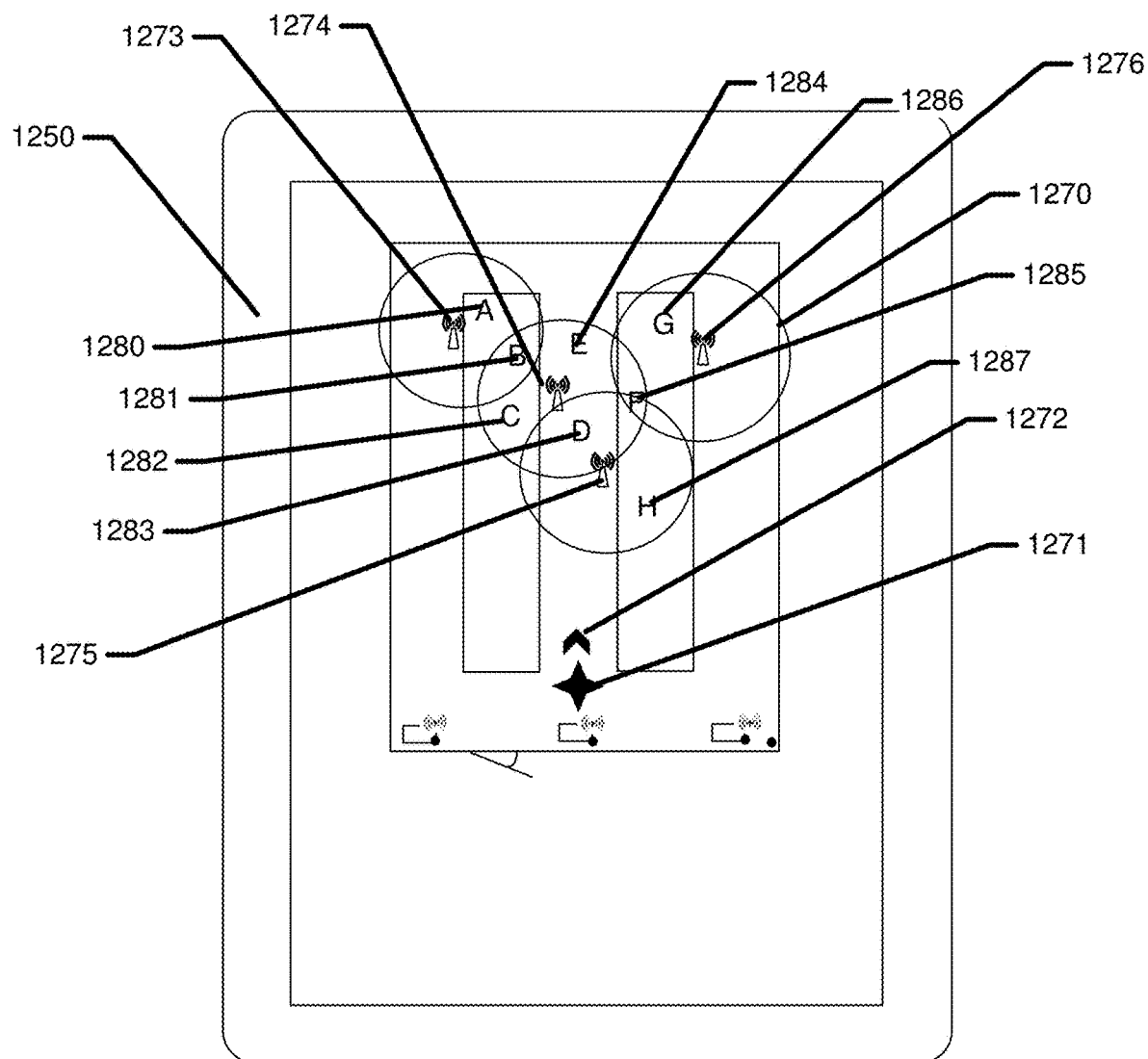
FIG. 12D illustrates a view of devices displayed on a Smart Device showing a map of known location equipped SVAN Node locations as well as regionally associated non-location equipped devices.

Referring to FIG. 12D an extension of location tracking is illustrated for devices that do not have positional capabilities (such as a GPS) but can respond to transmissions within a certain distance. The range of the device can allow a localization to be within a certain distance from a Node. In some examples, nanowatt Bluetooth Nodes that operate without battery power may be cheaply attached to items for tracking and/or can be affixed with Sensors to provide data acquisition. These devices may typically depend upon energy harvesting for their operation. In some examples, a transmission from a Node of the SVAN may itself carry enough energy to enable an RFID tag or other type of passive tag to respond with a low-energy transmission. Accordingly, a Node may transmit sufficient energy to activate an RFID; such as, for example, an RFID that has an identifier of an item to which it is affixed. The devices may be unable to perform all the wireless functions discussed herein, but they may be capable of transmitting identification data and perhaps Sensor data.

In some examples, RFIDs may be employed. Bluetooth self-verifying array Nodes may also have incorporated RFID tag readers that can similarly transmit a unique identifier in response to a transmission from the self-verifying array Node. In FIG. 12D, a Smart Device 1250 may display a map-form presentation of a space 1270 (similar to the previous discussion with SVAN Nodes located in a two-dimensional coordinate system). In an exemplary embodiment, ultralow-power Bluetooth Nodes or RFID Nodes may be located on elements such as packages or equipment placed on the illustrated shelves. In response to transmissions from the SVAN Nodes, various low-power tags may respond. In some examples, the localization of the low-power tag may be based on further refinement of measurements, such as measurements of the returned signal strength.

Referring again to FIG. 12D, a SVAN Node 1273 may detect two transmitting Nodes (labeled "A" 1280 and "B" 1281 in FIG. 12D). Since Node "B" 1281 may also be detected by a neighboring SVAN Node 1274, it may be inferred that the Node may be in a region located between the two SVAN Nodes (i.e., since Node "B" is located in the overlap of the coverage areas of SVAN Nodes 1273 and 1274, it is likely that Node "B" is located somewhere between SVAN Nodes 1273 and 1274). Other Nodes received by SVAN Node 1274, such as Nodes 1282 and 1284, may not be detected by other SVAN Nodes and thus may be located in non-overlapped regions. As a further illustration, Node "D" 1283 may be detected both by Nodes 1274 and 1275. Node "F" 1285 may be detected by three different SVAN Nodes 1274, 1275 and 1276. Thus, the position of Node "F" may be determined with a high level of confidence. Node "G" 1286 may be located only in SVAN Node 1276. Node "H" 1287 may be located only in SVAN Node 1275. This data may provide localization information for regions around Bluetooth SVAN Nodes.

The non-limiting example discussed has included a Healthcare Facility with obstructions in the form of shelves; however, obstructions may include any item that interferes with or inhibits or decreases quality of inter-Node communication within the self-verifying array.

Figure 12E:
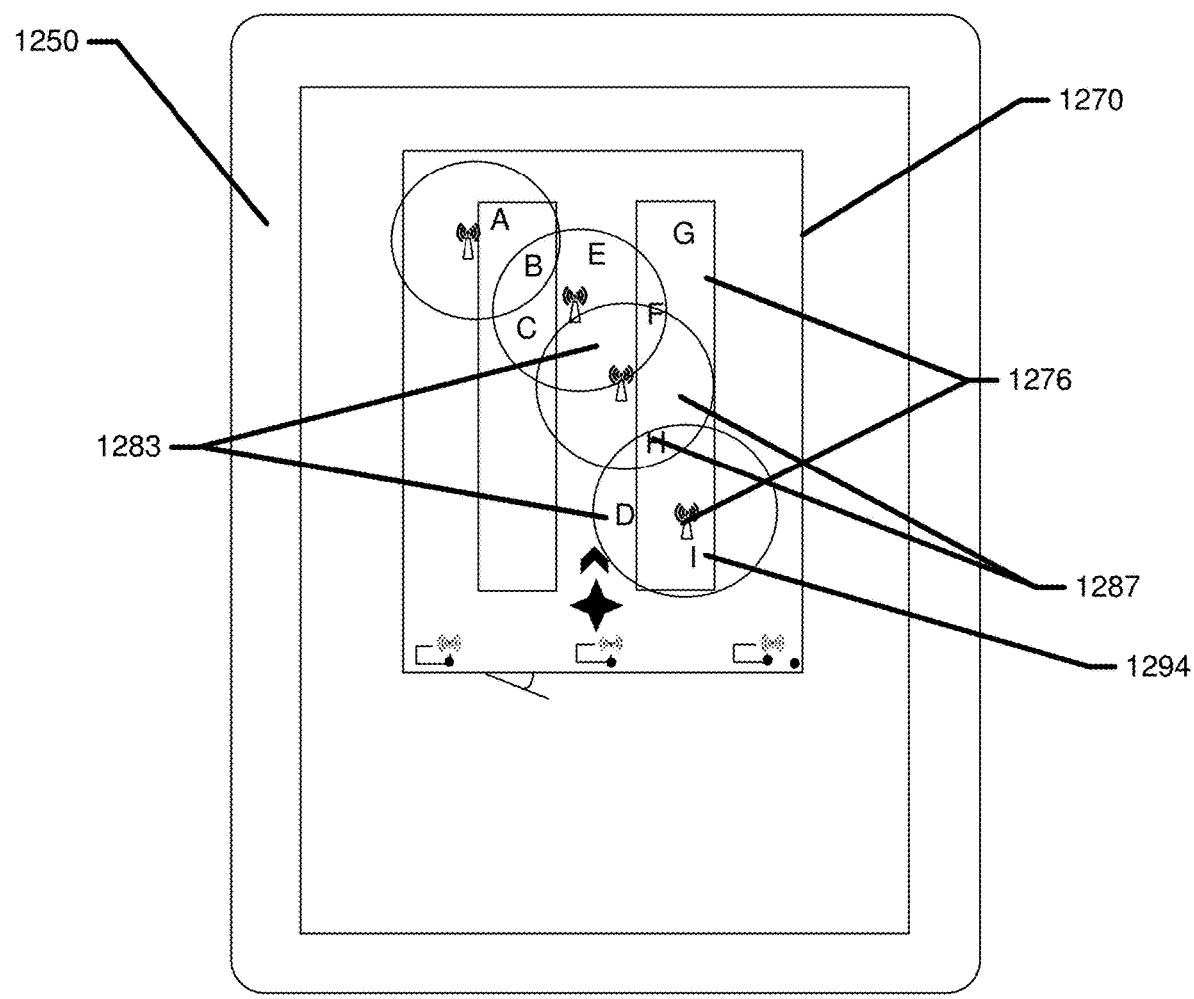
FIG. 12E illustrates a view of a SVAN displayed on a Smart Device showing movement of known location Node locations as well as movement of regionally associated non-location equipped devices.

Referring to FIG. 12E, elements of a self-verifying array in a space 1270 may have dynamic locations and their movement may have ramification. In an example, SVAN Node 1276 may physically move to another location. The various self-verifying array data layers relating to location of elements may update for this move and the updated tables may be communicated to the Nodes of the network as has been described. At the new location, SVAN Node 1276 may signal to devices in its new region for response. There may be transmitting Nodes and RFIDS that are and have been in the new region that SVAN Node 1276 has moved to. For example, item "I" 1294 may be located by SVAN Node 1276 in its new location. As well, items with transmitting Nodes on them may also move as illustrated by the detected movement of item "D" 1283. Another type of change may be that when Node 1276 occupies its new location, item "H" 1287 may be detected in the region of two network Nodes now, and therefore its location may be refined to that region that the two network Nodes overlap in coverage.

Figure 12F:
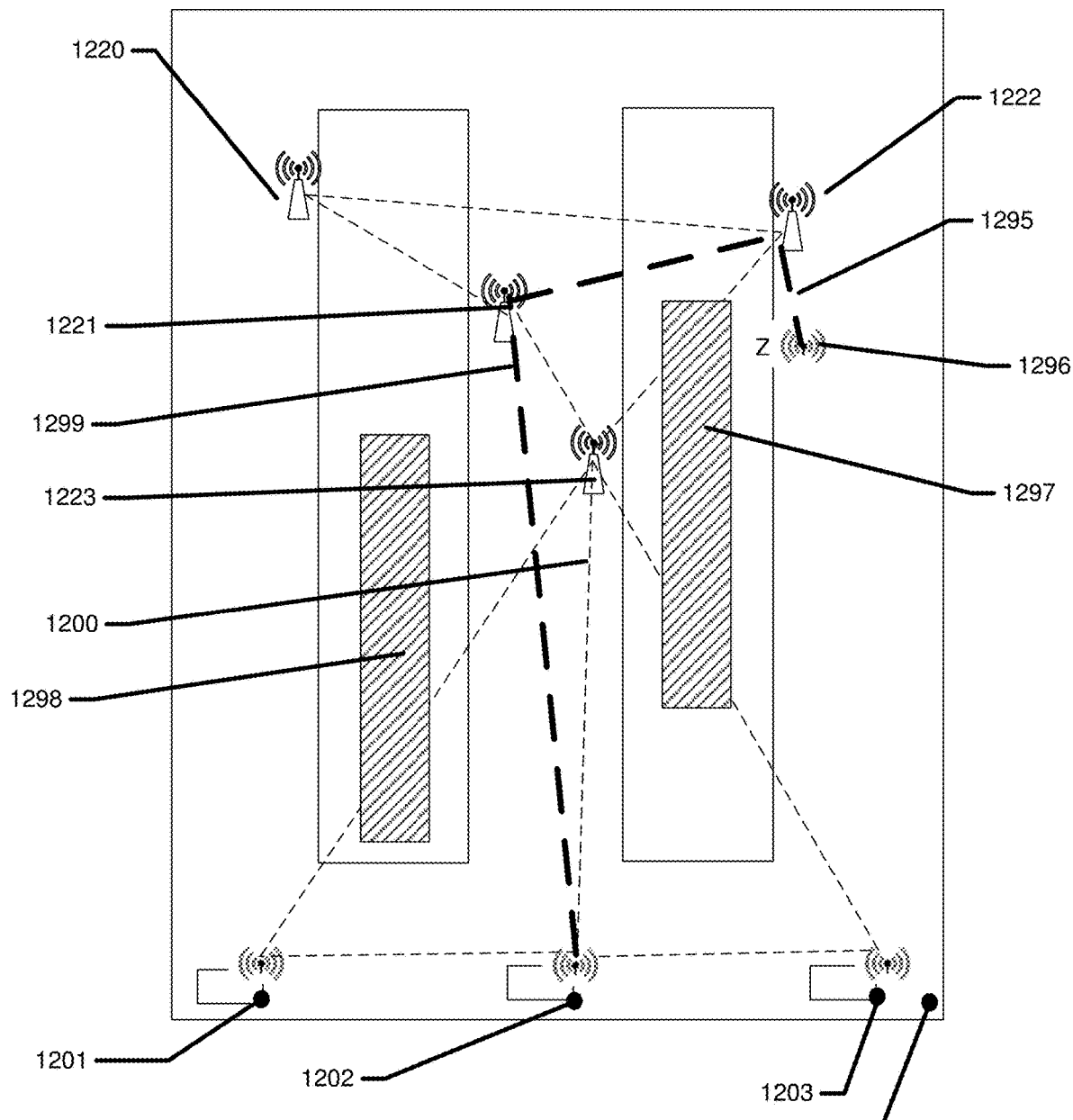
FIG. 12F illustrates a view of a SVAN being used to look around blockages.

Referring now to FIG. 12F, an illustration of a complex space where regions within the space may block or impede wireless communications is provided. In some examples, parts of a Healthcare Facility like internal walls, conduits, equipment, structural beams, and elevators/shafts may provide permanent or temporary blockage of wireless transmission. For example, as an elevator passes through a particular floor, it may block transmissions through the elevator shaft that may otherwise occur. Shelves may be temporarily have materials or equipment moved to positions on the shelves as illustrated by regions 1297 and 1298 that may block wireless transmissions. The self-verifying array space 1200 and its Nodes 1201-1203 and 1220-1223 may be able to cooperate and provide coverage of the self-verifying array around such blockage. For example, a wireless communication Node 1296 may be too far from Node 1203 to communicate directly with it. And, communication from other fixed Nodes like 1201 and 1202 may be blocked by the blockage as discussed. The SVAN may still communicate 1295 with the SVAN Node 1296 by connecting a path 1299 shown in thick dashed lines essentially communicating with line of sight paths around the blockages.

Figure 13A:
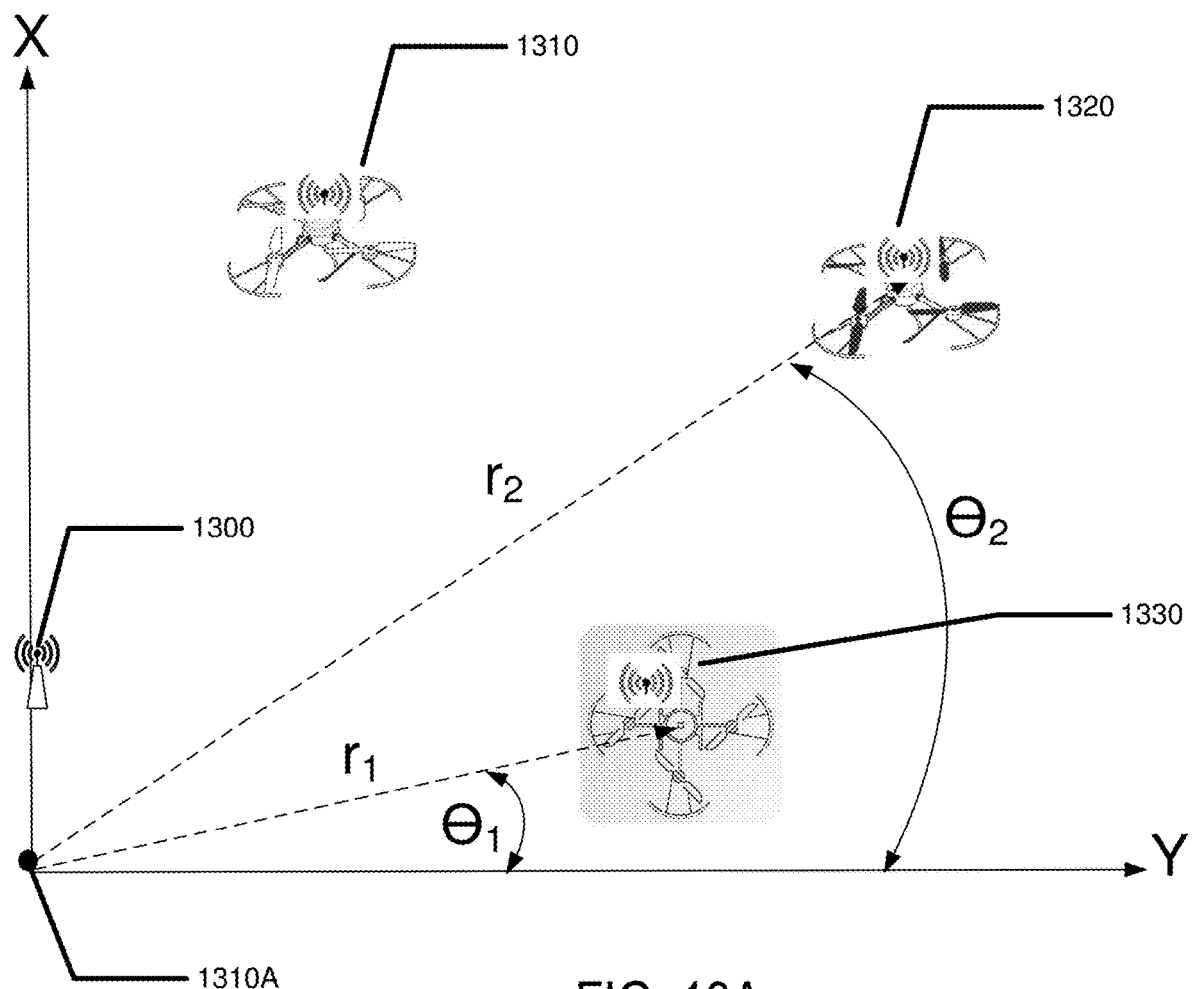
FIG. 13A illustrates a set of mobile Nodes represented in polar coordinates.

Referring to FIG. 13A, mobile elements such as UAV and UGV with wireless transmitting Nodes attached are illustrated. Mobile elements may function within self-verifying arrays to create dynamic physical extensions of the self-verifying array. The mobile elements 1310, 1320 and 1330 are illustrated as UAVs. As the mobile elements move, they may allow other Nodes or wireless access Nodes to make communications. In some examples, there may be at least a first fixed element 1300 that is part of the SVAN. It may define an origin point in some systems, but in other examples, it may be offset from an origin point 1310A. As a mobile element 1320 moves through space, its position may be updated by communication between the fixed element 1300 and itself 1320. The location determine may in some examples be referenced to the origin. In polar notation, it may be located at $r_2, \theta_2$, for example, where the angular components are taken with respect to an axis having at least a point perpendicular to mobile element 1320 (e.g., a ground plane).

When the mobile elements are able to communicate with a fixed element, a determination of the fixed element's position relative to a local coordinate system may be straightforward since the fixed element can know its position with relatively high accuracy. A moving device that can continually measure its position relative to the fixed element can come close to that accuracy in position determination as well and can improve its determination by taking more measurements. As mentioned previously, elements in an operating space may be either statically or dynamically positioned and block or impede wireless transmission through them. Mobile communication elements create interesting solutions in such an environment because a team of communication elements can position itself in such a manner to "look around" such difficult transmission zones. At the same time, the difficult transmission zone may block the ability of a mobile element from communicating directly with a fixed communication Node. In such cases, a first mobile element may determine its position relative to a second mobile element, where the second mobile element has communication capability with fixed self-verifying array communication Nodes. In some examples, a self-verifying array may consist entirely of mobile elements, and then its practical coordinate system may be a local one that is determined in a moving coordinate system related to one or more of the mobile elements relative position.

Figure 13B:
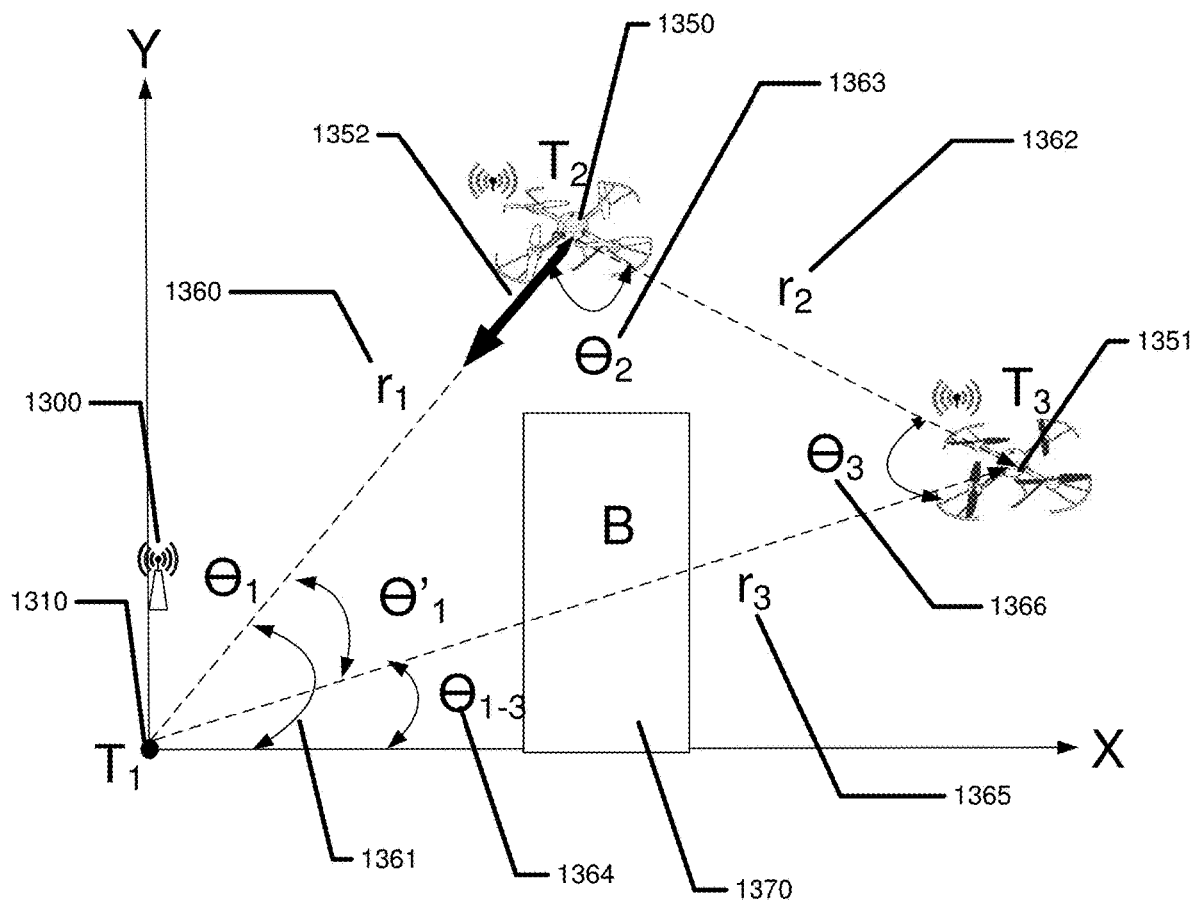
FIG. 13B illustrates an ability of a set of mobile Nodes to cooperate around blocked transmission zones with line of sight.

Referring now to FIG. 13B, an exemplary embodiment of this non-line-of-sight position detection is shown. In some examples, there may be mobile elements 1350, 1351 with wireless communications capabilities that create at least a portion of a SVAN of wireless communicating devices. In some examples, the wireless communicating devices may include capability for Bluetooth protocol communications. In still further examples, the Bluetooth protocol communications devices may include capabilities for establishing self-verifying arrays as well as capabilities of performing positioning based on AoA measurements such as is defined in the Bluetooth 5.1 standard. A fixed element 1300 which has a known offset to position $T_1$ may locate a mobile Node 1350 (such as a UAV) at position $T_2$ in accordance with the orienteering methods described above. In some examples, the mobile Node 1350 at position $T_2$ may have moved into position $T_2$ in order to have a line-of-sight with the mobile element 1351 at position $T_3$. For illustration and discussion, the devices are shown with line-of-sight between $T_1$ and $T_2$ and between $T_2$ and $T_3$. In some examples, the wireless communication modalities described herein may be capable of passing through walls or other blockades, however, a blockade may resist or interfere with such wireless transmission. In some examples, a wireless modality deployed may just not be able to penetrate a given wall or other obstruction.

Accordingly, the second reference Transceiver $T_2$ of the mobile Node 1350, due to its movement, may be deployed within the line of sight of both $T_1$ and $T_3$ to assist with determining an accurate location of $T_3$ notwithstanding the lack of sight between $T_1$ and $T_3$. Although this Figure shows a lack of line-of-sight between fixed device 1300 and the mobile element 1351 as caused by blockade B 1370, line-of-sight may also be defeated by, for example, an excessive distance between $T_1$ and $T_3$ (i.e., $r_3$ 1365). For example, Bluetooth 5.1 has a range of approximately 1.4 km at certain frequencies. Thus, where $r_3 \gg 1.4$ km, the present method may be desirable for Transceivers that use Bluetooth 5.1.

Using the methods described above, the fixed element 1300 referenced to $T_1$ may determine the location of the mobile Node 1350 $T_2$ by line-of-sight communication. For example, the location may be determined based on the angle of arrival of signals, as angle $\theta_1$ 1361 from $T_2$ and the distance $r_1$ 1360 between $T_1$ and $T_2$ as measured by timing signals. For ease of calculations and discussion, the local coordinate system of mobile Node 1350 at $T_2$ may be oriented to a reference direction 1352 pointed to location $T_1$ from $T_2$. The mobile Node 1350 at $T_2$ may in turn detect the location of the mobile element 1351 at $T_3$, using (in some embodiments) the methods described herein. If $T_2$ uses the methods described herein to determine the location of $T_3$, it may determine that the mobile element 1351 at $T_3$ is located a distance $r_2$ 1362 from it and relative to its reference direction 1352, it may be located at an angle $\theta_2$ 1363.

The mobile Node 1350 may aid the system of SVAN elements to determine the positions of each of the element relative to each other by relaying the relative location of the mobile element 1351 at $T_3$ as detected to the fixed element at 1300 which is referenced to the point $T_1$. One of the components of the SVAN, which may even include connected servers that are connected to one of the self-verifying array Nodes, may then perform algorithmic calculations to trigonometrically compute several useful values, such as: the effective distance between $T_1$ and $T_3$, notwithstanding blockade B 1370, i.e., $r_3$ 1365; the effective angle of arrival of a signal from $T_3$, i.e., $\theta_3$ 1366; the angle between $T_3$ and an axis formed by $T_1$, i.e., $\theta_{1-3}$ 1364; and the like.

Figure 15:
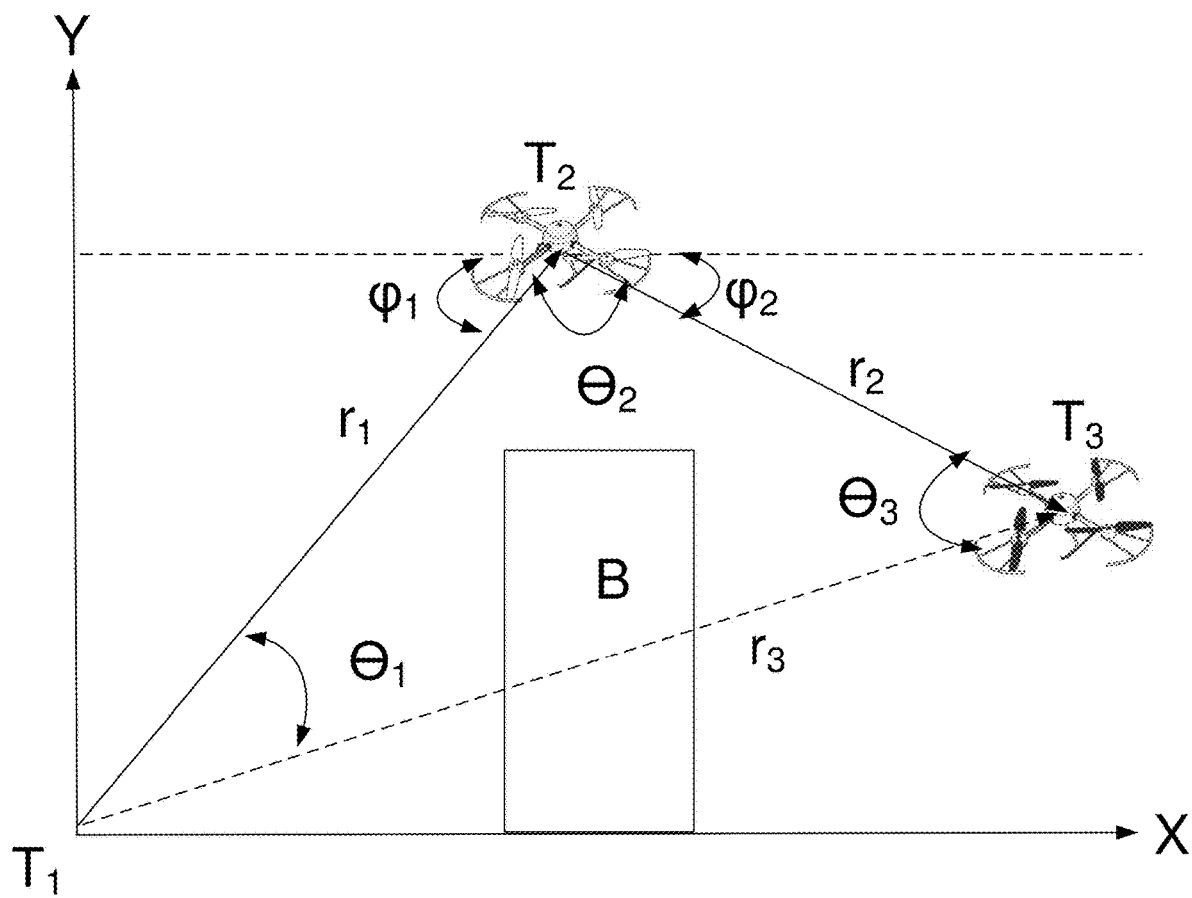
FIG. 15 illustrates exemplary methods of computing the distance between two Nodes not having line-of-sight communications between each other.

Referring briefly to FIG. 15, an exemplary method of computing the distance between two nodes not having line-of-sight communications between each other is shown. In this example, it will be assumed that the nodes and the vectors between them can accurately be projected into a two-dimensional, coplanar space, as shown in FIG. 15. This may also be appropriate in situations in which, for example, three linearly independent axes can be determined (e.g., x, y, and z), but one of those axes is not of interest.

For the purposes of this discussion, let the distances between Nodes $T_1$ and $T_2$, $T_2$ and $T_3$, and $T_3$ and $T_1$ be $r_1$, $r_2$, and $r_3$, respectively. Let the angles between $r_3$ and $r_1$, $r_1$ and $r_2$, and $r_2$ and $r_3$ be $\theta_1$, $\theta_2$, and $\theta_3$, respectively. As described above, the magnitudes of $r_1$ and $r_2$ may be known using the methods disclosed herein. The present invention also allows the position of $T_3$ to be communicated to $T_1$ using $T_2$ as a relay in a variety of ways; one exemplary way is as follows.

A straightforward way of computing the magnitude of $r_3$ is to use the law of cosines. Doing so requires knowledge of at least $\theta_1$, $\theta_2$, or $\theta_3$. $\theta_2$ can be determined in multiple ways, depending on the specifics of the deployment of $T_1$, $T_2$, and $T_3$, as well as the specific Bluetooth 5.1 implementations of each. For example, in some embodiments, $\theta_2$ may merely be any of: the angle of arrival at $T_2$ or the angle of departure at $T_2$. In embodiments in which a central controller effectively creates a map of the Nodes and translates them into a coordinate system, then 02 may be determined using a dot product or other norm between the vectors represented by $r_1$ and $r_2$. In other embodiments, $\theta_2$ may be determined geometrically as discussed in further detail below. In still other embodiments (particularly those employing a central controller), the vector represented by $r_2$ may be translated to the origin (shown in FIG. 15 as $T_1$) or otherwise measured to determine its magnitudes in each axis of the chosen coordinate system. This may then be used to determine the magnitude of $r_3$, as in the embodiment shown in FIG. 15, $r_3$ is the vector sum of $r_1$ and $r_2$.

Assuming $r_1$, $r_2$, and $\theta_2$ are known with accuracy, then the law of cosines provides that $r_3$ is simply equal to the positive square root of $r_1^2 + r_2^2 - 2r_1r_2 \cos(\theta_2)$. (This computation may also be applicable in three-dimensional models.) In practice, however, some or all of these quantities may be subject to uncertainty. Accordingly, in some embodiments, several methods of computing $r_3$ (some of which are discussed below) may be used, and a weighted average of these computations may be taken to more accurately determine $r_3$. Moreover, the methods discussed below may produce additional quantities that may be desirable in some embodiments, such as a virtual angle of arrival of a signal from node $T_3$ to node $T_1$.

In some embodiments, $\theta_2$ may not be cleanly determinable as simply an angle of arrival/departure of a signal at $T_2$. However, in some embodiments, the angles of arrival/departure at $T_2$ may be determined with reference to an axis drawn parallel to the x axis, as shown in dashed lines in the figure. Let these angles be $\varphi_1$ and $\varphi_2$. If $\varphi_1$ and $\varphi_2$ are determined with accuracy, then $theta_2$ is $180°-\varphi_1-\varphi_2$, and the computation of $r_3$ can proceed as discussed above.

Given $r_3$, other useful quantities may be computed. For example, although the figure shows $\theta_3$, it may not be immediately quantifiable as an angle of arrival/departure because $\theta_3$ represents the angle between $r_2$ (i.e., the vector connecting $T_2$ to $T_3$, the magnitude of which is known a priori in some embodiments due to the line-of-sight tracking described herein) and $r_3$ (which is a virtual vector that has unknown characteristics a priori due to the lack of a line of sight between $T_3$ and $T_1$). But once $r_3$ and $\theta_2$ have been determined, then $\theta_3$ is the arcsine of $(r_1/r_3) \sin \theta_2$. Similarly, $\theta_1$ is the arcsine of $(r_2/r_3) \sin \theta_2$.

Referring back to FIG. 13B, analysis techniques, such as artificial-intelligence techniques, may also use a difference in a position calculated trigonometrically and via delayed line-of-sight to calculate an interference factor of a particular wall, material, etc. (such as blockade B). This may be used in subsequent transmissions that may pass through the particular wall, material, etc. to more accurately estimate the impact of the wall, material, etc. on the transmission. While the blockade B 1370 is stationary and static, it may be possible to determine a calibration factor for signal changes caused by blockade B 1370 that may allow for attenuated signals that come from self-verifying array Nodes that are behind the blockade to none the less be directly estimated for their relative position.

In addition, a known delay can be used to determine attributes of an obstruction, such as material type, thickness, proximity, etc. This may be particularly true when the blockade is uniform in its characteristics. Moreover, the trigonometric techniques discussed herein may assist in determining a lack of an obstruction between $T_1$ and $T_2$ at a given wavelength by comparing the expected trigonometric result with an empirically determined line-of-sight result.

It may be useful in controlling a particular space, to utilize a team of mobile devices to survey and surveil the space. In addition to the ability to surveil a region that has regions of blocked/impeded transmission, the mobile network can establish routine (but transitory) bridge links in a self-verifying array to communication Nodes that are remote, as has been described. In addition to these abilities, a mobile element that has an RFID reader capability may also pass over a space and "inventory" RFID tags attached to items for security, location and condition tracking.

As mentioned previously, low-energy Bluetooth-based Nodes may also be interrogated by mobile elements where these Nodes may also provide sensing capabilities. As a non-limiting example, a construction site may be modelled in an early version of an AVM for the Healthcare Facility and it may track the location of components that will be assembled into the Healthcare Facility as well as tools that may be used to construct the Healthcare Facility as they arrive and, in some cases, leave a job site.

In some embodiments, a mobile Node is moved about to multiple locations within a physical area, such as during variations occurring during a construction job site. As the Node is moved, a height and two-dimensional coordinates of the mobile Node may be varied such that it becomes possible for the mobile Node to communicate with other Nodes in or proximate to the physical area.

In some embodiments, the mobile Node may additionally communicate with other transceiver, such as a Bluetooth Node transmitter, an RFID transceiver, ultrasonic transceiver, infrared transceiver and the like. In some embodiments, the mobile Node may additionally transmit wireless energy to a receiving Node, RFID, or transmitter Node specifically to energize the receiving Node, RFID, or transmitter Node, and enable transceiving by the energy receiving Node, RFID, or transmitter Node.

Referring now to FIG. 14, method steps that may be implemented in some embodiments of the present invention are illustrated. At method step 1401, in some examples, a user may begin by installing wireless access points into a building Healthcare Facility as it is built. In other embodiments, the wireless access points may be added into the Healthcare Facility after it is built.

Continuing to method step 1402, a process may next be initiated that may establish a self-verifying array between the installed wireless access points and other devices that are within the communications range of the installed wireless access points. Security protocols may control whether a particular communications element that is within range of such a self-verifying array may gain access.

Continuing to method step 1403, the self-verifying array may detect an entry of a wireless transmitter into an area covered by the self-verifying array. Entry may involve a physical movement of the wireless transmitter or the virtual movement of the coverage of the self-verifying array to include the wireless transmitter. Entry may also include reception of a previously unreceived signal from a wireless transmitter. In some embodiments, entry may include reception of a previously unreceived frequency of a signal from a wireless transmitter. For example, it may be desirable not to detect the wireless transmitter until a chosen time, at which point a switch or other apparatus may vary the frequency of the signal from the wireless transmitter.

Depending on various security protocols and generalized network protocols, an optional method step at 1404 may be performed to incorporate a newly detected wireless transmitter (such as a mobile device) into communications with the self-verifying array. Proceeding to Step 1405, the network may optionally be configured by a user to direct a movement of one of its mobile wireless access points into a new location while still maintaining its communications capabilities with the self-verifying array. Proceeding to Step 1406, the network may optionally be configured by a user to direct a movement of one of its mobile wireless access points to a location where it can simultaneously be connected to the self-verifying array while also establishing communications interchange with a device capable of wireless communications where the device may otherwise not be in range with the self-verifying array.

Commercial Implementations of Self-Verifying Array of Nodes

Self-verifying arrays of Nodes are applicable in many diverse commercial implementations. The following paragraphs describe several diverse implementations utilizing a S VAN.

Referring now to FIG. 16, method steps are illustrated for deploying a SVAN to quantify conditions in a Healthcare Facility. The Healthcare Facility may include, for example, patient rooms, hallways, Resource rooms and the like.

At step 1601, a first Node may be fixedly attached to, placed inside of, or otherwise co-located with a transport apparatus. The Node will move with the transport apparatus as the transport apparatus moves.

At step 1602, a unique identifier associated with the first Node may also be associated with the transport apparatus with which the Node is co-located. For example, a database may store an association with the unique identifier of the first Node with a Transport apparatus Identification Number (VIN) of the transport apparatus.

At step 1603, reference position Nodes other than the first Node may be located at strategic placements within or proximate to the Healthcare Facility. In some embodiments, the strategic placements selected for reference point Nodes may be based upon one or more of: a shape of Healthcare Facility; a wireless modality distance capability; a presence of obstacles within an area occupied by a SVAN; obstacles to wireless transmission, such as medical equipment and the like.

At step 1604, one or more Nodes included in a SVAN may be designated as a Base Node. Base Nodes may be operative to perform functions not necessarily performed by Nodes that are not Base Nodes. For example, Base Nodes may aggregate data over time, perform controller functions, transmit data via more than one wireless modality, be powered by utility-based alternating current, or communicate via a hardwired medium (e.g., via ethernet cabling).

At step 1605, one or more of the Nodes may communicate with other Nodes. Preferably, each Node will communicate with each other node within range of a communication Modality. In some embodiments, a pattern of Node communication may be followed.

At step 1606, in some embodiments, a pattern of communication may stagger a time of wireless communication in order to avoid interference of one communication by another communication. A pattern of communication may therefore include a "cascade" or hierarchical tree of wireless communication transmission and receipt. For example, a Base Node may communicate first, followed by a first generation of Nodes that receive a communication from the Base Node, and followed by communicating from the first generation of Nodes with a second generation of Nodes (e.g., Nodes that are out of range or obstructed from communicating with the Base Node), then to third generation Nodes, etc.

At step 1607, one or more Nodes within the SVAN may be designated to communicate with a network access device extraneous to the SVAN. For example, a designated Node may aggregate data, such as an aggregation of values for communication variables or sensor-generated data; and communicate the aggregated data to a destination outside of the SVAN (such as, via a cellular transmission or an IP Protocol transmission).

At step 1608, in some embodiments, a SVAN may be defined based upon an ability of SVAN participant Nodes to communicate with each other via a primary communication Modality. For example, a primary communication modality may include a Bluetooth modality, Wi-Fi, Wi-Fi RTT, sub-GHz radio transmission and the like. A secondary communication modality may include IP transmission, a cellular transmission, sub-GHz communication and the like.

At step 1609, some Nodes may be excluded, based upon an inclusion or exclusion criteria. For example, in some embodiments, only Nodes with unique IDs may be included in a SVAN, or only Nodes with unique IDs associated with transport apparatus prepped for deployment (e.g., immediate use) may be included in a SVAN, alternatively, Nodes with IDs associated with transport apparatus recently made available due to delivery of a patient and/or a transport apparatus that is occupied may be excluded from a SVAN.

At step 1610, communication variable values may be aggregated. For example, one or more Nodes or a controller may aggregate and store data that is based upon, or quantifies, what transpires during a wireless communication. Examples of data that quantifies, or is based upon, what transpires during a wireless communication, may include, by way of non-limiting example, one or more of: a time of transmission, a time of receipt of a transmission, a phase angle of receipt of a transmission of a single antenna, a respective phase angle of receipt of same transmission by multiple antennas (which may include multiple antennas in one or more arrays of antennas). Other variables may include an amplitude of a received transmission, and a noise factor of a received transmission.

At step 1611, a respective location of some or all of the Nodes in the SVAN may be generated, based upon the values for communication variables that are descriptive of communications with the respective nodes.

At step 1612, in some embodiments, an algorithm (such as those discussed herein) may be provided with values from the aggregated communication variable values to determine a location of a Node. Multiple sets of values and/or multiple algorithms may be used to disparately determine a set of locations for a particular Node. The set of locations for the particular Node may in turn by mathematically reconciled to determine a best location for the Node. For example, outlier sets of values may be set aside, included sets of values, and/or the set of locations for the particular Node may be used to generate an average, a median, a weighted average, or other combined value.

At step 1613, a location of some or all Nodes in a SVAN may be plotted in a graphical representation. The location for a Node may be the locations determined as described herein. In some embodiments, the unique IDs for plotted Nodes may be included in the graphical representation. Alternatively, or in addition to, the unique IDs, an annotation associated with a particular Node may be included in the graphical representation. A graphical representation may include one or both of two-dimensional and three-dimensional models of space occupied by the SVAN. In some embodiments, these spatial models may be augmented with a time variable (e.g., by displaying a change in an area covered by a SVAN over time).

At step 1614, in some embodiments, a position of an Agent-supported Smart Device may be determined relative to one or more of the Nodes in a SVAN. The Agent-supported Smart Device may be a smart phone carried by a person or a smart device attached to a UAV or UGV. In some embodiments, the smart device will be programmed to communicate with a Base Node when the determines that it is within communication range with the Base Node using a predetermined communication modality. For example, a GPS position calculated by smart phone may indicate that the smart phone is within Bluetooth 5.1 range of a particular Base Node. The smart phone, acting as a Node, may then initiate Bluetooth 5.1 communication with the particular Base Node.

At step 1615, using Orienteering methods, the SVAN may guide an Agent supporting a Smart Device to a particular transport apparatus. A controller may receive position information of the transport and the Agent's smart phone and modify the graphical user interface on the Agent's smart phone to provide directions to the transport. As the Agent's smart phone begins the process by communicating with a first set of Nodes (that are within communication range of the Agent's smart phone), and as the Agent traverses a Healthcare Facility (or areas proximate to the Healthcare Facility), the Agent's smart phone may transition to communicating with additional Nodes as those additional Nodes come with range of the smart phone. A graphical user interface will be modified as the Agent traverses the Healthcare Facility.

At step 1616, in some embodiments, an angle of a viewing screen of the Agent's smart phone relative to a ground plane may be determined as the Agent communicates with the SVAN. The angle of a viewing screen may help determine if an image captured via operation of a smart phone onboard-CCD image generator or other Image Capture Device is suitable for inclusion in a graphical user interface. For example, most smart device-onboard CCD Image Capture Devices have a field of view that is generally perpendicular to a viewing screen of a smart phone. Consequently, an Agent may hold up the Agent's smart phone at an angle generally perpendicular to the ground plane and capture a view of an area towards which the Agent is walking.

At step 1617, a graphical user interface may be overlaid on top of an image captured by the CCD Image Capture Device in a position perpendicular to the ground plane. Positions of Nodes within the field of view of the CCD device may be indicated in combination with the image data captured by the CCD device, based upon the verified position of the CCD device, an angle at which the CCD device is being supported and a direction of interest determined via automated Orienteering apparatus and methods.

Embodiments may include the positions of the Nodes within the field of view of an Image Capture Device associated with the smart phone being indicated as the transport apparatus with which they are associated, and information related to those transport apparatus. Information may include, for example, an indication of which transport apparatus is being associated with the smart device; which transport apparatus need service; a transport apparatus type; which transport apparatus are recently returned; etc.

At step 1618, the graphical user interface may also include annotations or other details as they relate to the Nodes and/or the associated transport apparatus and/or aspects included in the field of view, such as an exit, an office, or other detail.

At step 1619, in another aspect, some embodiments may include an overlay of image data captured in a field of view with information descriptive of, or related to a Node with a position within the Field of View. Node information may include, for example, the unique ID associated with the Node, a Node model, battery charge remaining, signal strength, time of last communication, details of data stored on the Node, amount of storage left in the Node, etc. In some embodiments, Nodes included in a GUI may be limited to those Nodes associated with transport apparatus and not display Nodes deployed as reference position Nodes or associated with other items.

At step 1620, in still another aspect, in some embodiments, a Node fixed to or within a transport apparatus may continue to communicate after it exits a Healthcare Facility. For example, if a Node is able to communicate with another Node, one or both of the Nodes external to the Healthcare Facility may note a GPS location and store the GPS location in a manner associated with the Node to Node communication. If a Node is in a transport apparatus that is in motion, the Node may also note aspects of the travel of the transport apparatus in which the Node is located, such as, one or more of: speed, acceleration, transport apparatus diagnostics. Similarly, the Node may note a speed, acceleration and location of a Node with which it is communicating. All or some communication data generated as a result of the Node-to-Node communication may be transmitted via a modality other than a modality used for the Node-to-Node communication. For example, if Node-to-Node communication is accomplished via a Bluetooth modality or a sub-GHz modality, the information resulting from the Node-to-Node communication may be retransmitted via a cellular or IP modality to an off-SVAN destination. Off-SVAN destinations may include, for example, a server, a controller or a smart device, in logical communication with the Internet or a cellular connection.

Referring now to FIG. 17, method steps are illustrated for deploying a SVAN to manage activities, materials and people.

At step 1701, a unique Node ID is associated with one or more of: Healthcare Agent, equipment, medical supplies or resource to provide positional reference.

At step 1702, a first Node may be fixedly attached to, placed inside of, or otherwise co-located with one or more of: The Agent, resource, equipment, or a reference point.

At step 1703, reference point Nodes are located at strategic points within or proximate to the Healthcare Facility. In some embodiments, the strategic placements selected for reference point Nodes maybe based upon one or more of: a shape of the Healthcare Facility; a wireless modality distance capability; a presence of obstacles within an area occupied by a SVAN; at ends of hallways, and the like.

At step 1704, one or more Nodes included in a SVAN may be designated as a Base Node. Base Nodes may be operative to perform functions not necessarily performed by Nodes that are not Base Nodes. For example, Base Nodes may aggregate data over time, perform controller functions, transmit data via more than one wireless Modality, be powered by utility-based alternating current, or communicate via a hardwired medium (e.g., ethernet cabling).

At step 1705, one or more of the Nodes may communicate with other Nodes. Preferably, each Node will communicate with each other node within range of a communication modality. In some embodiments, a pattern of Node communication may be followed.

At step 1706, in some embodiments, a pattern of communication may stagger a time of wireless communication in order to avoid interference of one communication by another communication. A pattern of communication may therefore include a "cascade" or hierarchical tree of wireless communication transmission and receipt. For example, a Base Node may communicate first, followed by a first generation of Nodes that receive a communication from the Base Node, follow up by communication from the first generation of Nodes with a second generation of Nodes (e.g., Nodes that are out of range or obstructed from communicating with the Base Node), then to third generation Nodes, etc.

At step 1707, one or more Nodes within the SVAN may be designated to communicate with a network access device extraneous to the SVAN. For example, a designated Node may aggregate data, such as an aggregation of values for communication variables or sensor-generated data; and communicate the aggregated data to a destination outside of the SVAN (such as via a cellular transmission or an IP transmission).

At step 1708, in some embodiments, a SVAN may be defined based upon an ability of SVAN participant Nodes to communicate with each other via a primary communication modality. For example, a primary communication modality may include a Bluetooth modality, Wi-Fi, Wi-Fi RTT, sub GHz radio transmission and the like, and a secondary communication modality may include IP Protocol transmission, a cellular transmission, sub-GHz communication and the like.

At step 1709, some Nodes may be excluded based upon an inclusion or exclusion criteria. For example, in some embodiments, only Nodes with unique IDs associated with a particular type of equipment may be included in a SVAN, or only Nodes with unique IDs associated with materials prepped for deployment (e.g., immediate assembly into a structure) may be included in a SVAN. Alternatively, Nodes with IDs associated with construction equipment recently returned or in need of service may be excluded from a SVAN.

At step 1710, communication variable values may be aggregated. For example, one or more Nodes or a controller may aggregate and store data that is based upon, or quantifies, what transpires during a wireless communication. Examples of data that quantifies, or is based upon, what transpires during a wireless communication, may include, by way of non-limiting example, one or more of: a time of transmission, a time of receipt of a transmission, a phase angle of receipt of a transmission of a single antenna, a respective phase angle of receipt of same transmission by multiple antennas (which may include multiple antennas in one or more arrays of antennas). Other variables may include an amplitude of a received transmission, and a noise factor of a received transmission.

At step 1711, a respective location of some or all of the Nodes in the SVAN may be generated, based upon the values for communication variables that are descriptive of communications with the respective nodes. Methods and variables involved in determining a location for a Node are discussed extensively herein.

At step 1712, in some embodiments, an algorithm (such as those discussed herein) may be provided with values from the aggregated communication variable values to determine a location of a Node. Multiple sets of values and/or multiple algorithms may be used to disparately determine a set of locations for a particular Node. The set of locations for the particular Node may in turn be mathematically reconciled to determine a best location for the Node. For example, outlier sets of values may be set aside. Included sets of values and/or the set of locations for the particular Node may be used to generate an average, weighted average, or other combined value.

At step 1713, a location of some or all Nodes in a SVAN may be plotted in a graphical representation. The location for a Node may be the locations determined as described herein. In some embodiments, the unique IDs for plotted Nodes may be included in the graphical representation. Alternatively, or in addition to, the unique IDs, an annotation associated with a particular Node may be included in the graphical representation. A graphical representation may include one or both of two-dimensional and three-dimensional models of space occupied by the SVAN.

At step 1714, in some embodiments, a position of an Agent-supported Smart Device may be determined relative to one or more of the Nodes in a SVAN. The Agent-supported Smart Device may be a smart phone carried by a person or a smart device attached to a UAV or UGV. In some embodiments, the Smart Device will be programmed to communicate with a Base Node when the Smart Device determines that it is within communication range with the Base Node using a predetermined communication modality. For example, a GPS position calculated by a smart phone may indicate that the smart phone is within Bluetooth 5.1 range of a particular Base Node. The smart phone, acting as a Node, may then initiate Bluetooth 5.1 communication with the particular Base Node.

At step 1715, using Orienteering methods, the SVAN may guide an Agent supporting a Smart Device to a particular piece of equipment, a set of materials, a staging area, a drop off area, an office, or the like. A controller may receive position information of the equipment and the smart phone and modify the graphical user interface on the smart phone to provide directions to the equipment. An Agent's Smart Device may begin the process by communicating with a first set of Nodes (that are within communication range of the smart device), and as the Agent traverses a construction site (or areas proximate to the construction site), the Agent's smart device may transition to communicating with additional Nodes as those additional Nodes come with range of the smart phone. A graphical user interface may be modified as the Agent traverses the site to reflect in real time a relative location of the Agent and the equipment.

In general, a user interface may be displayed upon a Smart Device, touch screen or other human ascertainable mechanism. The interface may display positions of Nodes and/or associated Sensors, associated Healthcare Facility aspects, communications paths between Nodes, communications interrupted by perceived obstructions, locations of items of interest, locations of Agents, locations of non-Agent persons and the like.

At step 1716, in some embodiments, an angle of a viewing screen of the customer's smart phone relative to a ground plane may be determined as the customer communicates with the SVAN. The angle of a viewing screen may help determine if an image captured via operation of a smart phone onboard CCD image generator or other Image Capture Device is suitable for inclusion in a graphical user interface. For example, most smart device-onboard CCD Image Capture Devices have a field of view that is generally perpendicular to a viewing screen of a smart phone. Consequently, an Agent may hold up the smart phone at an angle generally perpendicular to the ground plane and capture a view of an area.

At step 1717, a graphical user interface may be overlaid on top of an image captured by the CCD image capture device in a position perpendicular to the ground plane. Positions of Nodes within the field of view of the CCD device may be indicated in combination with the image data captured by the CCD device, based upon the verified position of the CCD device, an angle at which the CCD device is being supported and a direction of interest determined via automated Orienteering apparatus and methods.

At step 1718, the graphical user interface may also include annotations or other details as they relate to the Nodes and/or the associated equipment, material, structural aspects, agents and/or aspects included in the Field of View, such as a site topographic drawing references or other detail.

At step 1719, in another aspect, some embodiments may include an overlay of image data captured in a field of view with information descriptive of, or related to a Node with a position within the Field of View. Node information may include, for example the unique ID associated with the Node, a Node model, battery charge remaining, signal strength, time of last communication, details of data stored on the Node, amount of storage left in the Node, etc. In some embodiments, Nodes included in a GUI may be limited to those Nodes associated with equipment, materials, agents, and the like. The GUI may not display Nodes deployed as reference position Nodes or associated with other items.

At step 1720, in some embodiments, Node information may be integrated into Augmented Virtual Model (CAD), as well as any sensor co-located with Nodes.

Referring now to FIG. 18, method steps are illustrated for deploying a SVAN to quantify conditions in a Healthcare Facility.

At step 1801, a unique ID number is associated with a Node ID.

At step 1802, respective Nodes are placed within, or proximate to, multiple respective defined resources or patient rooms.

At step 1803, a Sensor and/or Sensor assembly, such as a multi-sensor module, is placed win logical communication with at least one Node that is within or proximate to each disparate defined occupancy space. In some embodiments, the strategic placement of Nodes maybe based upon one or more of: a shape of the Healthcare Facility; a wireless modality distance capability; a presence of obstacles within an area occupied by a SVAN; at ends of constructed elements on a construction site, and the like.

At step 1804, one or more Nodes included in a SVAN may be designated as a Base Node. Base Nodes may be operative to perform functions not necessarily performed by Nodes that are not Base Nodes. For example, Base Nodes may aggregate data over time, perform Controller functions, transmit data via more than one wireless Modality, be powered by utility-based A/C current, and/or communicate via a hardwired medium (e.g., ethernet cabling).

At step 1805, one or more of the Nodes may communicate with other Nodes. Preferably, each Node will communicate with each other Node within range of a communication modality. In some embodiments, a pattern of Node communication may be followed (e.g., through the cascading process described above).

At step 1806, in some embodiments, a pattern of communication may stagger a time of wireless communication in order to avoid interference of one communication by another communication. A pattern of communication may therefore include a "cascade" or hierarchical tree of wireless communication transmission and receipt. For example, a Base Node may communicate first, followed by a first generation of Nodes that receive a communication from the Base Node, followed by communication by the first generation of Nodes with a second generation of Nodes (e.g., Nodes that are out of range or obstructed from communicating with the Base Node), then to third generation Nodes, etc.

At step 1807, one or more Nodes within the SVAN may be designated to communicate with a network access device extraneous to the SVAN. For example, a designated Node may aggregate data, such as an aggregation of values for communication variables, Sensor-generated data; and communicate the aggregated data to a destination outside of the SVAN (such as, via a cellular transmission or an IP transmission).

At step 1808, in some embodiments, a SVAN may be defined based upon an ability of SVAN participant Nodes to communicate with each other via a primary communication modality. For example, a primary communication modality may include a Bluetooth modality (e.g., BT 5.1 or BLE), Wi-Fi, Wi-Fi RTT, sub-GHz radio transmission and the like, and a secondary communication modality may include IP transmission, a cellular transmission, sub-GHz communication and the like.

At step 1809, some Nodes may be excluded, based upon an inclusion or exclusion criteria. For example, in some embodiments, only Nodes with unique IDs associated with a particular occupant, or only Nodes with unique IDs associated with resources or patient rooms that Sensor readings indicate are vacant, may be included in a SVAN. Similarly, Nodes with IDs associated with a group of persons or an item of equipment, as well as reference point position Nodes, may be included in inclusion or exclusion criteria.

At step 1810, communication variable values may be aggregated. For example, one or more Nodes or a controller may aggregate and store data that is based upon, or quantifies, what transpires during a wireless communication. Examples of data that quantifies, or is based upon, what transpires during a wireless communication, may include, by way of non-limiting example, one or more of: a time of transmission, a time of receipt of a transmission, a phase angle of receipt of a transmission of a single antenna, a respective phase angle of receipt of same transmission by multiple antennas (which may include multiple antennas in one or more arrays of antennas). Other variables may include an amplitude of a received transmission, and a noise factor of a received transmission. Data generated by Sensors associated with the respective Nodes may also be aggregated.

At step 1811, a respective location of some, or all, of the Nodes in the SVAN may be generated, based upon the values for communication variables that are descriptive of communications with the respective nodes. Methods and variables involved in determining a location for a Node are discussed extensively herein.

At step 1812, in some embodiments, an algorithm (such as those discussed herein) may be provided with values from the aggregated communication variable values to determine a location of a Node. Multiple sets of values and/or multiple algorithms may be used to disparately determine a set of locations for a particular Node. The set of locations for the particular Node may in turn by mathematically reconciled to determine a best location for the Node. For example, outlier sets of values may be set aside, included sets of values, and/or the set of locations for the particular Node may be used to generate an average, a mean of other combined value.

At step 1813, a location of some, or all, Nodes in a SVAN may be plotted in a graphical representation. The location for a Node may be the locations determined as described herein. In some embodiments, the unique IDs for plotted Nodes may be included in the graphical representation. Alternatively, or in addition to, the unique IDs, an annotation associated with a particular Node may be included in the graphical representation. A graphical representation may include one or both of two-dimensional and three-dimensional models of space occupied by the SVAN.

At step 1814, in some embodiments, a position of an Agent-supported Smart Device may be determined relative to one or more of the Nodes in a SVAN. The Agent-supported Smart Device may be a smart device carried by a person, or a Smart Device attached to a UAV or UGV. In some embodiments, the Smart Device will be programmed to communicate with a Base Node when the Smart Device determines that it is within communication range with the Base Node using a predetermined communication modality. For example, a GPS position calculated by a smart device may indicate that the smart device is within Bluetooth 5.1 range of a particular Base Node. The smart device, acting as a Node may then initiate Bluetooth 5.1 communication with the particular Base Node.

At step 1815, using Orienteering methods, the SVAN may guide an Agent supporting a smart device to a particular piece of occupancy area, such as an occupancy area that Sensor data indicates is vacant or an area that the Sensor data indicates is occupied.

In some embodiments, a controller may receive position information of the resource or patient room and the Agent's smart device and modify the graphical user interface on the Agent's smart device to provide directions to a selected occupancy area. T The Agent's smart device may begin by being guided via processing of values for variables of communications with a first set of Nodes (what are within communication range of the Agent's smart device), and as the Agent traverses a structure containing the resources or patient rooms (or areas proximate to the occupancy area), the Agent's smart device may transition to communicating with additional Nodes as those additional Nodes come within range of the smart device. A graphical user interface may be modified as the Agent traverses the Healthcare Facility containing the resources or patient rooms to reflect in real time a relative location of the Agent and an area of interest At step 1816, in some embodiments, an angle of a viewing screen of the Agent's smart device relative to a ground plane may be determined as the Agent communicates with the SVAN. The angle of a viewing screen may help determine if an image captured via operation of a smart device onboard CCD image generator (e.g., charged coupled device camera) is suitable for inclusion in a graphical user interface. For example, most smart device onboard CCD image capture devices have a field of view that is generally perpendicular to a viewing screen of a smart device. Consequently, an Agent may hold up the Agent's smart device at an angle generally perpendicular to the ground plane and capture a view of an area towards which the Agent is walking.

At step 1817, a graphical user interface may be overlaid on top of an image captured by the CCD Image Capture Device in a position perpendicular to the ground plane, and positions of Nodes within the field of view of the CCD device may be indicated in combination with the image data captured by the CCD device, based upon the verified position of the CCD device, an angle at which the CCD device is being supported and a direction of interest determined via automated Orienteering apparatus and methods.

At step 1818, the graphical user interface may also include annotations or other details as they relate to the Nodes and/or the associated resources or patient rooms and/or aspects included in the field of view, such as a site topographic drawing references or other detail.

At step 1819, in another aspect, some embodiments may include an overlay of image data captured in a field of view with information descriptive of, or related to, a Node with a position within the field of view. Node information may include, for example, the unique ID associated with the Node, a Node model, battery charge remaining, signal strength, time of last communication, details of data stored on the Node, amount of storage left in the Node, etc. In some embodiments, Nodes included in a GUI may be limited to those Nodes associated with a particular resource or patient room. The GUI may or may not, upon discretion of a User or system manager, display Nodes deployed as reference position Nodes or associated with other items.

At step 1820, in some embodiments, Node information and resources or patient rooms may be integrated into an Augmented Virtual Model (AVM) as well as data from any Sensor co-located with Nodes.

Figure 19A:
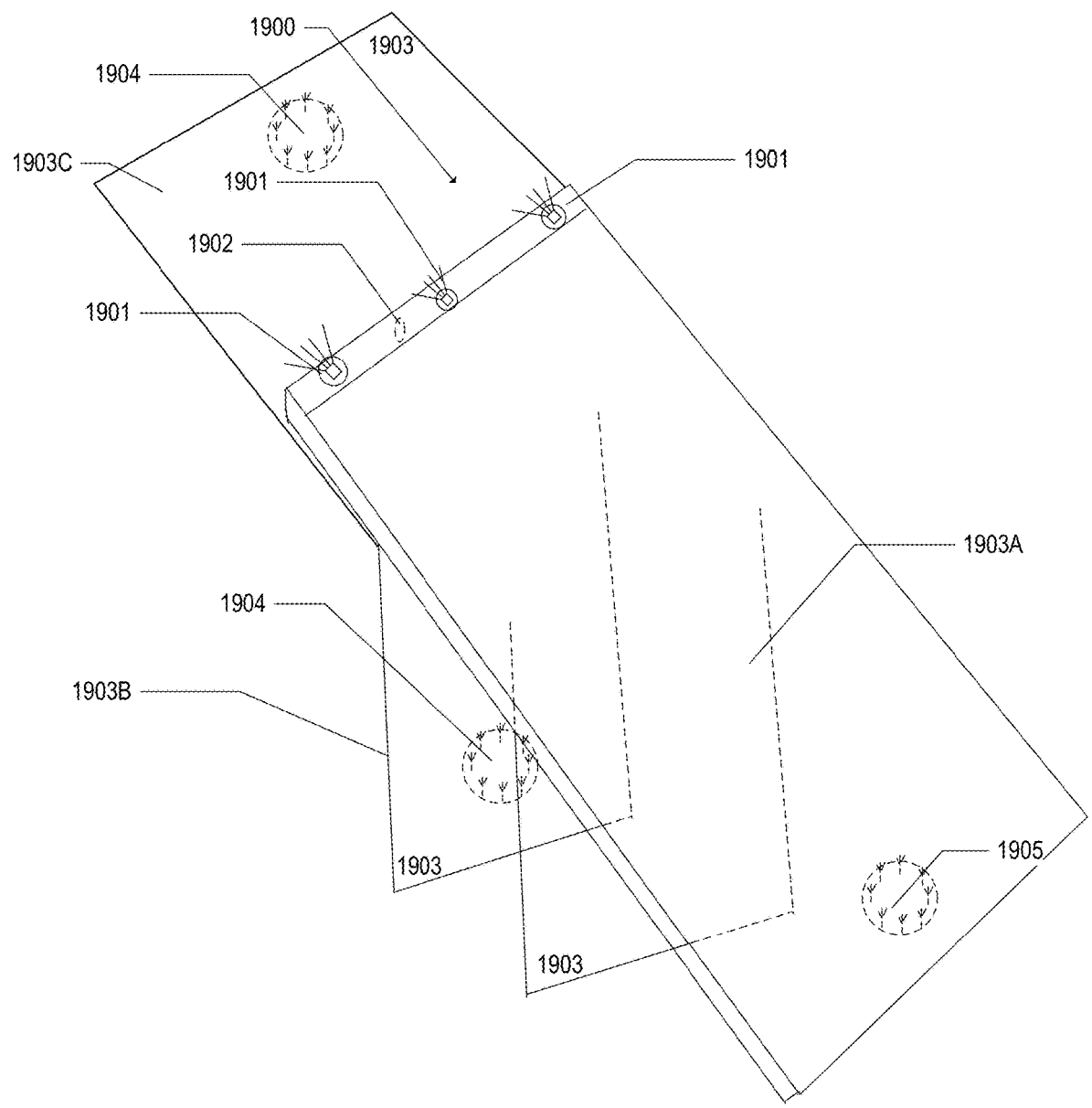
FIGS. 19A and 19B illustrate exemplary cases for a smart device having pucks containing directional antenna arrays that may be deployed at an increased distance from a smart device and at alternative angles from other pucks described in this disclosure.

Referring now to FIG. 19A, an alternative case 1900 for a smart device is shown. This embodiment, one or more foldable support posts 1903 that may be extended to different positions 1903A-C may be foldably extendable from case 1900. Support posts 1903 may include puck 1904 or a similar antenna array arrangement. This may be advantageous because it may increase the distance between a first puck 1904 and a second puck 1905 and/or Nodes 1901, relative to the embodiments described above as the. Increasing the distance between a first puck 1904 and a second puck 1905 and/or Nodes 1901 may increase an accuracy of calculations based transceiving involving the Nodes 1901 and pucks 1904-1905.

Moreover, in such embodiments, a direction of the directional arrays attached to pucks 1904-1905 may be oriented perpendicularly to the direction of the directional arrays in Nodes 1901. This may also advantageously improve accuracy.

Additionally, alternative case 1900 may include an Image Capture Device 1902 facing in a direction parallel to the orientation of the screen of the smart device. In this way, an agent can view the display of the smart device from a top-down perspective, while still receiving information about an item in a direction of interest in front of the agent. In some embodiments, this parallel-facing Image Capture Device 1902 may also be part of the smart device. As described above, in some embodiments, the Image Capture Device 1902 may have a fixed or varifocal lens and may comprise prisms to allow Image Capture Device 1902 to capture images at various angles relative to the angle of the lens. In this way, Image Capture Device 1902 may be operable to capture images in a direction consistent with the direction of the antenna arrays of Nodes 1901 or puck 1904 or both.

This may also be useful in embodiments that use only one antenna array (e.g., one Node 1901 or puck 1904-1905). One antenna array may be used in conjunction with the field-of-view angle of Image Capture Device 1902 (or a separate Image Capture Device) to determine a direction of interest.

As illustrated, the foldable support post 1903 may be extended to different positions 1903A, 1903B and 1903C. The different positions 1903A-C may be used to reposition the puck 1904.

Figure 19B:
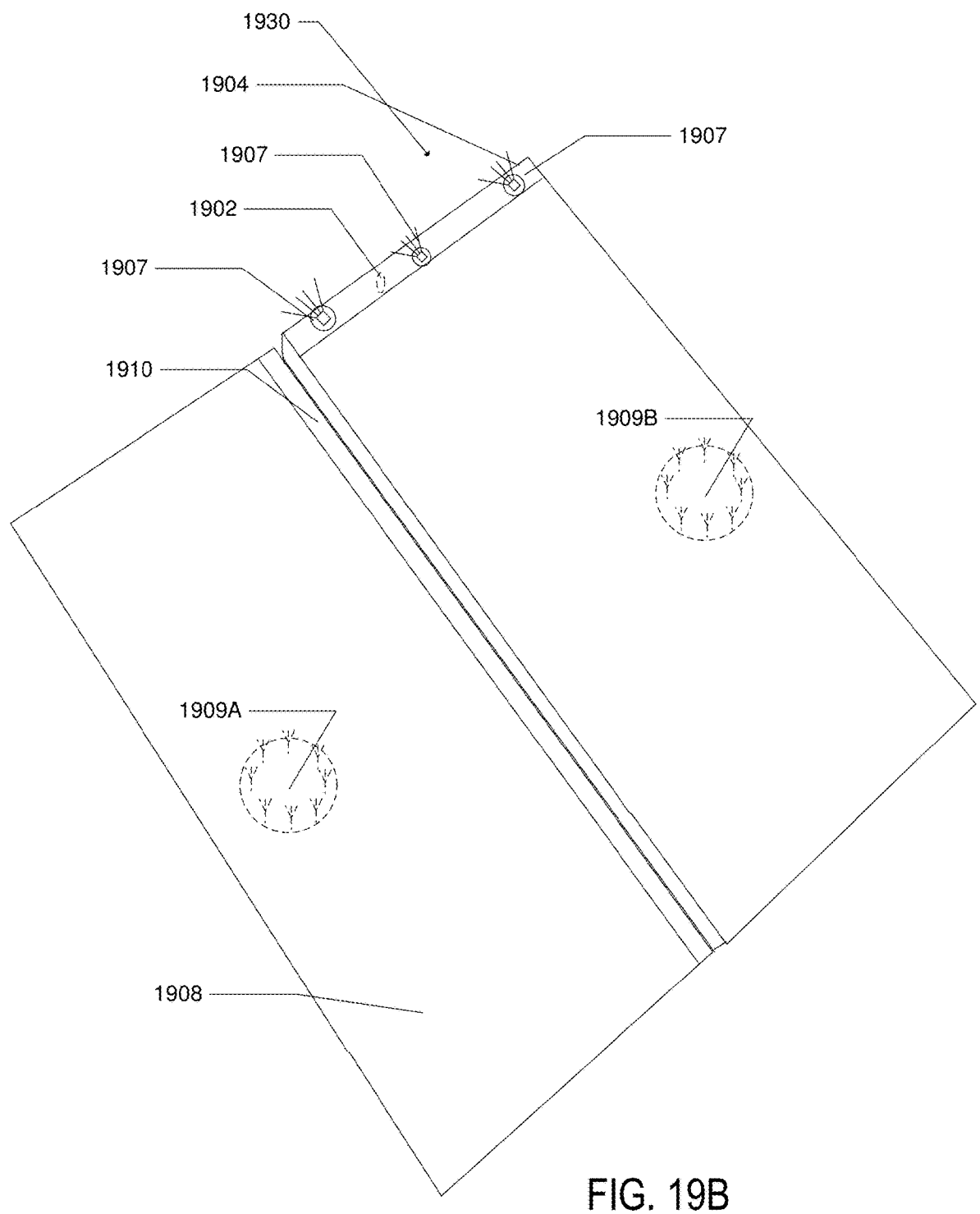

FIG. 19B shows a foldable case 1930. In this embodiment, instead of support posts that fold down from case 1900 to provide support to case 1900 at an angle, foldable case 1930 includes a puck 1909A on a sleeve 1908 that may fold parallel to foldable case 1930. The fold may be implemented in a variety of methods, such as using a foldable material to create crease 1910 or placing a hinge between sleeve 1908 and the body of foldable case 1930.

In this embodiment, the directional antennas of puck 1909B maintain the direction of the directional antennas of Nodes 1909A, but the increased distance between the two sets of directional antennas may produce additional accuracy as well. In some embodiments, puck 1909A may be placed on a side of sleeve 1908 that is in contact with the smart device when sleeve 1908 is folded over foldable case 1930;

in other embodiments, puck 1909A may be placed on a side of sleeve 1908 that may face perpendicular to a ground plane when sleeve 1908 is unfolded from foldable case 1930. The foldable sleeve may include nodes 1907.

In some embodiments, foldable case 1930 may also include additional lenses for Image Capture Device 1902 (or other Image Capture Devices associated with the smart device). In this way, when foldable case 1930 is aligned in certain ways over the lens of an Image Capture Device, the Image Capture Device may assume a different field of view, zoom level, or image angle than when unmodified by foldable case 1930.

Figure 20:
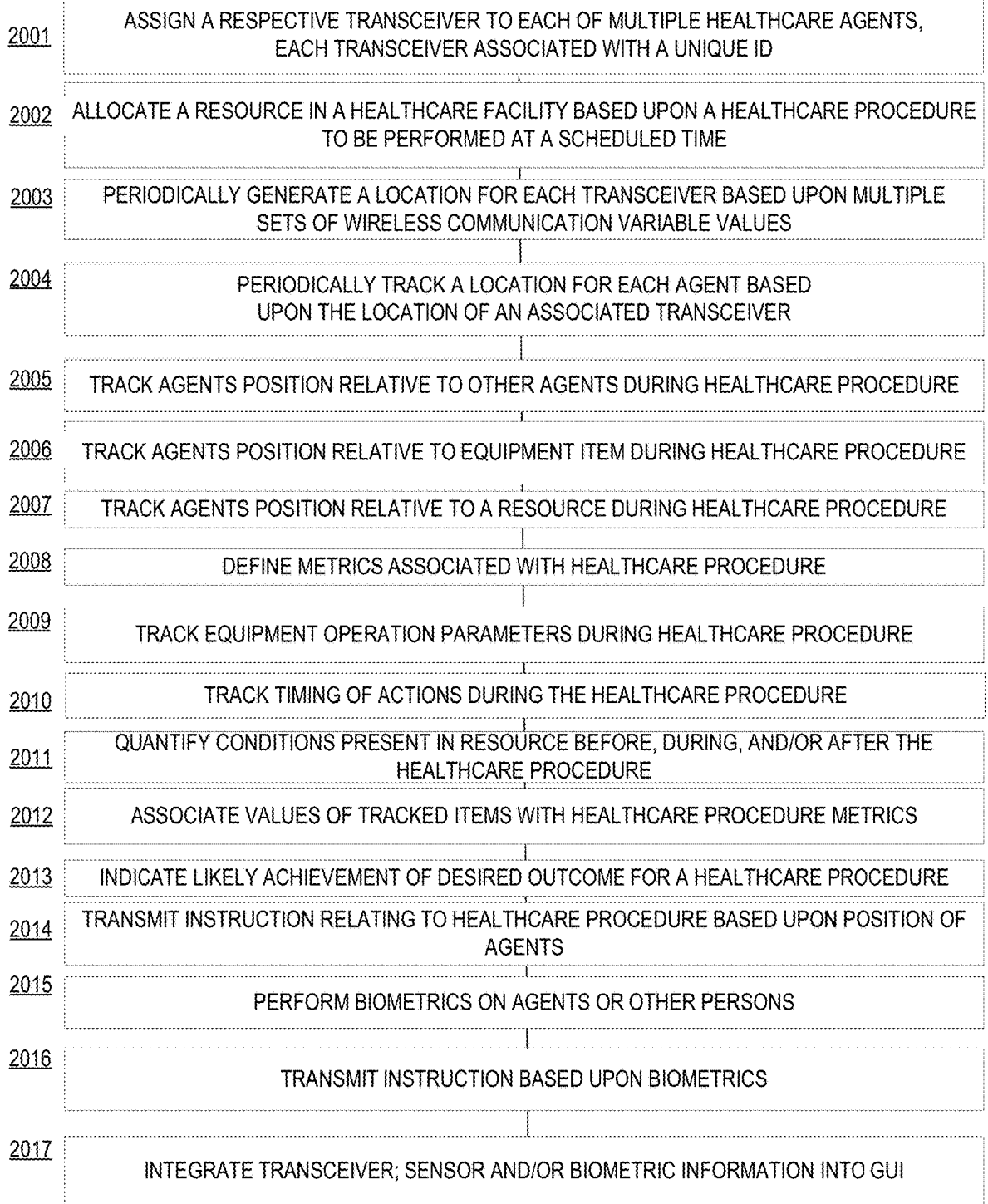
FIG. 20 illustrates additional method steps that may be performed in some embodiments of the present invention.

Referring now to FIG. 20, additional method steps that may be performed as part of the present invention and related to a procedure performed in the Healthcare facility. At step 2001, a transceiver, which may be in the form of a Node or a Tag, is assigned to each of multiple Agents. Each transceiver may be associated with a unique identifier (which may be a UUID).

At step 2002, a resource within the Healthcare Facility may be allocated to the healthcare procedure. The resource may be allocated based upon a time for which the procedure is scheduled, and a length of time required for completion of the procedure.

At step 2003, a location for one or more of the transceivers may be periodically generated based upon multiple sets of wireless communication variable values. Communication variables may include, for example, those involved in wireless triangulation and/or determination of an AoA and/or AoD and distance.

At step 2004, a location for one or more Agents may be periodically tracked based upon a location of an associated transceiver.

At step 2005, a position of an Agent may be tracked relative to other Agents. For example, a position of one Agent during a healthcare procedure may be determined and recorded relative to another Agent. Accordingly, it may be determined that a procedure has a higher success rate when a particular nurse, or technician is located to the right of a surgeon during surgery if the surgery involves a left side of a patient or other positioning related statistical conclusions. The present invention enables the gathering of data to ascertain best practices to obtain a desired outcome.

At step 2006, in a similar manner, a position of an Agent relative to one or more items of equipment may also be tracked. In this manner, it may be determined which Agent operated the equipment during a Healthcare procedure and when. In some embodiments, control commands provided by the Agent may also be quantified and recorded.

At step 2007, Agents may also be tracked relative to a resource. As an example, a resource may be an operating room and the methods and apparatus described herein may quantify and record which Agents where in the resource and when, such as prior to, during and post procedure.

At step 2008, metrics may be defined for ascertaining a degree of success of a procedure.

At step 2009, equipment parameters (and equipment location) may be tracked. Parameters may include operational settings and control commands input into the equipment.

At step 2010, in some embodiments, timing of actions may be recorded, as well as relative positions of Agents and equipment at the time of an action.

At step 2011, conditions present in a resource or the Healthcare Facility may be quantified, such as via operation of a sensor. The quantifications may be conducted prior to, during and after the procedure.

At step 2012, any values of tracked items may be compared with, or otherwise associated with a healthcare procedure.

At step 2013, the tracked values associated with the healthcare procedure may be referenced to provide an indication of a likelihood of achievement of a desired outcome. Tracked values may include, by way of non-limiting example, a location of Agents and/or Equipment, a condition quantified with a Sensor, a time of day, a day of week, a time of year, which Agents are present, which Healthcare Facility is involved, which steps are followed in conducting a procedure, etc.

At step 2014, in some embodiments, an instruction may be transmitted that relates to a healthcare procedure, the instruction may be based upon a position of an Agent and/or conditions quantified. For example, during a healthcare procedure, as the procedure is nearing a time of completion, a wireless communication may be transmitted to multiple transport technicians. In some embodiments, one or more of the transport technicians may be designated based upon availability of the transport technician and a location of the transport technician relative to a patient on which the healthcare procedure has been performed.

Other factors, such as a type of transport required and special needs or attributes of the patient may also be included in a decision of which transport technician to transmit a request to transport to, and/or a transmit a selection to transport to. In addition, in some embodiments, a transport technician may transmit back acceptance of a request to transport. In some embodiments, a transport technician may be required to perform a minimum number of transports within a timeframe in order to maintain a satisfactory performance rating and/or be eligible for a salary bonus or perk. The present invention provides location data and proximity to patients sufficient to enable alternatives to an hourly wage for exemplary transport technicians and other Agents.

At step 2015, biometrics may be performed on Agents, patients or other persons prior to, during and after a procedure. The biometrics may quantify almost any bodily function that is measurable via electronic Sensor.

At step 2016, an instruction may be transmitted based upon a biometric. Instructions may include, for example, proceed quickly, cease the procedure, remove an Agent from the resource room; perform a routine, or other action.

At step 2017, any or all location, Sensor, and Biometric data may be coordinated and included in a user interface generated by a controller. The user interface may be displayed upon a smart device worn by an Agent, a display mounted on a Resource wall or ceiling; on a Smart Device or on an equipment item.

Figure 21:
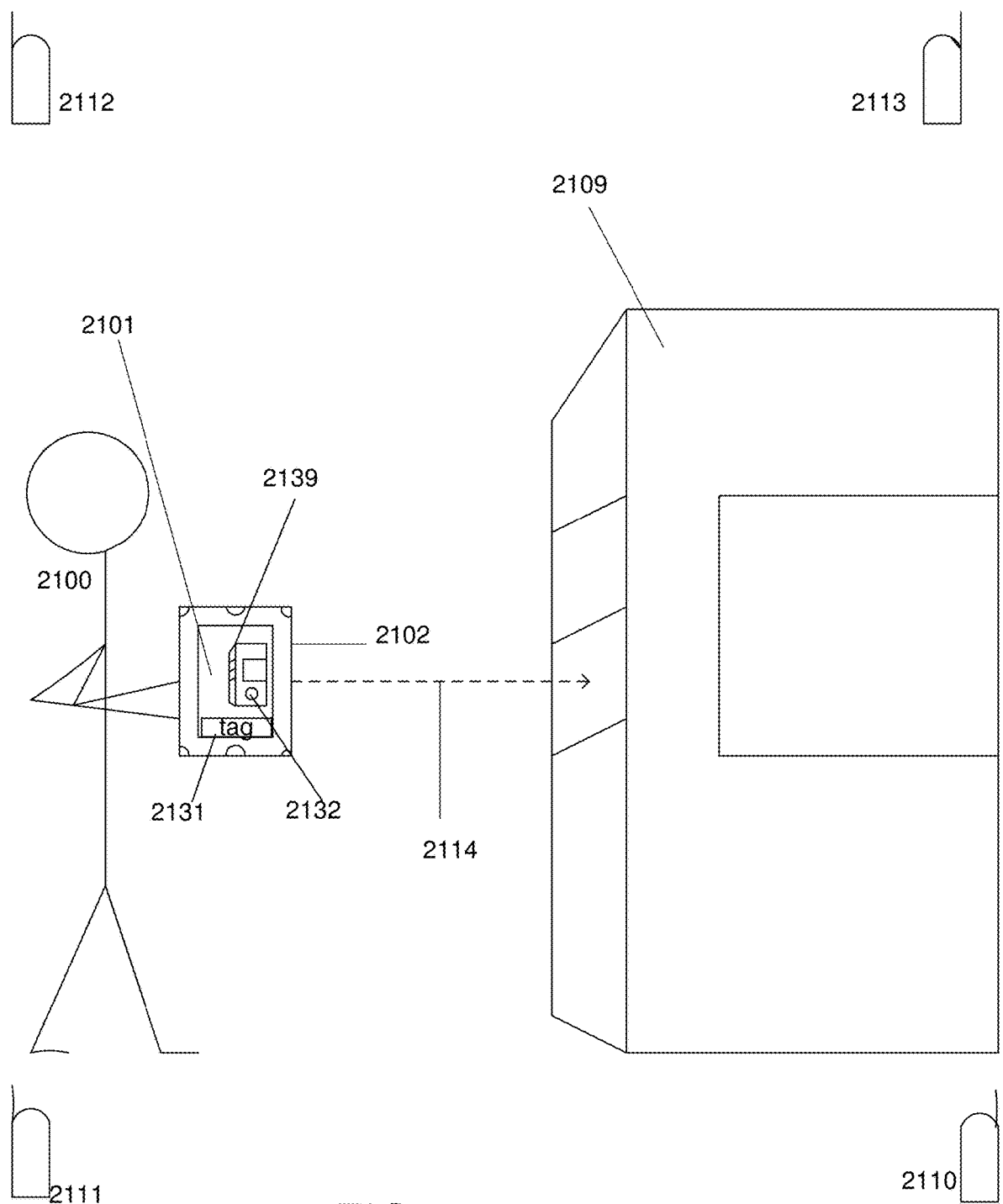
FIG. 21 illustrates a block diagram of aspects of the present invention involved in a process to virtually tag an item or location.

Referring now to FIGS. 21 and 22, in some embodiments, an Agent may associate a virtual tag with an item of interest or a location of interest. Similar to physical tags described herein that engage in wireless communication useful to determine a location based upon the wireless communication. A virtual tag has a smart device in wireless communication useful to determine of the smart device and then associates the determined location with the item of interest, or associated an offset of the determined location with the item of interest.

For example, an Agent may place a smart Device proximate to an item of interest and execute executable code to causes wireless communication with one or both of a Node(s) and a Reference Point Transceiver(s). A location of the Smart Device based upon the wireless communication between the Smart Device and the Node(s) and a Reference Point Transceiver(s). A location of a Virtual Tag may be congruent with the generated location of the Smart Device, or the Virtual Tag may be a location offset from the generated location of the Smart Device.

An offset of a location of the Smart Device may be determined, for example via a wireless determination of a position and orientation of the Smart Device and a further determination of a distance of the Smart Device in a direction based upon the orientation of the Smart Device to an item of interest. A distance to an item of interest may be estimated by the Agent, or determined via a sensor in logical communication with (or incorporated into) the Smart Device. Suitable sensors may include, by way of non-limiting example, a photoelectric sensor, such as the Sharp™ infrared proximity sensor (GPY0A21YK).

In addition, a virtual tag may correlate an item of interest and/or a location of interest (such as, for example, in an AVM) with information about the item of interest or location of interest. Similar to physical location Tags, information associated with a Virtual Tag may include location information, such as Cartesian or polar coordinate data with respect to a reference point. An Agent may also input or update information about the item of interest, such as for example via alphanumeric text, or an image captured with a CCD included in the Smart Device. For an item of interest with a virtual tag, the Agent may create the virtual tag in the AVM and input (automatically through the smart device) location information, image data, sensor data, and/or annotative entries. In this way, the virtual tag system may allow an agent to ad-hoc create designated items of interest with virtual tags.

The virtual tag may be applied to an item of interest in multiple ways. For example, an orienteering application on the smart device may provide an option to allow an Agent to designate a new item of interest. Upon selecting this option, a new data structure may be instantiated within the AVM or locally on the Agent's smart device that includes a location field. The location field may be populated by an item location. The item location may be determined in several ways.

In a first non-limiting example, the item location may be a location associated with the smart device. This location may be determined based on a GPS measurement or by the orienteering methods described herein that allow for more fine-grain location-finding. The location may also be determined by Bluetooth, NFC, or other communications protocols associated with the item of interest.

In some embodiments, the location associated with the virtual tag may be associated with a displacement from the smart device applying the virtual tag. This may occur in several ways. For example, an image capture device associated with the smart device may be pointed at the item of interest, such that upon choosing to apply the virtual tag, an image of the item may be captured. In exemplary embodiments, this image will have a smart-device location associated with the image (in the metadata of the image, for example) based on the location of the smart device when the image was captured. This smart-device location may be the same location described above (i.e., it may be determined based on a GPS or orienteering-based location of the smart device). By indicating a direction of interest (as described elsewhere herein) from the smart device in the direction of the item of interest, a displacement between the smart device and the item of interest may be computed. This displacement may be a default magnitude (e.g., the location of the virtual tag will be considered to be 10 cm away from the smart device and in the direction of interest). Alternatively, using well-known means like edge detection, lasers, sound generation analogous to echolocation, etc., the smart device may be able to choose in the image which object is the item of interest and estimate a distance between the smart device and the item of interest. Other methods of determining the distance between the smart device and the item of interest may be employed as well. Again, by combining at least (a) the location of the smart device; (b) the measured or approximated distance between the smart device and the item of interest; and (c) the measured direction of interest, the location data input into the virtual tag may correlate in a more advantageous way with the location of the item of interest.

Moreover, because a virtual tag may be applied "virtually" (i.e., through an interface on a smart device), an Agent may obtain even greater accuracy by designating on a graphical interface specifically which object is meant to be tagged. This may be advantageous in designating specific parts of an item of interest. For example, elsewhere in this disclosure and in related disclosures, Service Calls are discussed. In some embodiments, when an appliance is in need of maintenance, a system may request a service technician, who can be guided by the orienteering system to the appliance to effect necessary repairs. These repairs may not necessarily be completed in one Service Call. In addition to updating the entry in the AVM related to the appliance, the service technician may be able to apply a virtual tag to a specific portion of the appliance that needs additional attention, parts, or maintenance. This may be useful to remind the service technician (or a different technician) on subsequent visits of sub-items of interest related to the appliance.

Once a virtual tag is applied to an item of interest, a virtual icon associated with the virtual tag may appear on the Agent's smart device to indicate the location of the virtually tagged item. At that point, the Agent may include additional information relating to the item of interest, in a similar fashion to that described elsewhere. For example, after applying a virtual tag, the tag may be modifiable to include a last date of repair of the item of interest.

Although the above discussion relates to an "item" of interest, this is not meant to be limiting. For example, if an AVM or orienteering system as contemplated herein is deployed in a hospital, then an Agent may apply a virtual tag to a patient, a resource, an equipment item and/or a location. In addition to identifying a last-known location of the patient, the Agent may include additional information relating to the patient, such as medical or diagnostic information.

In some embodiments, the virtual tag may be applied locally to the Agent's smart device (i.e., only the Agent applying the virtual tag can see the virtual tag after applying it). In other embodiments, the virtual tag may be visible to any other Agents of the AVM through their respective smart devices. In such embodiments, the other Agents may be able to edit information associated with the virtually tagged item. The original Agent may be able to set a time after which the virtual tag "expires" and self-deletes, to ensure the AVM system does not become cluttered with virtual tags. In some embodiments, subsequent Agents may be able to edit the location of the virtual tag. For example, a subsequent Agent may be able to "drag and drop" an icon associated with the virtual tag on the graphical user interface. Moreover, the AVM may be operable to allow an administrator to modify or delete virtual tags from a centralized location, instead of needing to visit the physical location of the virtual tag.

In addition to assisting subsequent Agents, virtual tags may be useful to identify items of interest to simultaneous users of the AVM. For example, a method of using orienteering may include enhancing transport of patients throughout a healthcare facility. In one example of simultaneous use of virtual tags by multiple Agents, a team of Transport technicians may use virtual tags to quickly designate patients or items of interest for other members of a team of Healthcare providers to address. For example, a HCP using a heads-up display integrated into the HCP's headgear may place a virtual tag on a location of a patient or an item of equipment. Other HCPs may see this virtual tag appear on their displays thereafter.

In the above example, rapid data transfer may be necessary to achieve the purpose of virtual tagging. In situations where reallocation of available resources is important, or emergency situations, data transfer may be slower due to equipment limitations. Accordingly, in some embodiments, the application associated with the AVM may have multiple methods of virtual tagging. A "quick" virtual tag may be desirable in emergency situations. The quick virtual tag may not include some of the fine-grain location information described above (e.g., attempting to make quick, accurate measurements of a distance between a smart device and the item of interest). Moreover, in the situation described above, the emergency responder may not have access to virtual buttons to carefully indicate that a virtual tag is desired. In such situations, a voice command or a physical button press may be operable to virtually tag the general direction of interest faced by a smart device associated with the first responder. For example, continuing the example of the team of HCPs with heads-up displays in their visors, a temperature-resistant camera may also be placed proximate to the visor. By pressing a button, a virtual tag may be applied at a short displacement in the direction of interest faced by the camera. Such a virtual tag may require relatively little data transfer and therefore may be achieved in a short amount of time, as may be necessary in dangerous, emergency situations.

Referring now to FIG. 21, An exemplary application of a virtual tag is illustrated with Agent 2100 shown holding smart device 2102, which has GUI 2101. Shown on GUI 2101 is a virtual representation 2139 of machine 2109. Agent 2100 may press a button 2131 (which may be a virtual or physical button, or other indication of an intent to apply a virtual tag) to apply virtual tag 2132 to virtual representation 2139 of machine 2109. In some embodiments, Agent 2100 may indicate a direction of interest 2114 (using the methods described herein and in other applications in this family) to better assist in the positioning of virtual tag 2132, as described above. Virtual tag 2132 may comprise a data structure having an associated location, as determined with respect to wireless reference transceivers 2110-2113 and, optionally, direction of interest 2114.

An exemplary method of applying a virtual tag is shown in FIG. 22. At step 2201, a Smart Device is positioned proximate to an item of interest is located by an Agent. The item of interest may be an item of equipment, a resource, a patient room, an operation room, a machinery, apparatus, person, architectural feature, or any other item for which it may be desirous to have a location stored in a database and, optionally, additional information. At step 2202, the Agent indicates an item of interest, or a location of interest, to be virtually tagged using the Smart Device. Indication of an item an item or location of interest may be accomplished may be accomplished via the additional steps of 2203 indicating a direction of interest in relation to the smart device and at step 2204 determine a distance of the item of interest from the smart device, as discussed above. In some embodiments, a direction of interest may be signified with an auxiliary apparatus—such as a ring, wand, watch, or pointer—in logical connection with a smart device; or via one or more cameras capturing hand movement of an Agent.

At step 2205, the Agent generates a virtual tag. The Agent may also indicate the item of interest or the location of interest on the smart device. This may occur in a variety of ways. For example, if the smart device is a smart phone or other device having a graphical user interface (especially one in logical connection with an image capture device, such that an image of the item of interest is displayed on the graphical user interface), the Agent may "tap" the image of the item of interest as displayed on the smart device to indicate the approximate location of the item of interest. In some embodiments, the Agent need not specifically tap on the interface to indicate the item of interest; instead, edge-detection or other means may be used to analyze the image on the smart device to determine spatial coordinates correlated to possible items of interest. Lasers, accelerometers, or sound generators may also be used to determine a distance from the smart device to the item of interest.

In still other embodiments, an Agent may indicate a direction of interest using any of the means described within this application and others in the same family of patent applications. For example, the Agent may thrust the smart device toward the item of interest. The Agent may use a specialized smart device enclosure to indicate the direction of interest. Or the Agent may "point" toward the item of interest with an ancillary smart device, such as a wand.

At step 2206, the Agent may cause a virtual tag to be applied to the item of interest or location of interest. Application of the virtual tag may instantiate a data structure on the smart device (or, in some embodiments, in a controller or an AVM) that includes information about the item of interest, including a location associated with the item of interest. The location may be the location of the Smart Device. The location may also be related to the location determined by adding some offset or displacement to the location of the smart device. The displacement may be based on a number of factors and, be in the indicated direction of interest. The displacement may be a fixed value (e.g., 10 cm away from the smart device) or may use techniques that approximate how far away the item of interest is from the smart device (such as edge-detection, laser-measuring techniques, sound generation analogous to echolocation, etc.). Such techniques may result in a greater location value entered into the virtual tag data structure.

At step 2207, the virtual tag (and information associated therewith) may be uploaded to a controller and/or into an AVM. Uploading facilitates multiple Agents accessing the Virtual Tag and to view information about the virtual tag. However, in some embodiments, it may be desirable to only store the virtual tag locally on the Agent's smart device, depending upon the sensitivity of the information involved.

At step 2208, the Agent (or other users) may enter additional information into the virtual tag that correlates with the item of interest. For example, the Agent may enter medical data about a patient, technical data about an item of equipment, etc. The Agent may link a smart device reading to the virtual tag using Bluetooth, NFC, ANT etc., to allow for dynamic data updates.

Glossary

"Agent" as used herein refers to a person or automation capable of supporting a Smart Device at a geospatial location relative to a Ground Plane.

"Ambient Data" as used herein refers to data and data streams captured in an environment proximate to a Vantage Point and/or an equipment item that are not audio data or video data. Examples of Ambient Data include, but are not limited to, Sensor perception of: temperature, humidity, particulate, chemical presence, gas presence, light, electromagnetic radiation, electrical power, Moisture and mineral presence.

"Analog Sensor" and "Digital Sensor" as used herein include a Sensor operative to quantify a state in the physical world in an analog or digital representation, respectively.

"As Built" as used herein refers to details of a physical Healthcare Facility associated with a specific location within the physical Healthcare Facility or parcel and empirical data captured in relation to the specific location.

"As Built Features" as used herein refers to a feature in a virtual model or AVM that is based at least in part upon empirical data captured at or proximate to a correlating physical location of the feature. Examples of As Built Features include placement of structural components such as a wall, doorway, window, plumbing, electrical utility, machinery and/or improvements to a parcel, such as a well, septic, electric or water utility line, easement, berm, pond, wet land, retaining wall, driveway, right of way and the like.

"As Built Imagery" (Image Data) as used herein means image data generated based upon a physical aspect.

"Augmented Virtual Model" (sometimes referred to herein as "AVM") as used herein means a digital representation of a real Property parcel including one or more three-dimensional representations of physical Healthcare Facilities suitable for use and As Built data captured that is descriptive of the real Property parcel. An AVM includes As Built Features of the Healthcare Facility and may include improvements and features contained within a Healthcare Facility.

"Bluetooth" as used herein means the Wireless Personal Area Network (WPAN) standards managed and maintained by Bluetooth Special Interest Group (SIG). Unless otherwise specifically limited to a subset of all Bluetooth standards, the Bluetooth will encompass all Bluetooth standards (including, without limitation, Bluetooth 4.0; 5.0; 5.1 and BLE versions).

"Deployment" as used herein means the placement into operation of one or more of: a Healthcare Facility resource and an equipment item.

"Deployment Performance" as used herein means one or both of: objective and subjective quantification of how one or more of: Healthcare Facility, machinery and an equipment item operated, which may be depicted in an AVM.

"Design Feature" as used herein, means a value for a variable descriptive of a specific portion of a Property. A Design Feature may include, for example, a size and shape of a structural element or other aspect, such as a doorway, window, or beam; a material to be used; an electrical service; a plumbing aspect; a data service; placement of electrical and data outlets; a distance, a length, a number of steps; an incline; or other discernable value for a variable associated with a Healthcare Facility or Property feature.

"Digital Sensor" as used herein includes a Sensor operative to quantify a state in the physical world in a digital representation.

"Directional Indicator" as used herein means a quantification of a direction generated via one or both of: analog and digital indications.

"Experiential Data" as used herein means data captured on or proximate to a subject Healthcare Facility, such data descriptive of a condition realized by the Healthcare Facility. Experiential Data is generated by one or more of: Digital and/or Analog Sensors, transducers, Image Capture Devices, microphones, accelerometers, compasses and the like.

"Experiential Sensor Reading" as used herein means a value of a Sensor output generated within or proximate to a subject Healthcare Facility, such output descriptive of a condition realized by the Healthcare Facility. An Experiential Sensor Reading may be generated by one or more of: digital and/or Analog Sensors, transducers, Image Capture Devices, microphones, accelerometers, compasses and the like.

"Ground Plane" as used herein refers to a locally horizontal (or nearly horizontal) plane from which a direction of interest may be projected. An example of a Ground Plane is a floor of a Healthcare Facility.

"Healthcare Facility" as used herein refers to a manmade assembly of parts connected in an ordered way. Examples of a Healthcare Facility in this disclosure include a building used to perform healthcare procedures of a sub-assembly of such a building.

"Image Capture Device" or "Scanner" as used herein refers to apparatus for capturing digital or analog image data. An Image Capture Device may be one or both of: a two-dimensional camera or a three-dimensional camera. In some examples an Image Capture Device includes a charge-coupled device ("CCD") camera. An Image Capture Device may include a camera with a wide-angle lens capable of capturing a greater field of view than a normal lens, or it may include a narrow-angle lens capable of capturing a smaller field of view than a normal lens. An Image Capture Device may include a fixed lens, in which the Image Capture Device's focal length is permanently set (as would be its field of view), or a varifocal lens to allow manual adjustment of the camera lens. Even in embodiments having a fixed lens, Image Capture Device may include additional lenses capable of being removably attached to the body of Image Capture Device to modify an angle of the view of view or a zoom level. An Image Capture Device may include a camera capable of capturing images from rays other than a ray extending parallel from a lens associated with the camera (e.g., images at a 90 degree vertical angle from the direction in which the lens appears to face), such as by mirrors or other prisms.

"Intelligent Automation" as used herein refers to a logical processing by a device, system, machine or equipment item (such as data gathering, analysis, artificial intelligence, and functional operation) and communication capabilities.

"Moisture" as used herein means a quantity of water, which may also mean a quantity of water relative to a larger volume (e.g., amount of water relative to air).

"Multi-modal" as used herein refers to the ability of a device to communicate using multiple protocols and/or bandwidths. Examples of multimodal may include being capable of communication using two to more of: Bluetooth; Bluetooth Low Energy; WiFi; WiFi RT; GPS; ultrasonic; infrared protocols and/or mediums.

"Node" as used herein means a device including at least a processor, a digital storage and a wireless transceiver.

"Orientation of a Smart Device"" as used herein refers to a designation of a direction that the Smart Device is pointing. The direction may generally be aligned with a user interface screen (e.g., a top of the screen is aligned with a top edge of the Smart Device). However, various embodiments may designate a direction based upon a physical edge of the Smart Device (e.g., an edge opposite to an "Performance" as used herein may include a metric of an action or quantity. Examples of Performance may include metrics of: number of processes completed, energy efficiency; length of service; cost of operation; quantity of goods processed or manufacture; quality of goods processed or manufacture; yield; and human resources required.

"Performance Level" as used herein means one or both of a quantity of actions executed and a quality of actions.

"Property" as used herein shall mean one or more real estate parcels suitable for a deployed Healthcare Facility that may be modeled in an AVM.

"Tag" as used herein refers to one or more transceivers fixable to an item.

"Ray" as used herein refers to a straight line including a starting point and extending indefinitely in a direction.

"Sensor" as used herein refers to one or more of a solid state, electro-mechanical, and mechanical device capable of transducing a physical condition or Property into an analogue or digital representation and/or metric.

"Smart Device" as used herein includes an electronic device including, or in logical communication with, a processor and digital storage and capable of executing logical commands.

"Structural Message" as used herein refers to a logical communication generated by automation (such as a Sensor or machine) incorporated into, affixed to or operated within or proximate to a Healthcare Facility.

"Structural Messaging" as used herein refers to an action that generates and/or transmits a Structural Message.

"Total Resources" as used herein shall mean an aggregate of one or more types of resources expended over a time period.

"Transceive" as used herein refers to an act of transmitting and receiving data.

"Transceiver" as used herein refers to an electronic device capable of one or both of transmitting and receiving data.

"Vantage Point" as used herein refers to a specified location which may be an actual location within a physical Healthcare Facility or a virtual representation of the actual location within a physical Healthcare Facility.

"Vector" as used herein refers to a magnitude and a direction as may be represented and/or modeled by a directed line segment with a length that represents the magnitude and an orientation in space that represents the direction.

"Virtual Healthcare Facility" ("VS"): as used herein shall mean a digital representation of a physical Healthcare Facility suitable for use. The VS may include Design Features and As Built Features. The VS may be included as part of an AVM.

CONCLUSION

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed invention.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising", "including", and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. A method of quantifying agent interaction with a self-verifying array of nodes, the method comprising:
   a) discovering with the self-verifying array of nodes at least a first node, a second node, and a third node, wherein each node of the self-verifying array of nodes comprises at least a respective processor, a respective digital storage and a respective wireless transceiver;
   b) assigning a respective unique identifier to each of the first node, the second node, and the third node when they are discovered;
   c) establishing communication between the first node and at least the second node and third node in the self-verifying array of nodes, wherein each of the first node, the second node and the third node generate at least a first set of values from the communication;
   d) utilizing the first set of values to determine a relative position amongst at least the first node, the second node and the third node;
   e) removably attaching the first node to a first agent, and the second node to a second agent, wherein the first node remains attached to the first agent and the second node remains attached to the second agent during a time of a procedure;
   attaching the third node to a reference position in a facility resource, wherein the third node is in the reference position in the facility resource during the time of the procedure;
   g) wirelessly communicating between the first node, the second node, and the third node during the time of the procedure;
   h) verifying a presence of at least one of the first node, the second node and the third node in the self-verifying array of nodes during the time of the procedure;
   i) storing, in the respective digital storage of at least one of the first node, the second node, and the third node the generated values for communication variables and unique identifiers for the first node; the second node and the third node;

j) with the respective processor of at least one of the first node, the second node, and the third node, generating a respective set of position coordinates indicative of a position of each of the first agent; and the second agent, each respective set of position coordinates based upon values included in an aggregate of values for the communication variables received into the respective processor; and k) with the respective processor of at least one of the first node, the second node, and the third node, generating an orientation of one or both of the first agent and the second agent.

2. The method of claim 1 additionally comprising the step of communicating the respective set of position coordinates of the first agent and the second agent and a timestamp of the self-verifying array of nodes to a fourth node of the self-verifying array of nodes.

3. The method of claim 2 additionally comprising the step of communicating the orientation of the first agent and the orientation of the second agent and the timestamp of the self-verifying array of nodes to the fourth node of the self-verifying array of nodes.

4. The method of claim 2 wherein the first node attached to the first agent is in communication with a first sensor attached to the first agent.

5. The method of claim 4 wherein the first sensor attached to the first agent is comprised within the first node attached to the first agent.

6. The method of claim 4 wherein a data value of a first measurement of the first sensor attached to the first agent is communicated to the first node attached to the first agent, and wherein the data value of the first measurement of the first sensor attached to the first agent is communicated to at least the third node of the self-verifying array of nodes.

7. The method of claim 4 wherein a first measurement of the first sensor attached to the first agent comprises a measurement of a temperature.

8. The method of claim 7 additionally comprising a step of denying access to the facility resource if the temperature exceeds a designated range.

9. The method of claim 1 wherein each of the first node, the second node and the third node records the respective set of values for aspects of the communications that may influence an accuracy of a recorded variable.

10. The method of claim 9 wherein each of the first node, the second node and the third node communicates the respective set of values for the aspects of the respective communications that influence the accuracy of the recorded variable to other nodes within the self-verifying array of nodes within communication range and position.

11. The method of claim 10 where a fifth node of the self-verifying array of nodes comprises a controller and the controller is used to calculate the position of the first node based upon an aggregated set of values for the communication variables as well as the aggregated set of values for the aspects of the respective communications that influence the accuracy of the recorded variable.

12. The method of claim 11 wherein the controller generates a location of a perceived obstruction within a physical bounds of communications within the self-verifying array of nodes.

13. The method of claim 12 further comprising depicting, with a display of the controller, a location of each node included in the self-verifying array of nodes and the location of the perceived obstruction.

14. The method of claim 13 further comprising moving the third node to a second reference position in the facility resource, wherein the moving of the third node to the second reference position improves aspects of communication between at least one of the first node, and the second node to the third node with respect to the perceived obstruction.

15. The method of claim 13 further comprising adding a sixth node to a second reference position in the facility resource, wherein the adding of the sixth node creates communication paths between at least one of the first node and the second node to the third node through a communication path through the sixth node.

16. The method of claim 1 wherein a fourth node is removably attached to a third agent, wherein the third agent moves into a location within communication range of the self-verifying array of nodes, wherein the self-verifying array of nodes discovers the fourth node, wherein the self-verifying array of nodes assigns a fourth node unique identifier, and wherein the fourth node attached to the third agent is in communication with a second sensor attached to the third agent.

17. The method of claim 16 wherein the second sensor attached to the third agent is comprised within the fourth node attached to the third agent.

18. The method of claim 16 wherein a data value of a first measurement of the second sensor attached to the third agent is communicated to the fourth node attached to the third agent, and wherein the data value of the first measurement of the second sensor attached to the third agent is communicated to at least the third node of the self-verifying array of nodes.

19. The method of claim 18 wherein the first measurement of the second sensor attached to the third agent comprises a measurement of a physical or biological parameters.

20. The method of claim 19 additionally comprising a step of denying access of the third agent to the facility resource if a temperature exceeds a designated range.

* * * * *